US012696750B2

(12) United States Patent
Rim et al.

(10) Patent No.: US 12,696,750 B2
(45) Date of Patent: Jul. 28, 2026

(54) NANOSHEET SEMICONDUCTOR DEVICE HAVING A THROUGH VIA EXTENDING THROUGH A SOURCE/DRAIN REGION BETWEEN TWO ACTIVE REGION SEPARATION CUTS

(71) Applicant: SAMSUNG ELECTRONICS CO., LTD., Suwon-si (KR)

(72) Inventors: Kern Rim, Suwon-si (KR); Doo Hyun Lee, Suwon-si (KR); Heon Jong Shin, Suwon-si (KR); Jin Young Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 468 days.

(21) Appl. No.: 18/205,814

(22) Filed: Jun. 5, 2023

(65) Prior Publication Data

US 2024/0162120 A1 May 16, 2024

(30) Foreign Application Priority Data

Nov. 10, 2022 (KR) ........................ 10-2022-0149410

(51) Int. Cl.
H10W 20/20 (2026.01)
H10D 30/00 (2025.01)
(Continued)

(52) U.S. Cl.
CPC .......... H10W 20/20 (2026.01); H10D 30/501 (2025.01); H10D 30/6735 (2025.01);
(Continued)

(58) Field of Classification Search
CPC . H01L 23/481; H01L 23/5286; H10D 30/501; H10D 30/6729; H10D 30/6735;
(Continued)

(56) References Cited

U.S. PATENT DOCUMENTS 9,741,691 B2    8/2017  Lim et al.
10,879,176 B2   12/2020  Lin et al.
(Continued)

OTHER PUBLICATIONS

Search Report dated Jan. 25, 2024, issued by European Patent Office in European Patent Application No. 23190701.5.
(Continued)

*Primary Examiner* — Eliseo Ramos Feliciano
*Assistant Examiner* — Brad A Knudson
(74) *Attorney, Agent, or Firm* — Sughrue Mion, PLLC

(57) ABSTRACT

A semiconductor device is provided. The semiconductor device includes first through third active patterns extending in and spaced apart from each other along a first direction on a first surface of a substrate; a first gate electrode extending in a second direction on the first active pattern; a first active cut between the first and second active patterns, wherein the first active cut extends in the second direction, and the first active cut is spaced apart from the first gate electrode in the first direction; a second active cut between the second and third active patterns, wherein the second active cut extends in the second direction, and the second active cut is spaced apart from the first active cut in the first direction; and a first through via extending vertically through the second active pattern between the first and second active cuts, and into the substrate.

19 Claims, 49 Drawing Sheets

(51) Int. Cl.

| | |
|---|---|
| *H10D 30/67* | (2025.01) |
| *H10D 62/10* | (2025.01) |
| *H10D 84/83* | (2025.01) |
| *H10D 64/23* | (2025.01) |
| *H10W 20/41* | (2026.01) |

(52) U.S. Cl.
CPC ....... *H10D 30/6757* (2025.01); *H10D 62/121* (2025.01); *H10D 84/83* (2025.01); *H10D 64/256* (2025.01); *H10W 20/427* (2026.01)

(58) Field of Classification Search
CPC ............. H10D 30/6757; H10D 62/121; H10D 64/258; H10D 84/83; H10D 64/256; H10W 20/20; H10W 20/427
See application file for complete search history.

(56) References Cited

U.S. PATENT DOCUMENTS

| | | | |
|---|---|---|---|
| 11,302,803 B2 | 4/2022 | Zhang et al. | |
| 2009/0160050 A1* | 6/2009 | Miyakawa | ........ H01L 21/76898 |
| | | | 257/737 |
| 2010/0164062 A1* | 7/2010 | Wang | ................. H10D 84/0149 |
| | | | 257/532 |
| 2012/0056330 A1* | 3/2012 | Lee | ................... H01L 21/76898 |
| | | | 257/774 |
| 2021/0074697 A1* | 3/2021 | Baek | ..................... H10D 62/151 |
| 2021/0242203 A1 | 8/2021 | Ding et al. | |
| 2021/0375722 A1 | 12/2021 | Kim et al. | |
| 2021/0407900 A1* | 12/2021 | Yu | ........................ H10D 64/254 |
| 2021/0408274 A1* | 12/2021 | Yu | ...................... H10D 30/6757 |
| 2022/0102266 A1 | 3/2022 | Lim et al. | |
| 2022/0157723 A1 | 5/2022 | Park et al. | |
| 2022/0173039 A1 | 6/2022 | Yang et al. | |
| 2022/0271033 A1* | 8/2022 | Chanemougame | .......................... H10D 30/6757 |
| 2023/0223404 A1* | 7/2023 | Liebmann | .............. H10D 84/83 |
| | | | 257/365 |
| 2024/0153951 A1* | 5/2024 | Xie | ...................... H10D 84/038 |

OTHER PUBLICATIONS

Office Action dated Feb. 6, 2024, issued by European Patent Office in European Patent Application No. 23190701.5.

\* cited by examiner

CAS

NANOSHEET SEMICONDUCTOR DEVICE HAVING A THROUGH VIA EXTENDING THROUGH A SOURCE/DRAIN REGION BETWEEN TWO ACTIVE REGION SEPARATION CUTS

CROSS-REFERENCE TO RELATED APPLICATION

This application claims priority from Korean Patent Application No. 10-2022-0149410, filed on Nov. 10, 2022, in the Korean Intellectual Property Office, the disclosure of which is incorporated by reference herein in its entirety.

BACKGROUND

1. Field

The present disclosure relates to a semiconductor device, and particularly, to a semiconductor device including a Multi-Bridge Channel Field Effect Transistor (MBCFET™).

2. Related Art

Density of a semiconductor device, may be increased by employing a multi-channel transistor in which a plurality of fins or nanowires (or nanosheets) is formed on a substrate and a gate is formed on the surface of the multi-channel active pattern.

Because the multi-channel transistor is formed of a three-dimensional (3D) channel structure, the multi-channel transistor may be scaled. Also, current control capability can be improved without increasing the length of the gate of the multi-channel transistor. Also, a short channel effect (SCE), i.e., the phenomenon of the potential of a channel region being affected by a drain voltage, can be effectively suppressed.

SUMMARY

Aspects of the present disclosure provide a semiconductor device capable of improving integration density by arranging a lower wiring layer (i.e., a power rail or a ground rail) below a substrate and arranging a through via connected to the lower wiring layer, between two active cuts.

The present disclosure is not restricted to the aspects set forth herein. The above and other aspects of the present disclosure will become more apparent to one of ordinary skill in the art to which the present disclosure pertains by referencing the detailed description of the present disclosure given below.

According to some embodiments, a semiconductor device includes: a substrate including a first surface and a second surface opposite to the first surface; first through third active patterns extending in a first horizontal direction on the first surface of the substrate, wherein the first through third active patterns are spaced apart from one another in the first horizontal direction; a first gate electrode extending in a second horizontal direction different from the first horizontal direction on the first active pattern; a first active cut between the first active pattern and the second active pattern, wherein the first active cut extends in the second horizontal direction, and the first active cut is spaced apart from the first gate electrode in the first horizontal direction; a second active cut between the second active pattern and the third active pattern, wherein the second active cut extends in the second horizontal direction, and the second active cut is spaced apart from the first active cut in the first horizontal direction; and a first through via extending through the second active pattern in a vertical direction between the first active cut and the second active cut, and into the substrate.

According to some embodiments, a semiconductor device includes: a substrate including a first surface and a second surface opposite to the first surface; first through third active patterns extending in a first horizontal direction on the first surface of the substrate, wherein the first through third active patterns are spaced apart from one another in the first horizontal direction; a fourth active pattern spaced apart from the first through third active patterns in a second horizontal direction different from the first horizontal direction on the first surface of the substrate; a first gate electrode extending in the second horizontal direction on the first active pattern; a first active cut between the first active pattern and the second active pattern, wherein the first active cut extends in the second horizontal direction, and the first active cut is spaced apart from the first gate electrode in the first horizontal direction; a second gate electrode extending in the second horizontal direction on the fourth active pattern, wherein the second gate electrode is spaced apart from the first active cut in the second horizontal direction; a gate cut between the first active cut and the second gate electrode; a second active cut between the second active pattern and the third active pattern, wherein the second active cut extends in the second horizontal direction, and the second active cut is spaced apart from the first active cut in the first horizontal direction; and a first through via extending through the second active pattern in a vertical direction between the first active cut and the second active cut, and into the substrate.

According to some embodiments, a semiconductor device includes: a substrate including a first surface and a second surface opposite to the first surface; first through third active patterns extending in a first horizontal direction on the first surface of the substrate, wherein the first through third active patterns are spaced apart from one another in the first horizontal direction; a fourth active pattern spaced apart from the first through third active patterns in a second horizontal direction different from the first horizontal direction on the first surface of the substrate; a first plurality of nanosheets spaced apart from one another in a vertical direction on the first active pattern; a second plurality of nanosheets spaced apart from one another in the vertical direction on the first and second active patterns; a first gate electrode extending in the second horizontal direction on the first active pattern, wherein the first gate electrode surrounds the first plurality of nanosheets; a second gate electrode extending in the second horizontal direction on the first and second active patterns, wherein the second gate electrode surrounds the second plurality of nanosheets; a first active cut between the first active pattern and the second active pattern, wherein the first active cut extends in the second horizontal direction, the first active cut is spaced apart from the first gate electrode in the first horizontal direction, and the first active cut extends through the second plurality of nanosheets and the second gate electrode in the vertical direction; a third gate electrode extending in the second horizontal direction on the fourth active pattern, wherein the third gate electrode is spaced apart from the first active cut in the second horizontal direction; a gate cut between the first active cut and the third gate electrode, wherein the gate cut extends in the first horizontal direction; a second active cut between the second and third active patterns and extending in the second horizontal direction, wherein the second active cut is spaced apart from the first active cut in the first horizontal direction; a first through via extending through the second active pattern in the vertical direction between the first active cut and the second active cut, and into the substrate; a lower via in the substrate and connected to the first through via; and a lower wiring layer on the second surface of the substrate and connected to the lower via. A top surface of the first active cut, a top surface of the second active cut, and a top surface of the first through via are provided on a common plane. Each of the first active cut and the second active cut is spaced apart from the lower via in the vertical direction.

It should be noted that the effects of the present disclosure are not limited to those described above, and other effects of the present disclosure will be apparent from the following description.

BRIEF DESCRIPTION OF DRAWINGS

The above and other aspects and features will be more apparent from the following description of embodiments with reference to the attached drawings, in which:

FIG. 1 is a layout view of a semiconductor device according to some embodiments;

FIGS. 7 through 33 are cross-sectional views illustrating intermediate operations of a method of fabricating a semiconductor device according to some embodiments;

DETAILED DESCRIPTION

Embodiments will now be described with reference to the accompanying drawings. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation. A semiconductor device according to some embodiments will hereinafter be described as including a Multi-Bridge Channel Field Effect Transistor (MBCFET™) including nanosheets or a fin field-effect transistor (FinFET) including fin-type channel regions, but the present disclosure is not limited thereto. A semiconductor device according to other embodiments may include a tunneling field-effect transistor (FET) or a three-dimensional (3D) transistor. A semiconductor device according to other embodiments may include a bipolar junction transistor or a lateral double-diffused metal-oxide-semiconductor field-effect transistor (LDMOS).

A semiconductor device according to some embodiments will hereinafter be described with reference to FIGS. 1 through 6.

Figure 1:
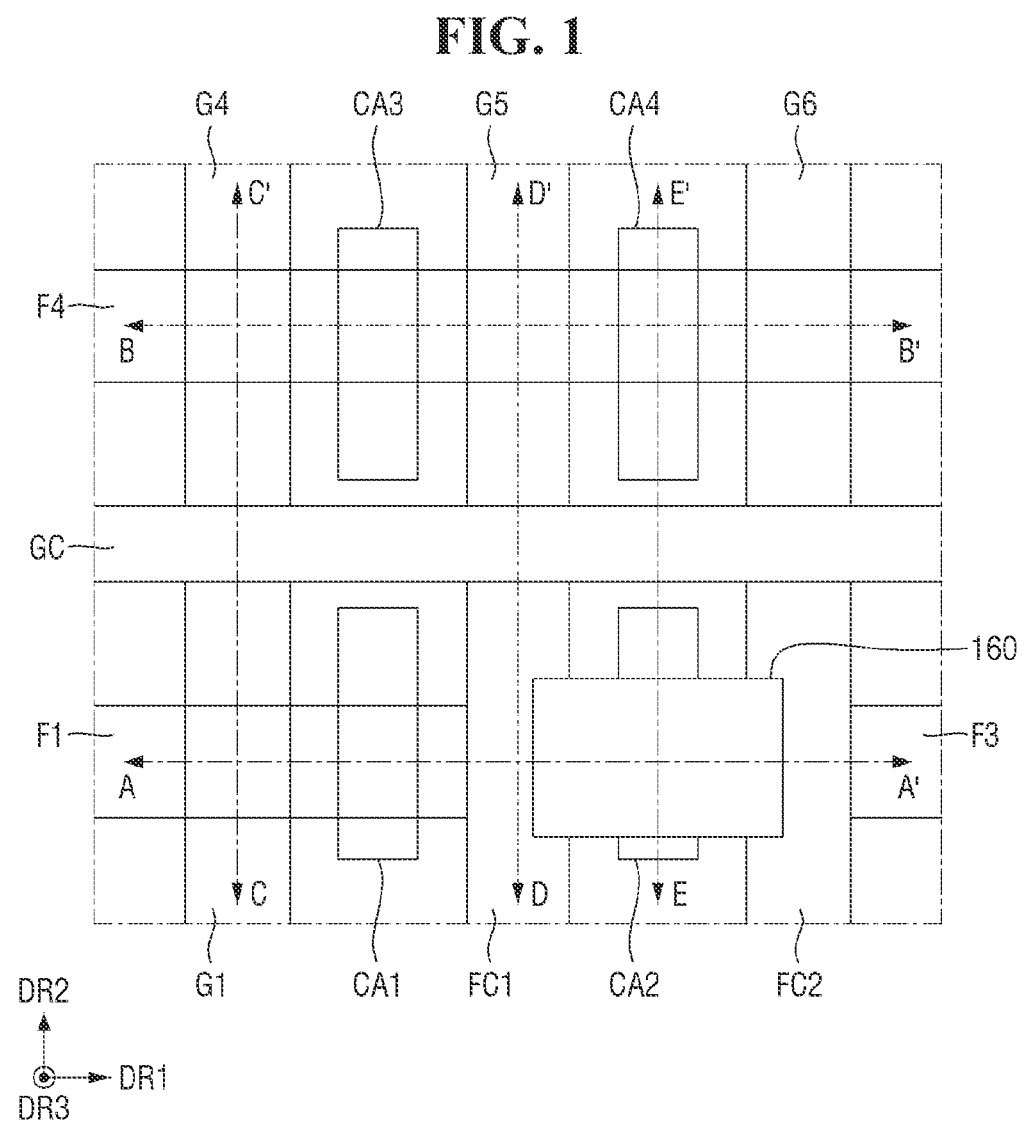
Figure 2:
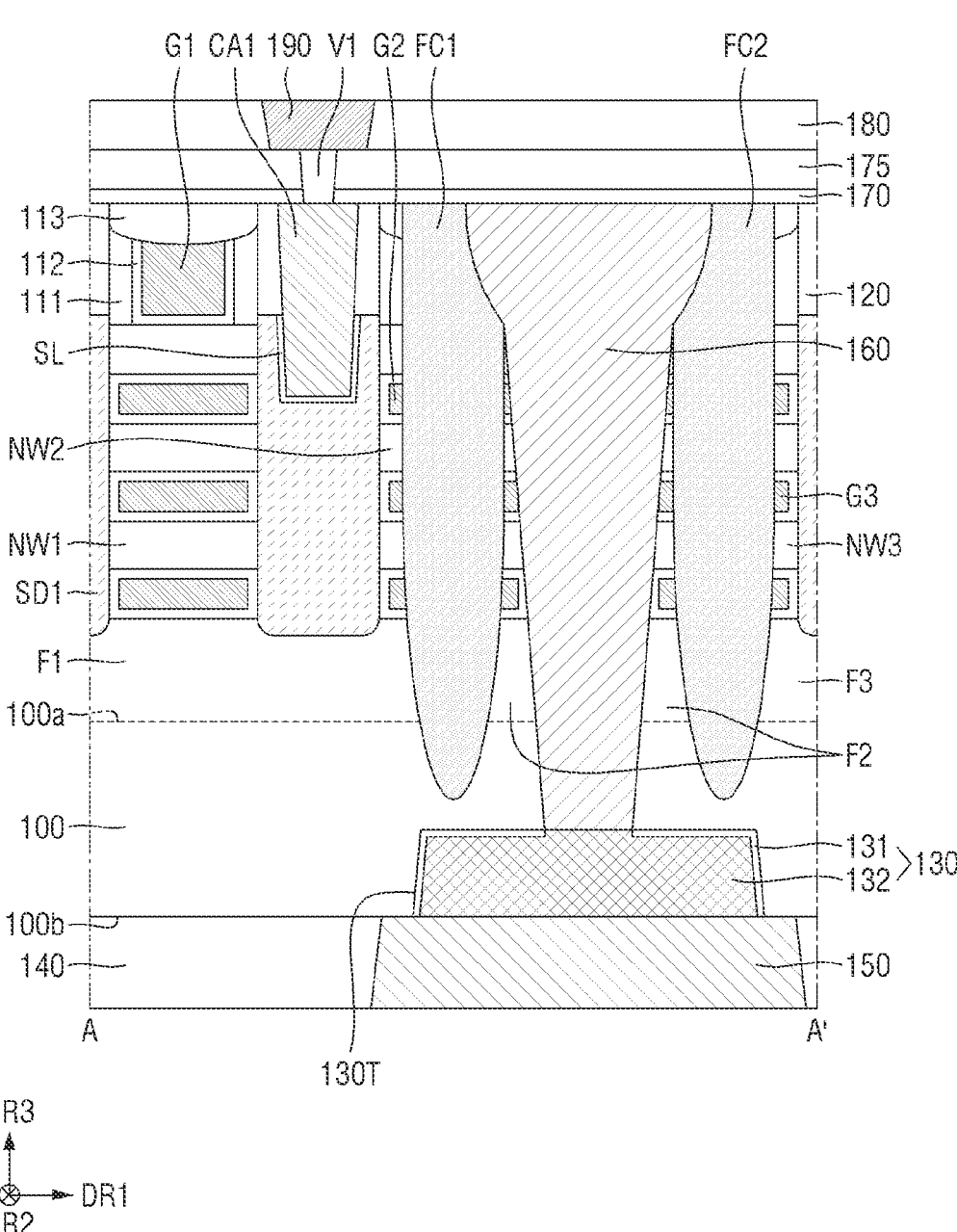
FIG. 2 is a cross-sectional view taken along line A-A' of FIG. 1.
Figure 3:
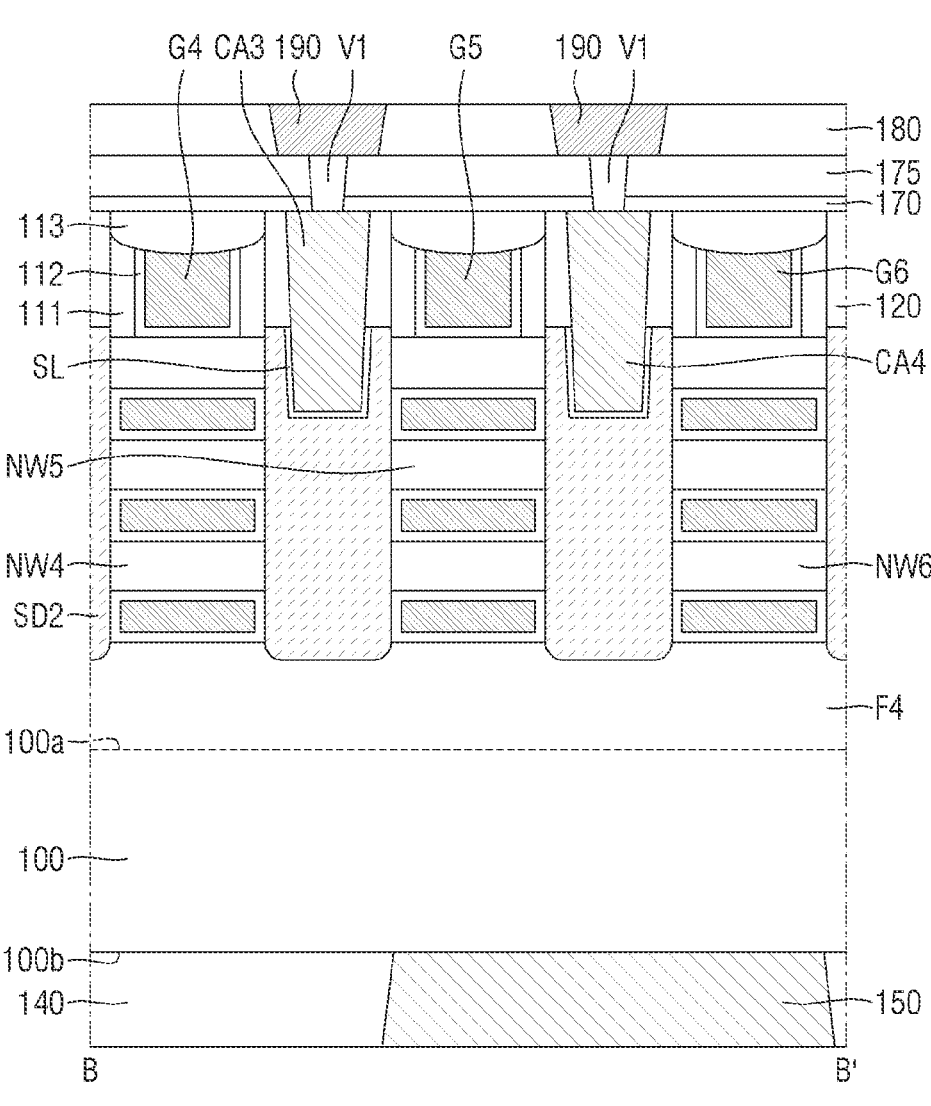
FIG. 3 is a cross-sectional view taken along line B-B' of FIG. 1.
Figure 3:
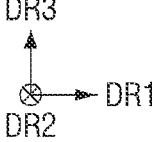
Figure 4:
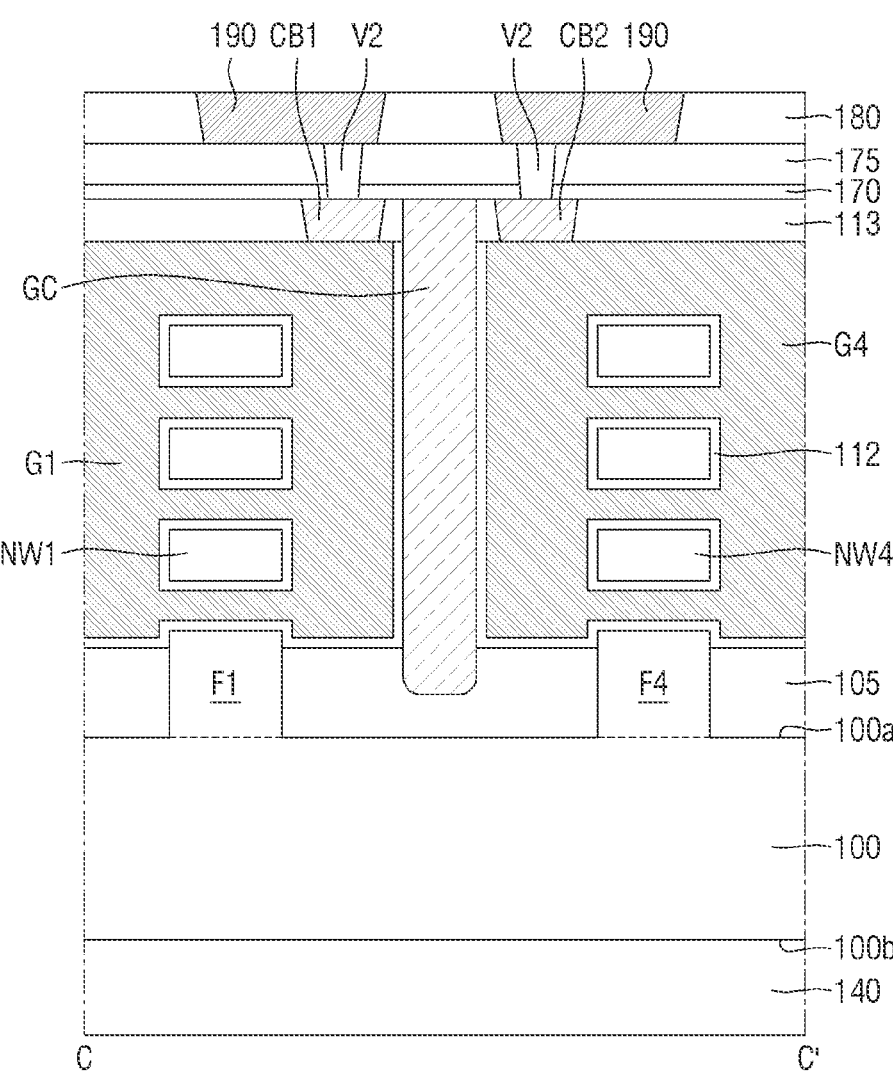
FIG. 4 is a cross-sectional view taken along line C-C' of FIG. 1.
Figure 4:
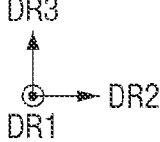
Figure 5:
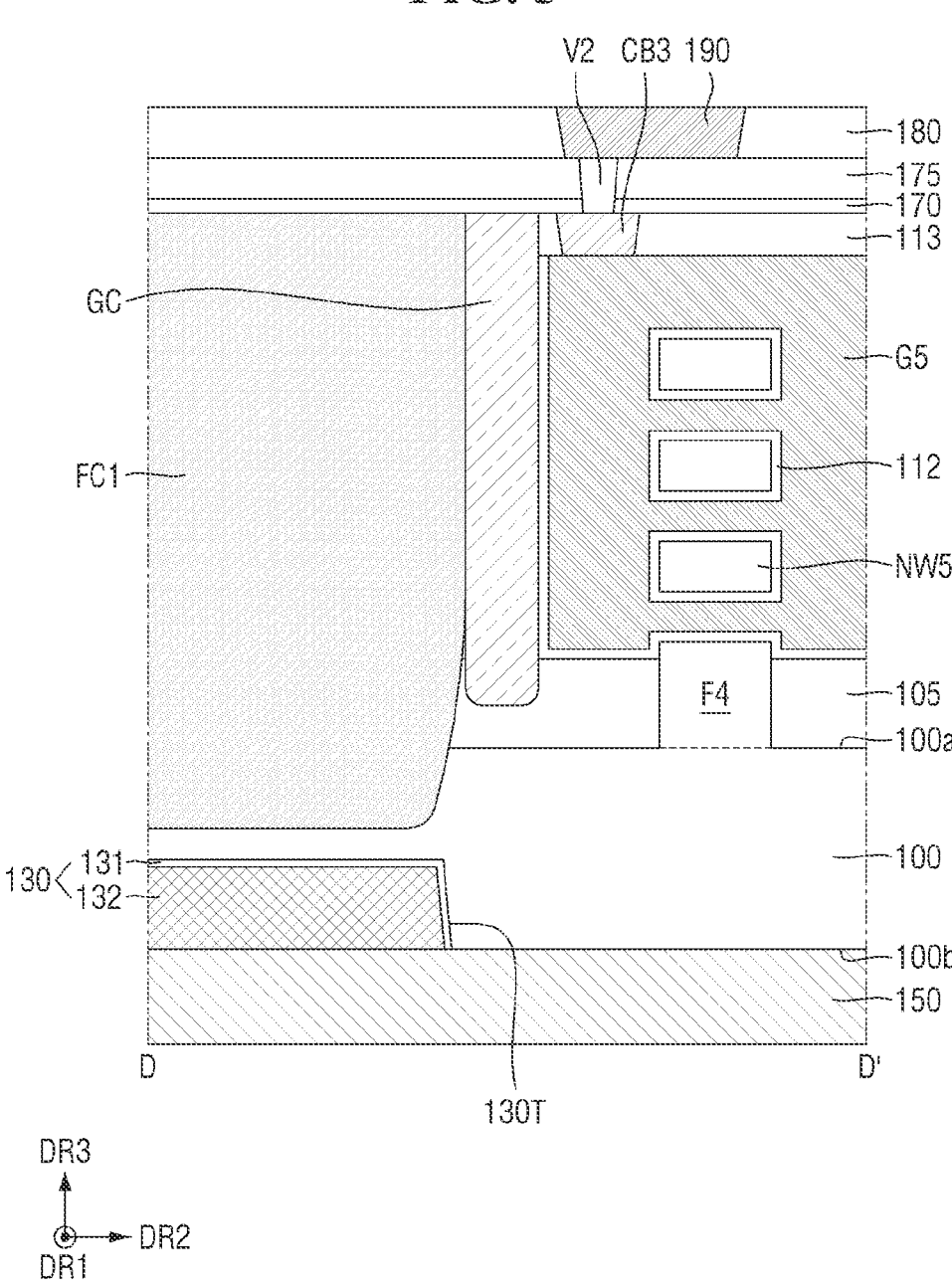
FIG. 5 is a cross-sectional view taken along line D-D' of FIG. 1.
Figure 6:
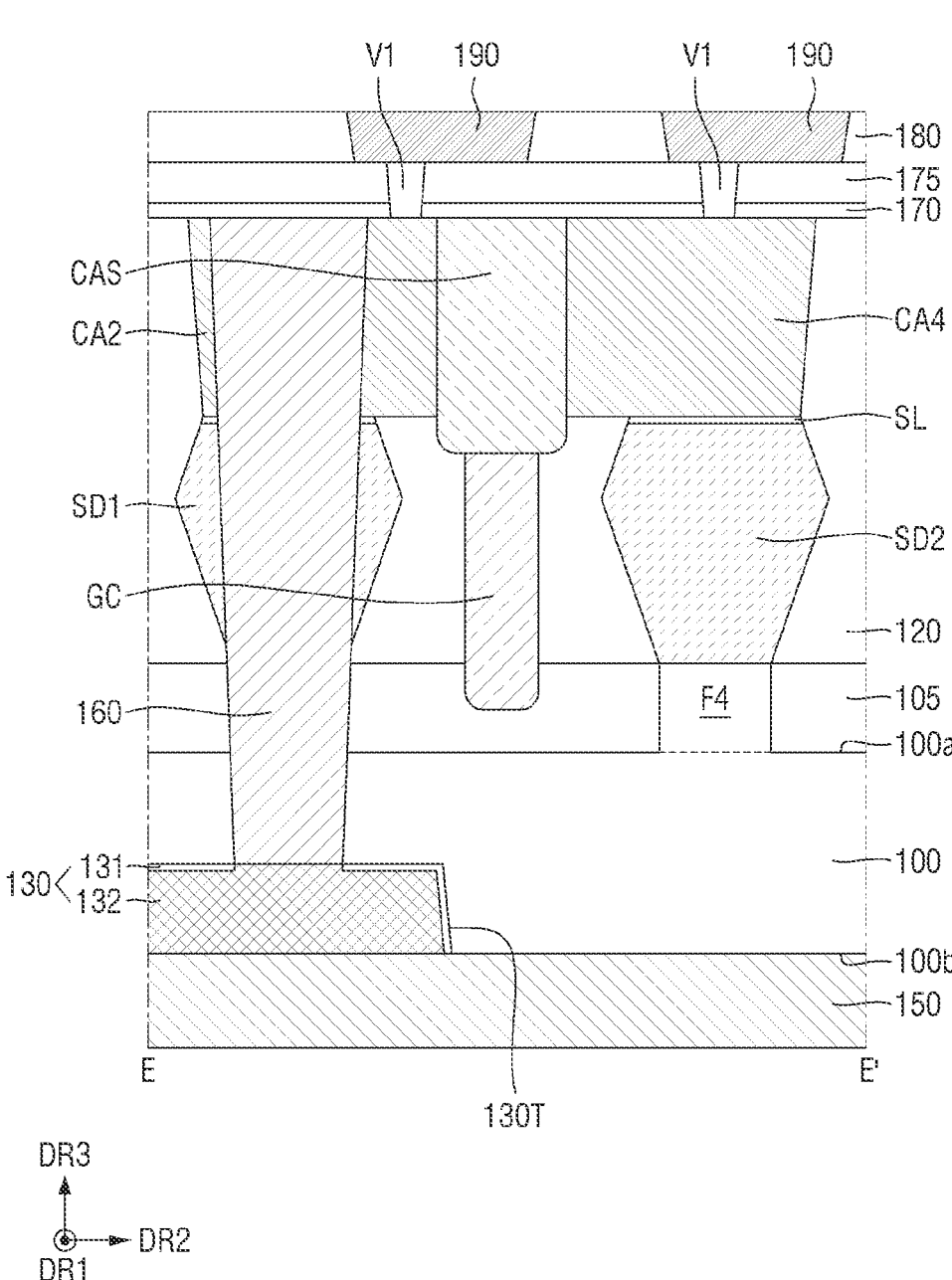
FIG. 6 is a cross-sectional view taken along line E-E' of FIG. 1.

FIG. 1 is a layout view of a semiconductor device according to some embodiments. FIG. 2 is a cross-sectional view taken along line A-A' of FIG. 1. FIG. 3 is a cross-sectional view taken along line B-B' of FIG. 1. FIG. 4 is a cross-sectional view taken along line C-C' of FIG. 1. FIG. 5 is a cross-sectional view taken along line D-D' of FIG. 1. FIG. 6 is a cross-sectional view taken along line E-E' of FIG. 1.

Referring to FIGS. 1 through 6, the semiconductor device includes a substrate 100, first through fourth active patterns F1 through F4, a field insulating layer 105, first through sixth plurality of nanosheets (NW1 through NW6), first through sixth gate electrodes G1 through G6, gate spacers 111, a gate insulating layer 112, a capping pattern 113, a first source/drain region SD1, a second source/drain region SD2, a first upper interlayer insulating layer 120, first and second active cuts FC1 and FC2, a gate cut GC, a lower via 130, a lower interlayer insulating layer 140, a lower wiring layer 150, a first through via 160, first through fourth source/drain contacts CA1 through CA4, a silicide layer SL, a source/drain contact separation layer CAS, first through third gate contacts CB1 through CB3, an etching stop layer 170, a second upper interlayer insulating layer 175, first and second vias V1 and V2, a third upper interlayer insulating layer 180, and an upper wiring layer 190.

The substrate 100 may be a silicon (Si) substrate or a silicon-on-insulator (50I) substrate. Alternatively, the substrate 100 may include silicon-germanium (SiGe), silicon-germanium-on insulator (SGOI), indium antimonide, lead tellurium compound, indium arsenide, indium phosphide, gallium arsenide, or gallium antimonide, but the present disclosure is not limited thereto.

The substrate 100 may have a first surface 100*a* and a second surface 100*b*, which is opposite to the first surface 100*a*. For example, the first surface 100*a* of the substrate 100 may be referred to as the top surface of the substrate 100, and the second surface 100*b* of the substrate 100 may be referred to as the bottom surface of the substrate 100.

First and second horizontal directions DR1 and DR2 may be directions parallel to the first surface 100*a* of the substrate 100. The second horizontal direction DR2 may be a different direction from the first horizontal direction DR1. A vertical direction DR3 may be a direction perpendicular to the first and second horizontal directions DR1 and DR2.

The first through fourth active patterns F1 through F4 may extend in the first horizontal direction DR1 on the first surface 100*a* of the substrate 100. For example, the second active pattern F2 may be spaced apart from the first active pattern F1 in the first horizontal direction DR1, the third active pattern F3 may be spaced apart from the second active pattern F2 in the first horizontal direction DR1, and the fourth active pattern F4 may be spaced apart from the first through third active patterns F1 through F3 in the second horizontal direction DR2. The first through fourth active patterns F1 through F4 may protrude from the first surface 100*a* of the substrate 100 in the vertical direction DR3. For example, the first through fourth active patterns F1 through F4 may be portions of the substrate 100 or may include epitaxial layers grown from the substrate 100.

The field insulating layer 105 may be disposed on the first surface 100*a* of the substrate 100. The field insulating layer 105 may surround the sidewalls of each of the first through fourth active patterns F1 through F4. For example, the top surfaces of the first through fourth active patterns F1 through F4 may protrude beyond the top surface of the field insulating layer 105 in the vertical direction DR3, but the present disclosure is not limited thereto. Alternatively, the top surfaces of the first through fourth active patterns F1 through F4 may be on the same plane as the top surface of the field insulating layer 105. The field insulating layer 105 may include, for example, an oxide film, a nitride film, an oxynitride film, or a combination thereof.

The first plurality of nanosheets NW1 may be disposed on the first active pattern F1. The first plurality of nanosheets NW1 may be disposed at the intersection between the first active pattern F1 and the first gate electrode G1. The second plurality of nanosheets NW2 may be disposed on the second active pattern F2. The second plurality of nanosheets NW2 may be disposed at the intersection between the second active pattern F2 and the second gate electrode G2. The third plurality of nanosheets NW3 may be disposed on the third active pattern F3. The third plurality of nanosheets NW3 may be disposed at the intersection between the third active pattern F3 and the third gate electrode G3.

The fourth plurality of nanosheets NW4 may be disposed on the fourth active pattern F4. The fourth plurality of nanosheets NW4 may be disposed at the intersection between the fourth active pattern F4 and the fourth gate electrode G4. The fifth plurality of nanosheets NW5 may be disposed on the fourth active pattern F4. The fifth plurality of nanosheets NW5 may be disposed at the intersection between the fourth active pattern F4 and the fifth gate electrode G5. The fifth plurality of nanosheets NW5 may be spaced apart from the fourth plurality of nanosheets NW4 in the first horizontal direction DR1. The sixth plurality of nanosheets NW6 may be disposed on the fourth active pattern F4. The sixth plurality of nanosheets NW6 may be disposed at the intersection between the fourth active pattern F4 and the sixth gate electrode G6. The sixth plurality of nanosheets NW6 may be spaced apart from the fifth plurality of nanosheets NW5 in the first horizontal direction DR1.

The first plurality of nanosheets NW1, the second plurality of nanosheets NW2, the third plurality of nanosheets NW3, the fourth plurality of nanosheets NW4, the fifth plurality of nanosheets NW5, or the sixth plurality of nanosheets NW6 may include a stack of a plurality of nanosheets that are spaced apart from one another in the vertical direction DR3. FIGS. 2 through 5 illustrate that the first plurality of nanosheets NW1, the second plurality of nanosheets NW2, the third plurality of nanosheets NW3, the fourth plurality of nanosheets NW4, the fifth plurality of nanosheets NW5, or the sixth plurality of nanosheets NW6 include a stack of three nanosheets that are spaced apart from one another in the vertical direction DR3, but the present disclosure is not limited thereto. Alternatively, the first plurality of nanosheets NW1, the second plurality of nanosheets NW2, the third plurality of nanosheets NW3, the fourth plurality of nanosheets NW4, the fifth plurality of nanosheets NW5, or the sixth plurality of nanosheets NW6 may include a stack of four or more nanosheets that are spaced apart from one another in the vertical direction DR3.

For example, the first plurality of nanosheets NW1, the second plurality of nanosheets NW2, the third plurality of nanosheets NW3, the fourth plurality of nanosheets NW4, the fifth plurality of nanosheets NW5, and the sixth plurality of nanosheets NW6 include Si, but the present disclosure is not limited thereto. In another example, the first plurality of nanosheets NW1, the second plurality of nanosheets NW2, the third plurality of nanosheets NW3, the fourth plurality of nanosheets NW4, the fifth plurality of nanosheets NW5, and the sixth plurality of nanosheets NW6 include SiGe.

The first gate electrode G1 may extend in the second horizontal direction DR2 on the first active pattern F1 and the field insulating layer 105. The first gate electrode G1 may surround the first plurality of nanosheets NW1. The second gate electrode G2 may extend in the second horizontal direction DR2 on the first and second active patterns F1 and F2 and the field insulating layer 105. The second gate electrode G2 may be spaced apart from the first gate electrode G1 in the first horizontal direction DR1. The second gate electrode G2 may surround the second plurality of nanosheets NW2. The third gate electrode G3 may extend in the second horizontal direction DR2 on the second and third active patterns F2 and F3 and the field insulating layer 105. The third gate electrode G3 may be spaced apart from the second gate electrode G2 in the first horizontal direction DR1. The third gate electrode G3 may surround the third plurality of nanosheets NW3.

The fourth gate electrode G4 may extend in the second horizontal direction DR2 on the fourth active pattern F4 and the field insulating layer 105. The fourth gate electrode G4 may be spaced apart from the first gate electrode G1 in the second horizontal direction DR2. The fourth gate electrode G4 may surround the fourth plurality of nanosheets NW4. The fifth gate electrode G5 may extend in the second horizontal direction DR2 on the fourth active pattern F4 and the field insulating layer 105. The fifth gate electrode G5 may be spaced apart from the fourth gate electrode G4 in the first horizontal direction DR1. The fifth gate electrode G5 may be spaced apart from the second gate electrode G2 in the second horizontal direction DR2. The fifth gate electrode G5 may surround the fifth plurality of nanosheets NW5. The sixth gate electrode G6 may extend in the second horizontal direction DR2 on the fourth active pattern F4 and the field insulating layer 105. The sixth gate electrode G6 may be spaced apart from the fifth gate electrode G5 in the first horizontal direction DR1. The sixth gate electrode G6 may be spaced apart from the third gate electrode G3 in the second horizontal direction DR2. The sixth gate electrode G6 may surround the sixth plurality of nanosheets NW6.

The first through sixth gate electrodes G1 through G6 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof, but the present disclosure is not limited thereto. The first through sixth gate electrodes G1 through G6 may include a conductive metal oxide or a conductive metal oxynitride and may include oxidized forms of the aforementioned materials.

The gate spacers 111 may extend in the second horizontal direction DR2 along both sidewalls of the first gate electrode G1, on the top surface of the uppermost first nanosheet NW1 and the field insulating layer 105. The gate spacers 111 may extend in the second horizontal direction DR2 along both sidewalls of the first active cut FC1, on the top surface of the uppermost second nanosheet NW2 and the field insulating layer 105. The gate spacers 111 may extend along both sidewalls of the second active cut FC2, on the top surface of the uppermost third nanosheet NW3 and the field insulating layer 105.

The gate spacers 111 may extend in the second horizontal direction DR2 along both sidewalls of the fourth gate electrode G4, on the top surface of the uppermost fourth nanosheet NW4 and the field insulating layer 105. The gate spacers 111 may extend in the second horizontal direction DR2 along both sidewalls of the fifth gate electrode G5, on the top surface of the uppermost fourth nanosheet NW4 and the field insulating layer 105. The gate spacers 111 may extend in the second horizontal direction DR2 along both sidewalls of the sixth gate electrode G6, on the top surface of the uppermost fourth nanosheet NW4 and the field insulating layer 105.

The gate spacers 111 may include, for example, at least one of silicon nitride (SiN), silicon oxynitride (SiON), silicon oxide ($SiO_2$), silicon oxycarbonitride (SiOCN), silicon boron nitride (SiBN), silicon oxyboronitride (SiOBN), and silicon oxycarbide (SiOC), but the present disclosure is not limited thereto.

The gate insulating layer 112 may be disposed between the gate spacers 111 and the first through sixth gate electrodes G1 through G6. The gate insulating layer 112 may be disposed on sidewalls, in the first horizontal direction DR1, of each of the first through sixth gate electrodes G1 through G6. The gate insulating layer 112 may be disposed between the first through sixth gate electrodes G1 through G6 and between the first through fourth active patterns F1 through F4. The gate insulating layer 112 may be disposed between the field insulating layer 105 and the first through sixth gate electrodes G1 through G6.

The gate insulating layer 112 may be disposed between the first gate electrode G1 and the first plurality of nanosheets NW1. The gate insulating layer 112 may be disposed between the second gate electrode G2 and the second plurality of nanosheets NW2. The gate insulating layer 112 may be disposed between the third gate electrode G3 and the third plurality of nanosheets NW3. The gate insulating layer 112 may be disposed between the fourth gate electrode G4 and the fourth plurality of nanosheets NW4. The gate insulating layer 112 may be disposed between the fifth gate electrode G5 and the fifth plurality of nanosheets NW5. The gate insulating layer 112 may be disposed between the sixth gate electrode G6 and the sixth plurality of nanosheets NW6.

The gate insulating layer 112 may include silicon oxide, silicon oxynitride, silicon nitride, or a high-k material having a greater dielectric constant than silicon oxide. The high-k material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The semiconductor device may include negative capacitance (NC) FETs using negative capacitors. For example, the gate insulating layer 112 may include a ferroelectric material film having ferroelectric properties and a paraelectric material film having paraelectric properties.

The ferroelectric material film may have a negative capacitance, and the paraelectric material film may have a positive capacitance. For example, if two or more capacitors are connected in series and have positive capacitance, the total capacitance of the two or more capacitors may be lower than the capacitance of each of the two or more capacitors. On the contrary, if at least one of the two or more capacitors has negative capacitance, the total capacitance of the two or more capacitors may have a positive value and may be greater than the absolute value of the capacitance of each of the two or more capacitors.

If the ferroelectric material film having a negative capacitance and the paraelectric material film having a positive capacitance are connected in series, the total capacitance of the ferroelectric material film and the paraelectric material film may increase. Accordingly, transistors having the ferroelectric material film can have a sub-threshold swing (SS) of less than 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. For example, the hafnium zirconium oxide may be a material obtained by doping hafnium oxide with zirconium (Zr). In another example, the hafnium zirconium oxide may be a compound of hafnium (Hf), Zr, and oxygen (O).

The ferroelectric material film may further include a dopant. For example, the dopant may include at least one of Al, Ti, Nb, lanthanum (La), yttrium (Y), magnesium (Mg), silicon, calcium (Ca), cerium (Ce), dysprosium (Dy), erbium (Er), gadolinium (Gd), germanium, scandium (Sc), strontium (Sr), and tin (Sn). The type of dopant may vary depending on the type of material of the ferroelectric material film.

If the ferroelectric material film includes hafnium oxide, the dopant of the ferroelectric material film may include, for example, at least one of Gd, Si, Zr, Al, and Y.

If the dopant of the ferroelectric material film is Al, the ferroelectric material film may include 3 atomic % (at %) to 8 at % of Al. Here, the ratio of the dopant in the ferroelectric material film may refer to the ratio of the sum of the amounts of Hf and Al to the amount of Al in the ferroelectric material film.

If the dopant of the ferroelectric material film is Si, the ferroelectric material film may include 2 at % to 10 at % of Si. If the dopant of the ferroelectric material film is Y, the ferroelectric material film may include 2 at % to 10 at % of Y. If the dopant of the ferroelectric material film is Gd, the ferroelectric material film may include 1 at % to 7 at % of Gd. If the dopant of the ferroelectric material film is Zr, the ferroelectric material film may include 50 at % to 80 at % of Zr.

The paraelectric material film may include paraelectric properties. The paraelectric material film may include, for example, at least one of silicon oxide and a high-k metal oxide. The high-k metal oxide may include, for example, at least one of hafnium oxide, zirconium oxide, and aluminum oxide, but the present disclosure is not limited thereto.

The ferroelectric material film and the paraelectric material film may include the same material. The ferroelectric material film may have ferroelectric properties, but the paraelectric material film may not have ferroelectric properties. For example, if the ferroelectric material film and the paraelectric material film include hafnium oxide, the hafnium oxide included in the ferroelectric material film may have a different crystalline structure from the hafnium oxide included in the paraelectric material film.

The ferroelectric material film may be thick enough to exhibit ferroelectric properties. The ferroelectric material film may have a thickness of, for example, 0.5 nm to 10 nm, but the present disclosure is not limited thereto. A critical thickness that can exhibit ferroelectric properties may vary depending on the type of ferroelectric material, and thus, the thickness of the ferroelectric material film may vary depending on the type of ferroelectric material included in the ferroelectric material film.

For example, the gate insulating layer 112 may include one ferroelectric material film. In another example, the gate insulating layer 112 may include a plurality of ferroelectric material films that are spaced apart from one another. The gate insulating layer 112 may have a structure in which a plurality of ferroelectric material films and a plurality of paraelectric material films are alternately stacked.

The capping pattern 113 may extend in the second horizontal direction DR2 on the first through sixth gate electrodes G1 through G6, the gate insulating layer 112, and the gate spacers 111. For example, the capping pattern 113 may be in contact with the top surfaces of the gate spacers 111, but the present disclosure is not limited thereto. In another example, the capping pattern 113 may be disposed between the gate spacers 111. The capping pattern 113 may include, for example, at least one of SiN, SiON, $SiO_2$, silicon carbonitride (SiCN), SiOCN, and a combination thereof, but the present disclosure is not limited thereto.

The first active cut FC1 may extend in the second horizontal direction DR2. The first active cut FC1 may be spaced apart from the first gate electrode G1 in the first horizontal direction DR1. The fifth gate electrode G5 may be spaced apart from the first active cut FC1 in the second horizontal direction DR2. The first active cut FC1 may penetrate the capping pattern 113, the second gate electrode G2, and the second plurality of nanosheets NW2 in the vertical direction DR3. The first active cut FC1 may extend into the substrate 100. The first active cut FC1 may separate the first and second active patterns F1 and F2.

For example, the first active cut FC1 may be in contact with inner sidewalls of the gate spacers 111. For example, the first active cut FC1 may be in contact with the second gate electrode G2 between the second plurality of nanosheets NW2. For example, the top surface of the first active cut FC1 may be formed on the same plane as the top surface of the capping pattern 113, but the present disclosure is not limited thereto. In another example, the top surface of the first active cut FC1 may be formed to be higher (i.e., in the vertical direction DR3) than the top surface of the capping pattern 113.

The second active cut FC2 may extend in the second horizontal direction DR2. The second active cut FC2 may be spaced apart from the first active cut FC1 in the first horizontal direction DR1. The sixth gate electrode G6 may be spaced apart from the second active cut FC2 in the second horizontal direction DR2. The second active cut FC2 may penetrate the capping pattern 113, the third gate electrode G3, and the third plurality of nanosheets NW3 in the vertical direction DR3. The second active cut FC2 may extend into the substrate 100. The second active cut FC2 may separate the second and third active patterns F2 and F3.

For example, the second active cut FC2 may be in contact with inner sidewalls of the gate spacers 111. For example, the second active cut FC2 may be in contact with the third gate electrode G3 between the third plurality of nanosheets NW3. For example, the top surface of the second active cut FC2 may be formed on the same plane as the top surface of the capping pattern 113, but the present disclosure is not limited thereto. In another example, the top surface of the second active cut FC2 may be formed to be higher (i.e., in the vertical direction DR3) than the top surface of the capping pattern 113.

The first and second active cuts FC1 and FC2 may include, for example, one of SiN, SiON, $SiO_2$, SiOCN, or a combination thereof, but the present disclosure is not limited thereto.

The gate cut GC may extend in the first horizontal direction DR1 between the fourth active pattern F4 and the first through third active patterns F1 through F3. The gate cut GC may separate the first and fourth gate electrodes G1 and G4. The gate cut GC may also separate the second and fifth gate electrodes G2 and G5. The gate cut GC may also separate the first active cut FC1 and the fifth gate electrode G5. The gate cut GC may also separate the third and sixth gate electrodes G3 and G6. The gate cut GC may also separate the second active cut FC2 and the sixth gate electrode G6.

For example, the sidewalls of the gate cut GC may be in contact with the first and second active cuts FC1 and FC2, but the present disclosure is not limited thereto. For example, the gate insulating layer 112 may be disposed between the gate cut GC and the first through sixth gate electrodes G1 through G6, but the present disclosure is not limited thereto. In another example, the first through sixth gate electrodes G1 through G6 may be in contact with the gate cut GC.

The gate cut GC may extend into the field insulating layer 105. In some embodiments, the gate cut GC may extend through the field insulating layer 105 and into the substrate 100, below the first surface 100a. The top surface of the gate cut GC may be formed on the same plane as the top surface of the capping pattern 113. The gate cut GC may include, for example, SiN, SiON, SiO$_2$, SiOCN, or a combination thereof, but the present disclosure is not limited thereto.

The first source/drain region SD1 may be disposed on at least one side of each of the first gate electrode G1, the first active cut FC1, and the second active cut FC2, on each of the first through third active patterns F1 through F3. For example, the first source/drain region SD1 may be disposed on both sides of the first gate electrode G1, on the first active pattern F1, may be disposed between the first and second active cuts FC1 and FC2, on the second active pattern F2, and may be disposed on one side of the second active cut FC2, on the third active pattern F3.

The second source/drain region SD2 may be disposed on at least one side of each of the fourth through sixth gate electrodes G4 through G6, on the fourth active pattern F4. For example, the second source/drain region SD2 may be disposed on both sides of each of the fourth through sixth gate electrodes G4 through G6, on the fourth active pattern F4.

The first upper interlayer insulating layer 120 may be disposed on the field insulating layer 105. The first upper interlayer insulating layer 120 may cover the first and second source/drain regions SD1 and SD2. The first upper interlayer insulating layer 120 may surround the sidewalls of each of the gate spacers 111, the sidewalls of the capping pattern 113, and the sidewalls of the gate cut GC. For example, the top surface of the first upper interlayer insulating layer 120 may be formed on the same plane as the top surface of the capping pattern 113, the top surface of the first active cut FC1, and the top surface of the second active cut FC2.

The first upper interlayer insulating layer 120 may include at least one of, for example, silicon oxide, silicon nitride, silicon oxynitride, and a low-k material. The low-k material may include, for example, fluorinated tetraethyl orthosilicate (FTEOS), hydrogen silsesquioxane (HSQ), bis-benzocyclobutene (BCB), tetramethyl orthosilicate (TMOS), octamethylcyclotetrasiloxane (OMCTS), hexamethyldisiloxane (HMDS), trimethylsilyl borate (TMSB), diacetoxyditertiarybutoxysiloxane (DADBS), trimethylsilyl phosphate (TMSP), polytetrafluoroethylene (PTFE), tonen silazen (TOSZ), fluoride silicate glass (FSG), polyimide nanofoam (such as polypropylene oxide), carbon doped silicon oxide (CDO), organo silicate glass (OSG), SiLK, amorphous fluorinated carbon, silica aerogel, silica xerogel, mesoporous silica, and a combination thereof, but the present disclosure is not limited thereto.

The first source/drain contact CA1 may extend in the second horizontal direction DR2 between the first gate electrode G1 and the first active cut FC1. The first source/drain contact CA1 may penetrate the first upper interlayer insulating layer 120 in the vertical direction DR3 and may be connected to the first source/drain region SD1. The second source/drain contact CA2 may extend in the second horizontal direction DR2 between the first and second active cuts FC1 and FC2. The second source/drain contact CA2 may penetrate the first upper interlayer insulating layer 120 in the vertical direction DR3 and may be connected to the first source/drain region SD1.

The third source/drain contact CA3 may extend in the second horizontal direction DR2 between the fourth and fifth gate electrodes G4 and G5. The third source/drain contact CA3 may penetrate the first upper interlayer insulating layer 120 in the vertical direction DR3 and may be connected to the second source/drain region SD2. The fourth source/drain contact CA4 may extend in the second horizontal direction DR2 between the fifth and sixth gate electrodes G5 and G6. The fourth source/drain contact CA4 may penetrate the first upper interlayer insulating layer 120 in the vertical direction DR3 and may be connected to the second source/drain region SD2.

For example, the top surfaces of the first through fourth source/drain contacts CA1 through CA4 may be formed on the same plane as the top surface of the first upper interlayer insulating layer 120. FIGS. 2, 3, and 6 illustrate that the first through fourth source/drain contacts CA1 through CA4 are formed as single films, but the present disclosure is not limited thereto. That is, alternatively, the first through fourth source/drain contacts CA1 through CA4 may be formed as multifilms. The first through fourth source/drain contacts CA1 through CA4 may include a conductive material.

The silicide layer SL may be disposed between the first source/drain region SD1 and the first and second source/drain contacts CA1 and CA2. The silicide layer SL may also be disposed between the second source/drain region SD2 and the third and fourth source/drain contacts CA3 and CA4. The silicide layer SL may include, for example, a metal silicide material.

A first gate contact CB1 may penetrate the capping pattern 113 in the vertical direction DR3 and may be connected to the first gate electrode G1. A second gate contact CB2 may penetrate the capping pattern 113 in the vertical direction DR3 and may be connected to the fourth gate electrode G4. A third gate contact CB3 may penetrate the capping pattern 113 in the vertical direction DR3 and may be connected to the fifth gate electrode G5.

For example, the top surfaces of the first through third gate contacts CB1 through CB3 may be formed on the same plane as the top surface of the first upper interlayer insulating layer 120. FIGS. 4 and 5 illustrate that the first through third gate contacts CB1 through CB3 are formed as single films, but the present disclosure is not limited thereto. Alternatively, the first through third gate contacts CB1 through CB3 may be formed as multifilms. The first through third gate contacts CB1 through CB3 may include a conductive material.

For example, the source/drain contact separation layer CAS may separate the second and fourth source/drain contacts CA2 and CA3. In some embodiments, the source/drain contact separation layer CAS may separate the first and third source/drain contacts CA1 and CA3. For example, the source/drain contact separation layer CAS may be in contact with the gate cut GC.

The top surface of the source/drain contact separation layer CAS may be formed on the same plane as the top surfaces of the first through fourth source/drain contacts CA1 through CA4. The source/drain contact separation layer CAS may include, for example, at least one of SiN, SiON, SiOCN, and a combination thereof, but the present disclosure is not limited thereto.

The first through via 160 may be disposed between the first and second active cuts FC1 and FC2. The first through via 160 may penetrate the second source/drain contact CA2, the first source/drain region SD1, and the second active pattern F2 in the vertical direction DR3. The first through via 160 may extend into the substrate 100. An upper part of the first through via 160 may be in contact with the first and second active cuts FC1 and FC2. For example, the first through via 160 may be in contact with the second plurality of nanosheets NW2 and the third plurality of nanosheets NW3.

For example, the upper part of the first through via 160 may overlap with the first and second active cuts FC1 and FC2 in the vertical direction DR3. The top surface of the first through via 160 may be formed on the same plane as the top surfaces of the first and second active cuts FC1 and FC2. The top surface of the first through via 160 may be formed on the same plane as the first upper interlayer insulating layer 120. The top surface of the first through via 160 may be formed on the same plane as the top surfaces of the first through fourth source/drain contacts CA1 through CA4.

The first through via 160 may include, for example, one of Ti, TiN, Ta, TaN, TaCN, W, WN, tungsten carbonitride (WCN), Zr, zirconium nitride (ZrN), V, vanadium nitride (VN), Nb, NbN, and a combination thereof. Also, the first through via 160 may include, for example, at least one of Mo, Cu, C, Ag, Co, Ta, indium (In), Sn, Zn, manganese (Mn), Mg, chromium (Cr), germanium (Ge), Sr, Pt, Al, Ru, Ir, and Rh.

A lower via trench 130T may be disposed in the substrate 100. The lower via trench 130T may be recessed from the second surface 100b of the substrate 100 toward the inside of the substrate 100. That is, the top surface of the lower via trench 130T may be formed inside the substrate 100.

The lower via 130 may be disposed in the lower via trench 130T. For example, the bottom surface of the lower via 130 may be formed on the same plane as the second surface 100b of the substrate 100. The lower via 130 may be connected to the first through via 160. That is, the lower via 130 may be in contact with the first through via 160. For example, the lower via 130 may overlap with the first and second active cuts FC1 and FC2 in the vertical direction DR3. For example, the lower via 130 may be spaced apart from the first and second active cuts FC1 and FC2 in the vertical direction DR3.

The lower via 130 may include a lower via insulating layer 131 and a lower via filling layer 132. The lower via insulating layer 131 may be disposed along the sidewalls and the top surface of the lower via trench 130T. However, the lower via insulating layer 131 may not be disposed in a region where the lower via 130 is in contact with the first through via 160. The lower via 130 may include, for example, at least one of SiN, SiO$_2$, SiON, SiOC, and SiOCN, but the present disclosure is not limited thereto.

The lower via filling layer 132 may fill the lower via trench 130T, on the lower via insulating layer 131. The lower via filling layer 132 may be in contact with the first through via 160. The lower via filling layer 132 may include, for example, at least one of Mo, Cu, C, Ag, Co, Ta, In, Sn, Zn, Mn, Ti, Cr, Ge, Sr, Pt, Mg, Al, Zr, W, Ru, Ir, and Rh, but the present disclosure is not limited thereto.

The lower interlayer insulating layer 140 may be disposed on the second surface 100b of the substrate 100. The lower interlayer insulating layer 140 may include, for example, at least one of silicon oxide, silicon nitride, silicon oxynitride, and a low-k material.

The lower wiring layer 150 may be disposed on the second surface 100b of the substrate 100. The lower wiring layer 150 may be disposed in the lower interlayer insulating layer 140. The lower wiring layer 150 may extend in the second horizontal direction DR2. The lower wiring layer 150 may be connected to the lower via 130. The lower wiring layer 150 may be in contact with the lower via 130.

For example, the width, in the first horizontal direction DR1, of the lower wiring layer 150 may be greater than the width, in the first horizontal direction DR1, of the lower via 130, but the present disclosure is not limited thereto. FIGS. 2, 3, 5, and 6 illustrate that the lower wiring layer 150 is formed as a single film, but the present disclosure is not limited thereto. Alternatively, the lower wiring layer 150 may be formed as a multifilm. The lower wiring layer 150 may include a conductive material. For example, the lower wiring layer 150 may be one of a power rail, to which power is supplied, or a ground rail, which is grounded.

The etching stop layer 170 may be disposed on the top surfaces of the first upper interlayer insulating layer 120, the capping pattern 113, the first through third gate contacts CB1 through CB3, the first through fourth source/drain contacts CA1 through CA4, the gate cut GC, the first and second active cuts FC1 and FC2, and the first through via 160. FIGS. 2 through 6 illustrate that the etching stop layer 170 is formed as a single film, but the present disclosure is not limited thereto. Alternatively, in some embodiments, the etching stop layer 170 may be formed as a multifilm. The etching stop layer 170 may include, for example, at least one of aluminum oxide, aluminum nitride, hafnium oxide, zirconium oxide, silicon oxide, silicon nitride, silicon oxynitride, and a low-k material. The second upper interlayer insulating layer 175 may be disposed on the etching stop layer 170. The second upper interlayer insulating layer 175 may include, for example, at least one of silicon oxide, silicon nitride, silicon oxynitride, and a low-k material.

The first upper via V1 may penetrate the second upper interlayer insulating layer 175 and the etching stop layer 170 in the vertical direction DR3 and may be connected to one of the first through fourth source/drain contacts CA1 through CA4. The second upper via V2 may penetrate the second upper interlayer insulating layer 175 and the etching stop layer 170 in the vertical direction DR3 and may be connected to one of the first through third gate contacts CB1 through CB3.

FIGS. 2 through 6 illustrate that the first and second upper vias V1 and V2 are formed as single films, but the present disclosure is not limited thereto. Alternatively, the first and second upper vias V1 and V2 may be formed as multifilms. The first and second upper vias V1 and V2 may include a conductive material.

The third upper interlayer insulating layer 180 may be disposed on the second upper interlayer insulating layer 175. The third upper interlayer insulating layer 180 may include, for example, at least one of silicon oxide, silicon nitride, silicon oxynitride, and a low-k material. The upper wiring layer 190 may be disposed in the third upper interlayer insulating layer 180. The upper wiring layer 190 may be connected to one of the first and second upper vias V1 and V2. FIGS. 2 through 6 illustrate that the upper wiring layer 190 is formed as a single film, but the present disclosure is not limited thereto. Alternatively, the upper wiring layer 190 may be formed as a multifilm. The upper wiring layer 190 may include a conductive material.

According to the embodiment of FIGS. 1 through 6, as the lower wiring layer 150, which is a power rail or a ground rail, is disposed below the substrate 100 and the first through via 160 is disposed between two active cuts, i.e., the first and second active cuts FC1 and FC2, which are connected to the lower wiring layer 150, the integration density of the semiconductor device can be improved.

A method of fabricating a semiconductor device according to some embodiments will hereinafter be described with reference to FIGS. 2 through 33.

FIGS. 7 through 33 are cross-sectional views illustrating intermediate operations of a method of fabricating a semiconductor device according to some embodiments.

Figure 7:
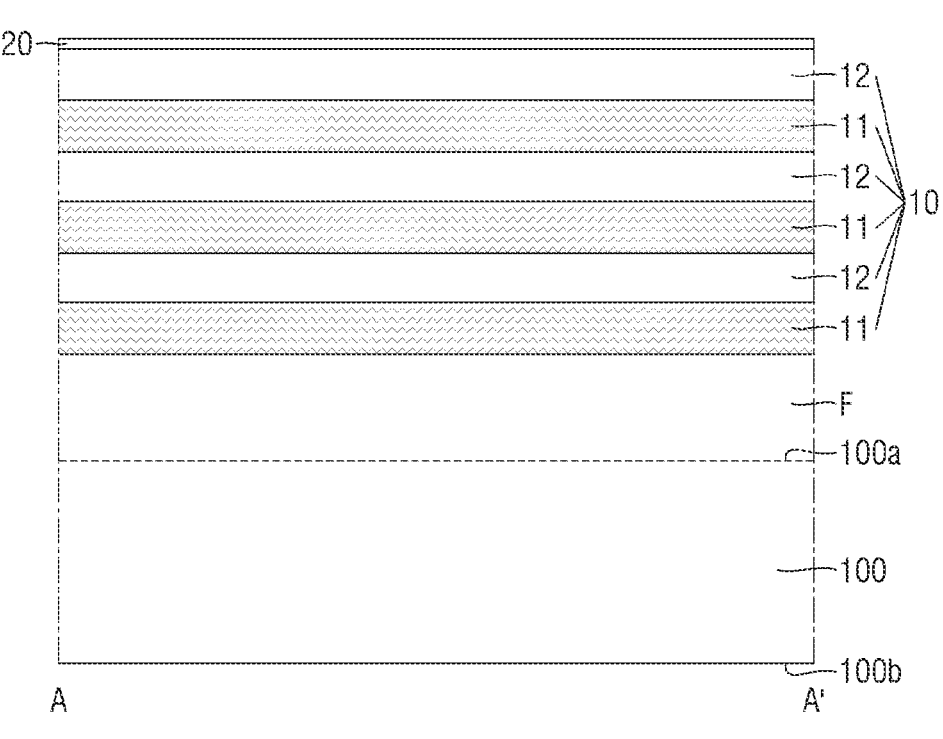
Figure 7:
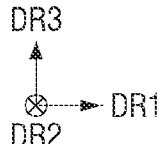
Figure 8:
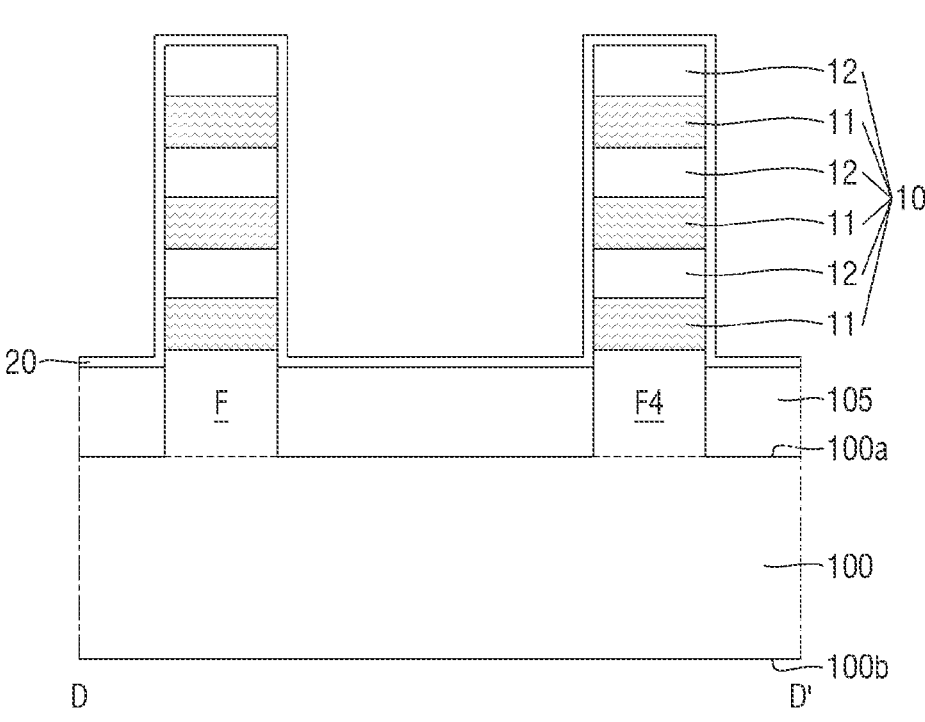
Figure 8:
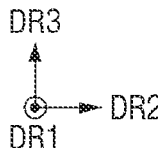

Referring to FIGS. 7 and 8, a stack structure 10 may be formed on a first surface 100*a* of a substrate 100. The stack structure 10 may include first semiconductor layers 11 and second semiconductor layers 12, and the first semiconductor layers 11 and the second semiconductor layers 12 may be alternately stacked on the first surface 100*a* of the substrate 100. For example, one of the first semiconductor layers 11 may be formed as a lowermost layer of the stack structure 10, and one of the second semiconductor layers 12 may be formed as an uppermost layer of the stack structure 10. However, the present disclosure is not limited to this example. In another example, a first semiconductor layer 11 may be formed as the uppermost layer of the stack structure 10. The first semiconductor layers 11 may include, for example, SiGe. The second semiconductor layers 12 may include, for example, Si.

The stack structure 10 may be partially etched. While the stack structure 10 is being etched, the substrate 100 may also be partially etched. As a result, an active pattern F and a fourth active pattern F4 may be defined on the first surface 100*a* of the substrate 100, below the stack structure 10. The active pattern F and the fourth active pattern F4 may extend in a first horizontal direction DR1.

A field insulating layer 105 may be formed on the first surface 100*a* of the substrate 100. The field insulating layer 105 may surround the sidewalls of each of the active patterns F and the fourth active pattern F4. For example, the top surfaces of the active pattern F and the fourth active pattern F4 may be formed to be higher (i.e., in the vertical direction DR3) than the top surface of the field insulating layer 105.

A pad oxide layer 20 may be formed to cover the top surface of the field insulating layer 105, exposed portions of the sidewalls of the active pattern F, exposed portions of the sidewalls of the fourth active pattern F4, and the sidewalls and the top surface of the stack structure 10. For example, the pad oxide layer 20 may be conformally formed. The pad oxide layer 20 may include, for example, SiO₂.

Figure 9:
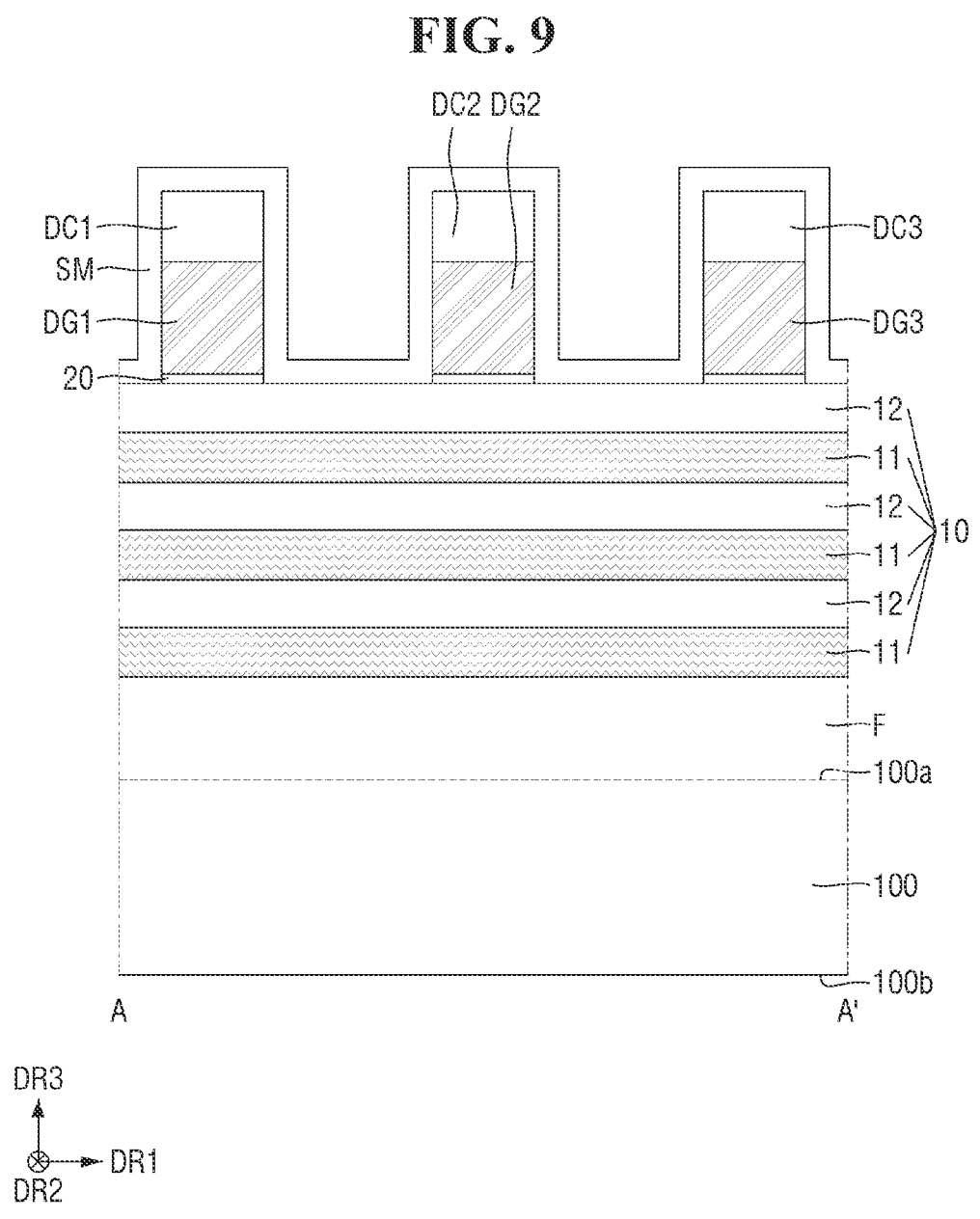
Figure 10:
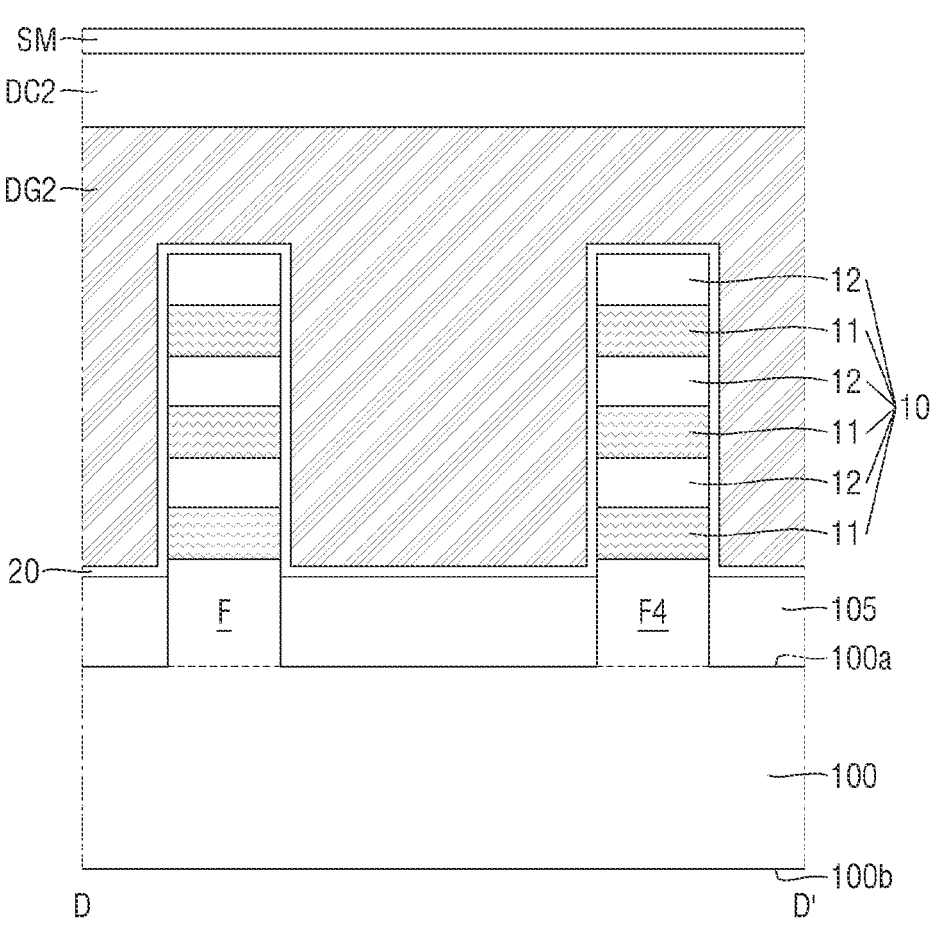
Figure 10:
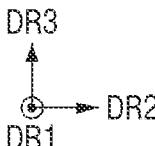

Referring to FIGS. 9 and 10, first through third dummy gates DG1 through DG3 and first through third dummy capping patterns DC1 through DC3 may be formed on the stack structure 10 and the field insulating layer 105 to extend in a second horizontal direction DR2 on the pad oxide layer 20. Specifically, the second dummy gate DG2 may be spaced apart from the first dummy gate DG1 in the first horizontal direction DR1, and the third dummy gate DG3 may be spaced apart from the second dummy gate DG2 in the first horizontal direction DR1. The first dummy capping pattern DC1 may be disposed on the first dummy gate DG1. The second dummy capping pattern DC2 may be disposed on the second dummy gate DG2. The third dummy capping pattern DC3 may be disposed on the third dummy gate DG3.

During the formation of the first through third dummy gates DG1 through DG3 and the first through third dummy capping patterns DC1 through DC3, the entire pad oxide layer 20 except for portions overlapping with the first through third dummy gates DG1 through DG3 in a vertical direction DG3 may be removed from above the substrate 100.

A spacer material layer SM may be formed to cover the sidewalls of each of the first through third dummy gates DG1 through DG3, the sidewalls and the top surface of each of the first through third dummy capping patterns DC1 through DC3, exposed portions of the sidewalls and the top surface of the stack structure 10, and the top surface of the field insulating layer 105. For example, the spacer material layer SM may be conformally formed. The spacer material layer SM may include, for example, at least one of SiN, SiOCN, silicon boron carbonitride (SiBCN), SiCN, SiON, and a combination thereof.

Figure 11:
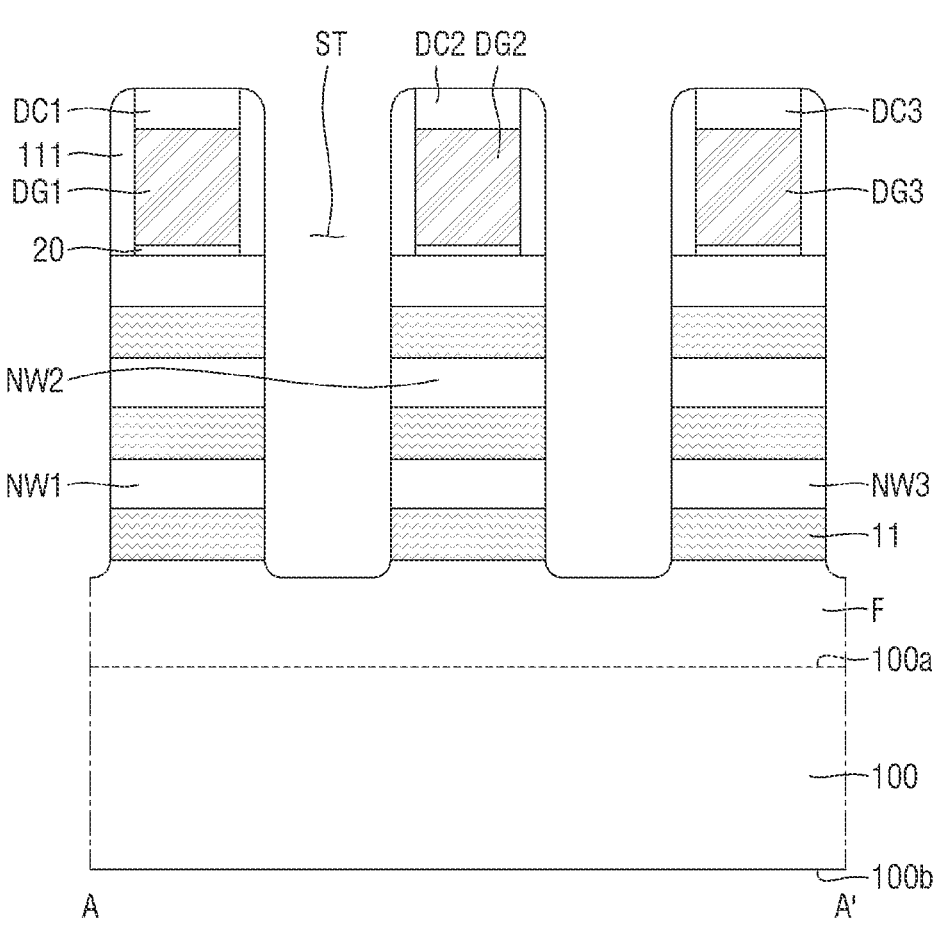
Figure 11:
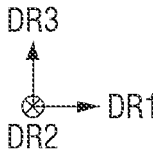

Referring to FIG. 11, source/drain trenches ST may be formed by etching the stack structure 10 of FIGS. 9 and 10 using the first through third dummy gates DG1 through DG3 and the first through third dummy capping patterns DC1 through DC3 as a mask. For example, the source/drain trenches ST may extend into the active pattern F and the fourth active pattern F4.

During the formation of the source/drain trenches ST, portions of the first through third dummy capping patterns DC1 through DC3 and portions of the spacer material layer SM on the top surfaces of the first through third dummy capping patterns DC1 through DC3 may be removed. Portions of the spacer material layer SM that remain on the sidewalls of each of the first through third dummy capping patterns DC1 through DC3 and the sidewalls of each of the first through third dummy gates DG1 through DG3 may be referred to as gate spacers 111.

For example, after the formation of the source/drain trenches ST, portions of the second semiconductor layers 12 that remain below the first dummy gate DG1, on the active pattern F, may be referred to as a first plurality of nanosheets NW1, portions of the second semiconductor layers 12 that remain below the second dummy gate DG2, on the active pattern F, may be referred to as a second plurality of nanosheets NW2, and portions of the second semiconductor layers 12 that remain below the third dummy gate DG3, on the active pattern F, may be referred to as a third plurality of nanosheets NW3.

Although not specifically illustrated, after the formation of the source/drain trenches ST, portions of the second semiconductor layers 12 that remain below the first dummy gate DG1, on the fourth active pattern F4, may be referred to as a fourth plurality of nanosheets NW4, portions of the second semiconductor layers 12 that remain below the second dummy gate DG2, on the fourth active pattern F4, may be referred to as a fifth plurality of nanosheets NW5, and portions of the second semiconductor layers 12 that remain below the third dummy gate DG3, on the fourth active pattern F4, may be referred to as a sixth plurality of nanosheets NW6.

Figure 12:
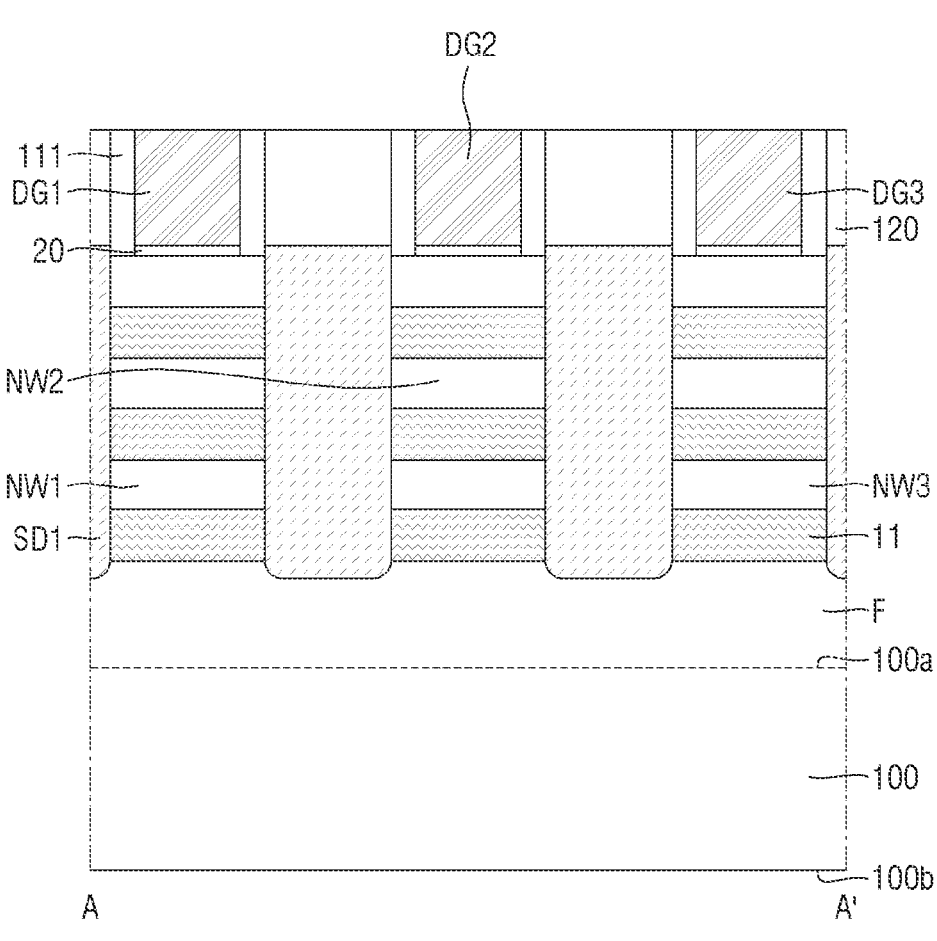
Figure 12:
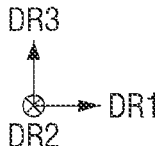
Figure 13:
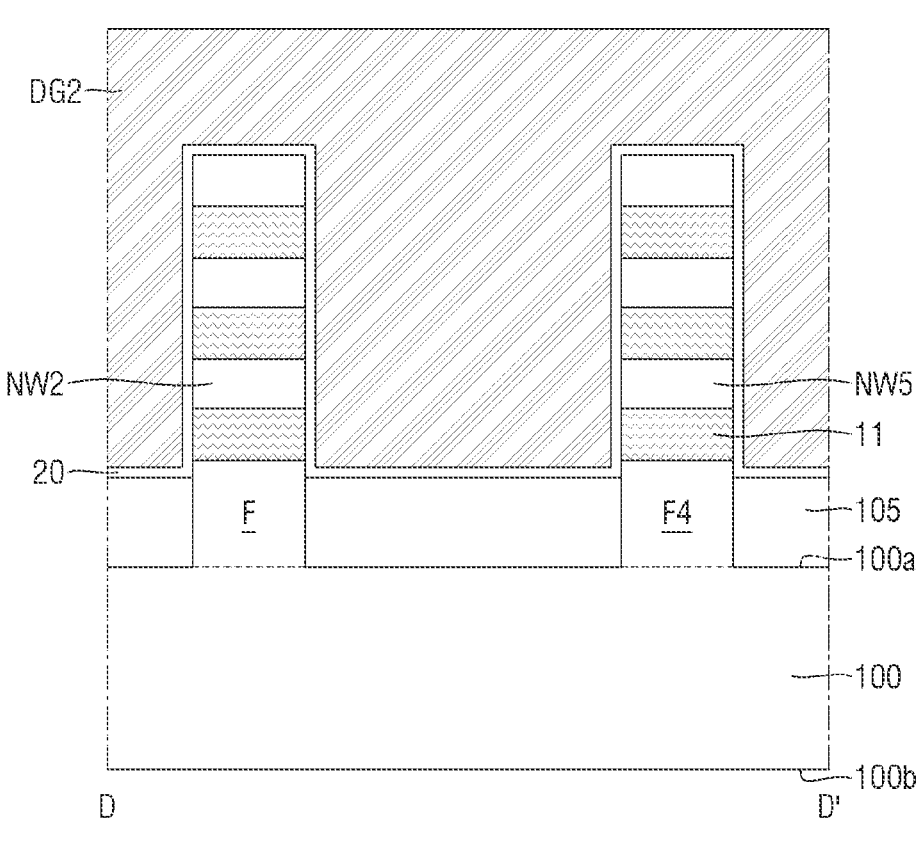
Figure 13:
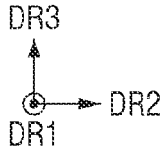
Figure 14:
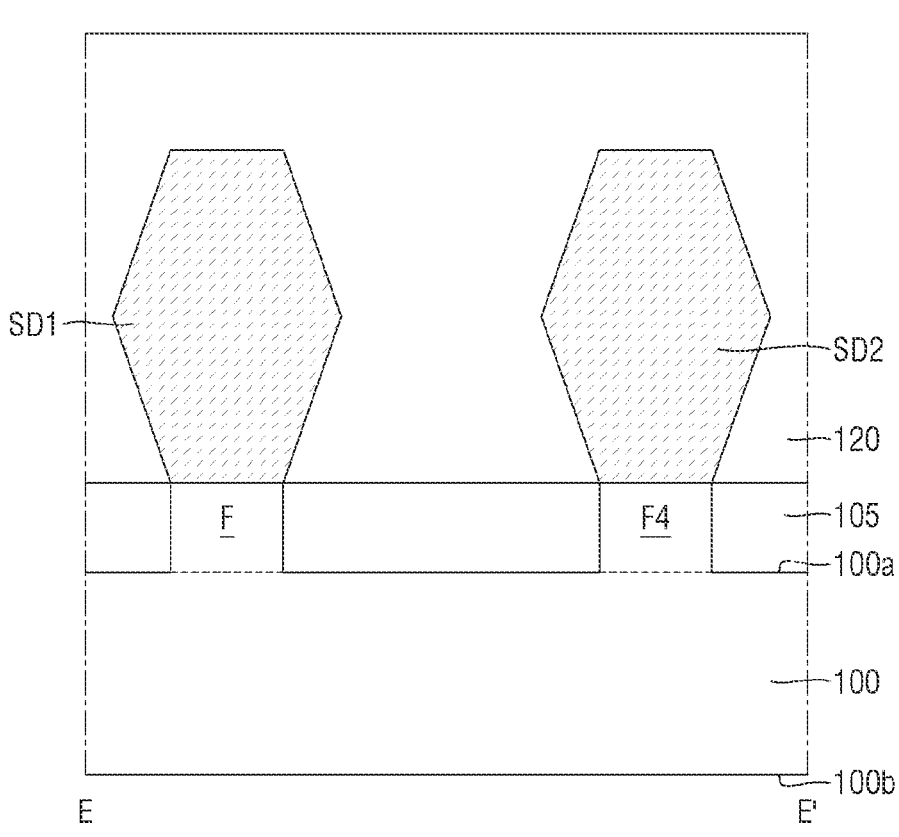
Figure 14:
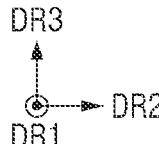

Referring to FIGS. 12 through 14, a first source/drain region SD1 may be formed in each of source/drain trenches ST formed on the active pattern F. A second source/drain region SD2 may be formed in each of source/drain trenches ST formed on the fourth active pattern F4. For example, the top surface of the first source/drain region SD1 may be formed to be higher (i.e., in the vertical direction DR3) than the top surface of an uppermost first nanosheet NW1, but the present disclosure is not limited thereto.

Thereafter, a first upper interlayer insulating layer 120 may be formed to cover the sidewalls and the top surface of each of the first and second source/drain regions SD1 and SD2, the gate spacers 111, and the first through third dummy capping patterns DC1 through DC3. Thereafter, the top surfaces of the first through third dummy gates DG1 through DG3 may be exposed by a planarization process.

Figure 15:
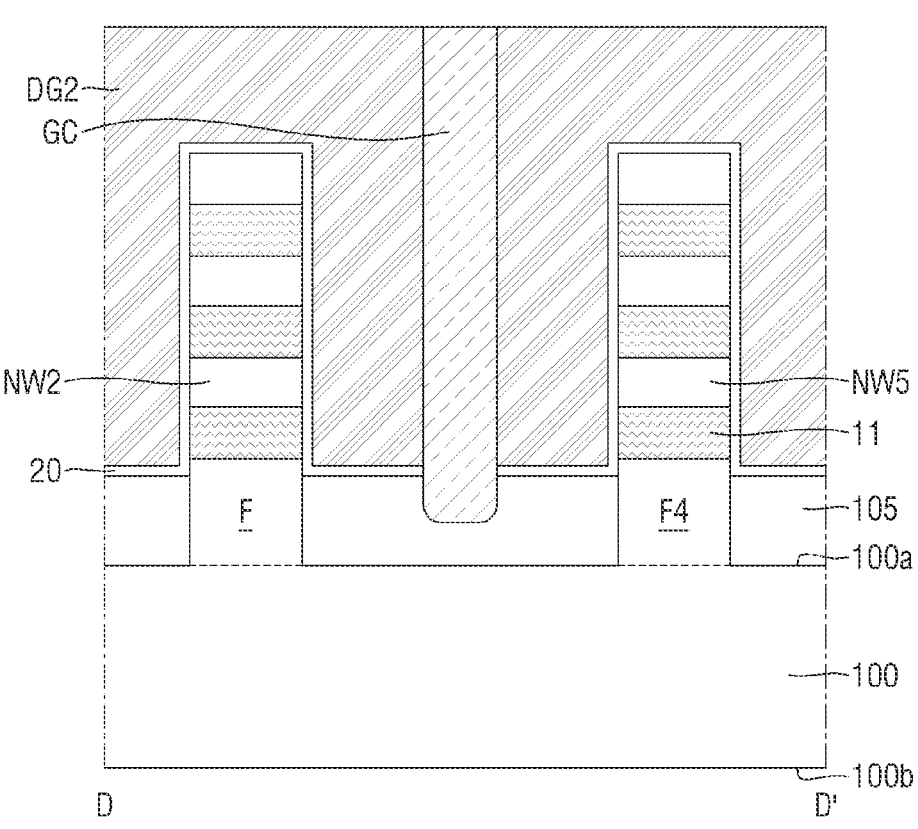
Figure 15:
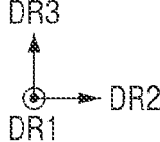
Figure 16:
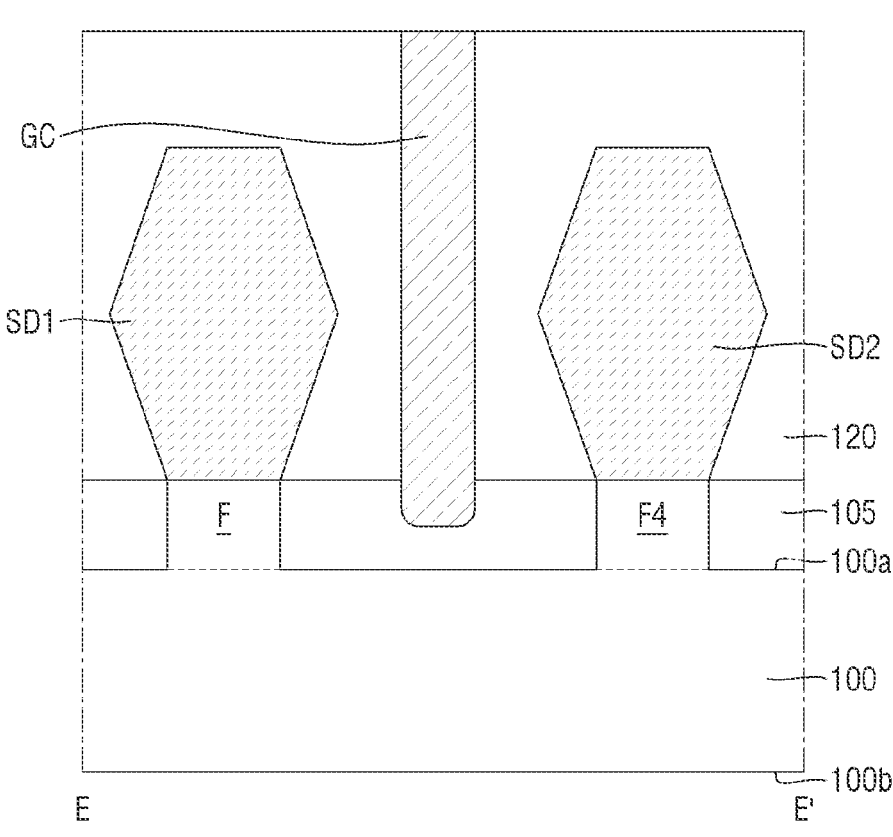
Figure 16:
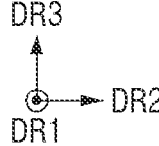

Referring to FIGS. 15 and 16, a gate cut GC, which extends in the first horizontal direction DR1, may be formed between the active pattern F and the fourth active pattern F4. The gate cut GC may extend into the field insulating layer

105. The gate cut GC may separate the first through third dummy gates DG1 through DG3 in the second horizontal direction DR2.

Figure 17:
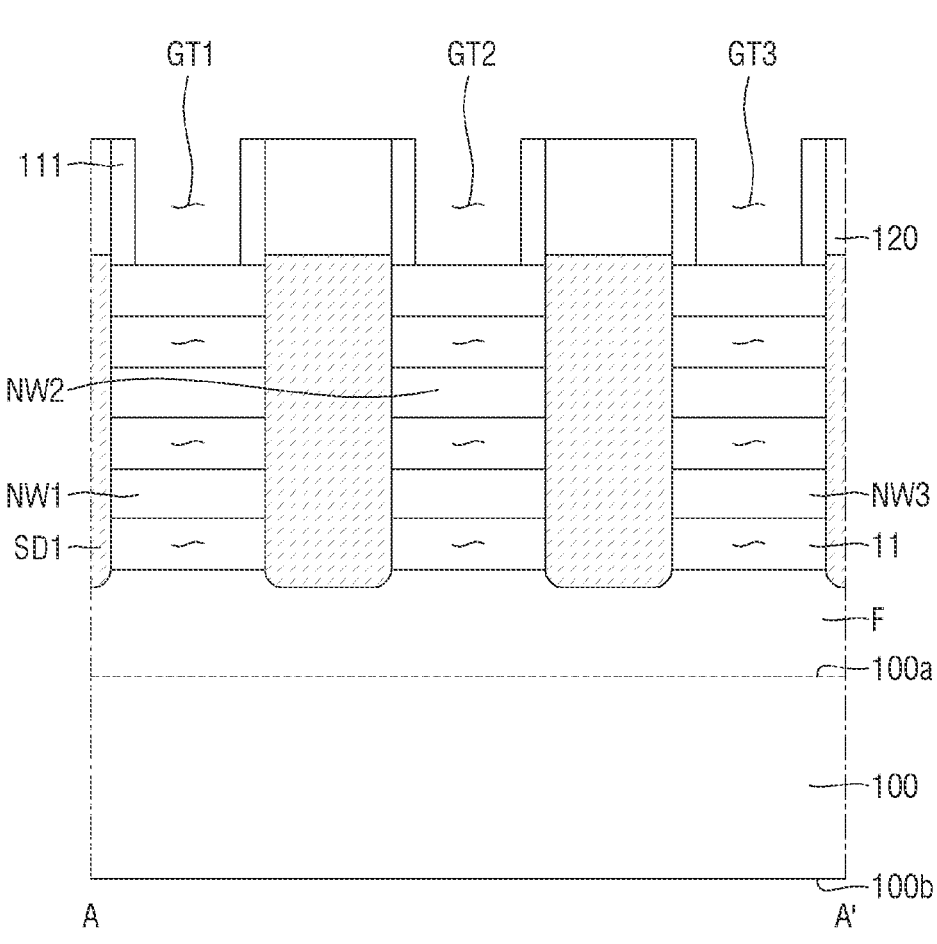
Figure 17:
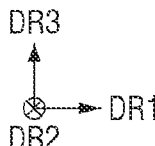
Figure 18:
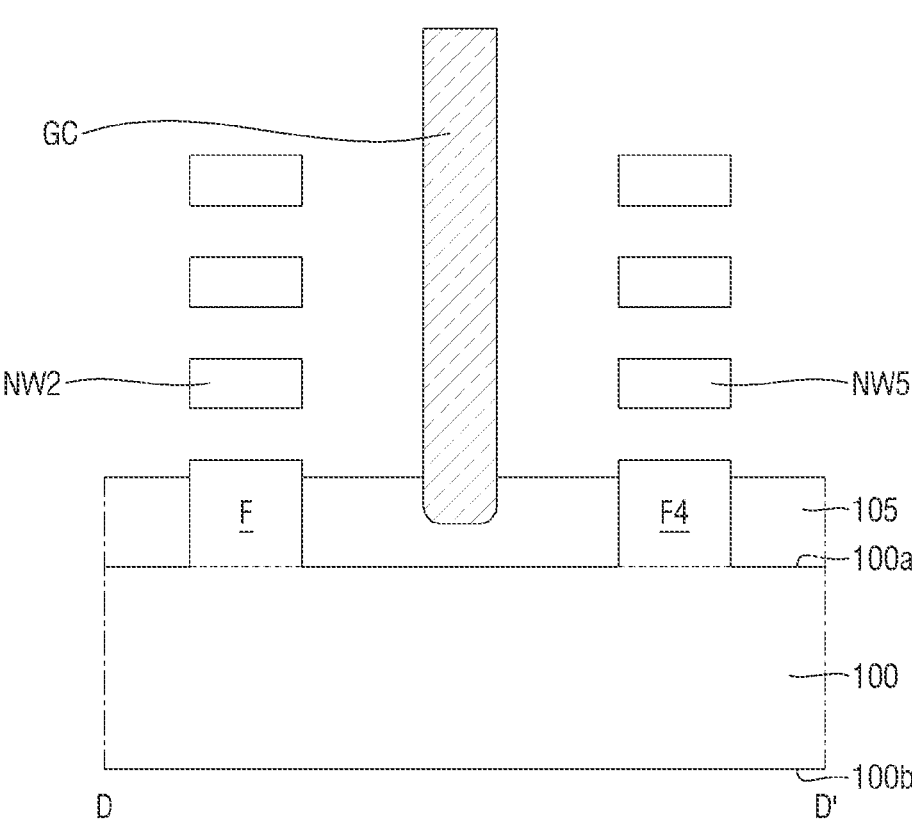
Figure 18:
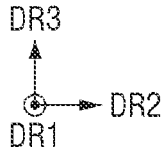

Referring to FIGS. 17 and 18, the first through third dummy gates DG1 through DG3, the pad oxide layer 20, and the first semiconductor layers 11 of FIG. 12 may be removed. A region from which the first dummy gate DG1 has been removed may be referred to as a first gate trench GT1. A region from which the second dummy gate DG2 has been removed may be referred to as a second gate trench GT2. A region from which the third dummy gate DG3 has been removed may be referred to as a third gate trench GT3.

Figure 19:
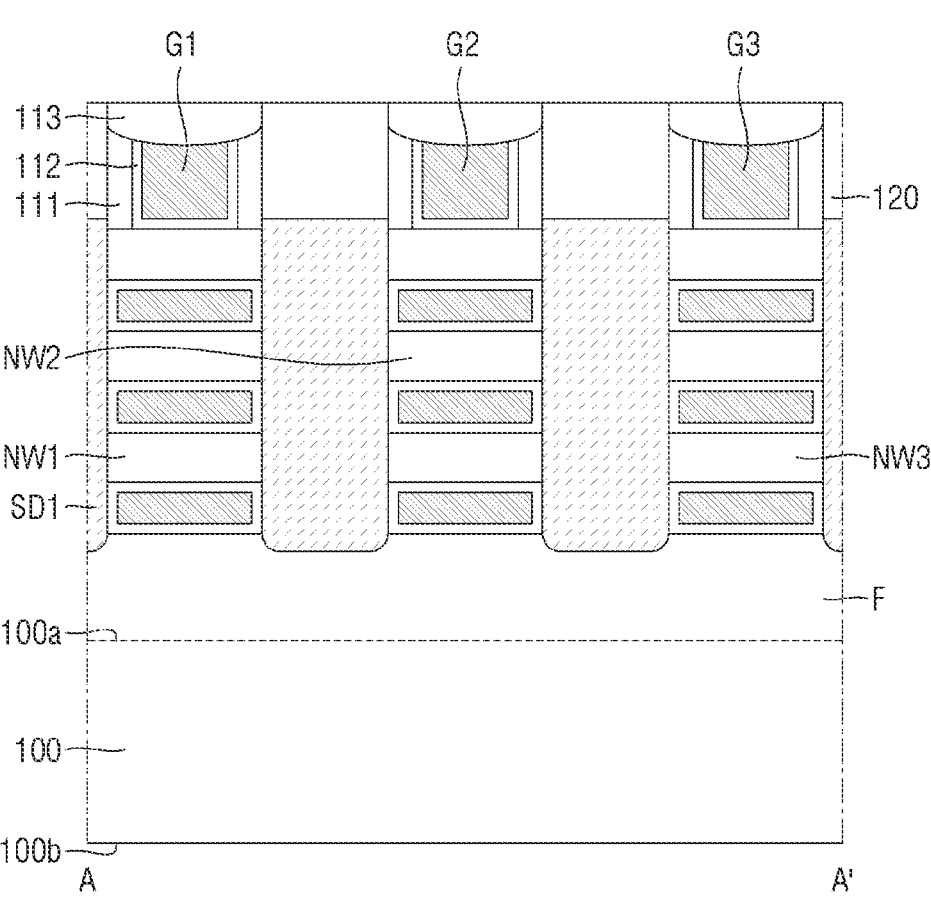
Figure 19:
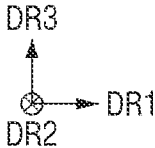
Figure 20:
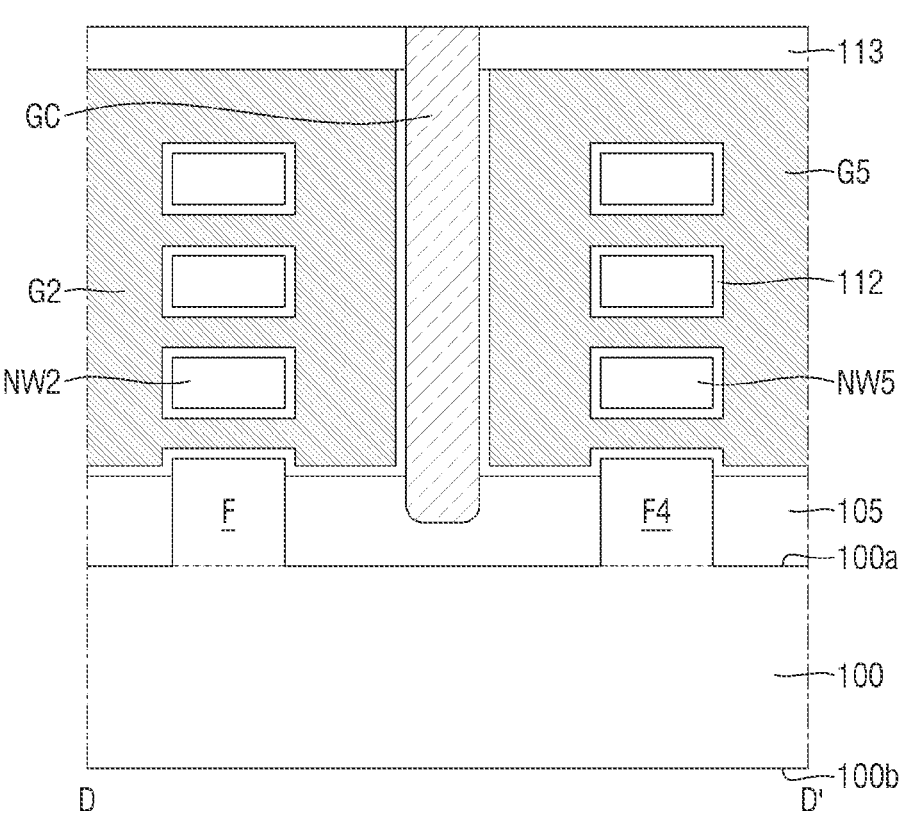
Figure 20:
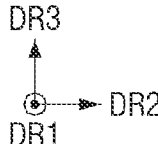

Referring to FIGS. 19 and 20, a gate insulating layer 112 may be formed in the regions from which the first through third dummy gates DG1 through DG3, the pad oxide layer 20, and the first semiconductor layers 11 of FIG. 12 have been removed. For example, the gate insulating layer 112 may also be formed on the sidewalls of the gate cut GC. For example, the gate insulating layer 112 may be conformally formed.

Thereafter, a first gate electrode G1 may be formed in the regions from which the first dummy gate DG1, the pad oxide layer 20, and the first semiconductor layers 11 of FIG. 12 have been removed, on the active pattern F. A second gate electrode G2 may be formed in the regions from which the second dummy gate DG2, the pad oxide layer 20, and the first semiconductor layers 11 of FIG. 12 have been removed, on the active pattern FA. A third gate electrode G3 may be formed in the regions from which the third dummy gate DG3, the pad oxide layer 20, and the first semiconductor layers 11 of FIG. 12 have been removed, on the active pattern F.

A fourth gate electrode G4 may be formed in the regions from which the first dummy gate DG1, the pad oxide layer 20, and the first semiconductor layers 11 of FIG. 12 have been removed, on the fourth active pattern F4. A fifth gate electrode G5 may be formed in the regions from which the second dummy gate DG2, the pad oxide layer 20, and the first semiconductor layers 11 of FIG. 12 have been removed, on the fourth active pattern F4. A sixth gate electrode G6 may be formed in the regions from which the third dummy gate DG3, the pad oxide layer 20, and the first semiconductor layers 11 of FIG. 12 have been removed, on the fourth active pattern F4.

Thereafter, upper portions of the gate spacers 111, the gate insulating layer 112, and the first through sixth gate electrodes G1 through G6 may be partially removed. Thereafter, a capping pattern 113 may be formed on the etched portions of the gate spacers 111, the gate insulating layer 112, and the first through sixth gate electrodes G1 through G6. For example, the top surface of the capping pattern 113 may be formed on the same plane as the top surface of the first upper interlayer insulating layer 120, but the present disclosure is not limited thereto.

Figure 21:
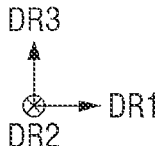
Figure 22:
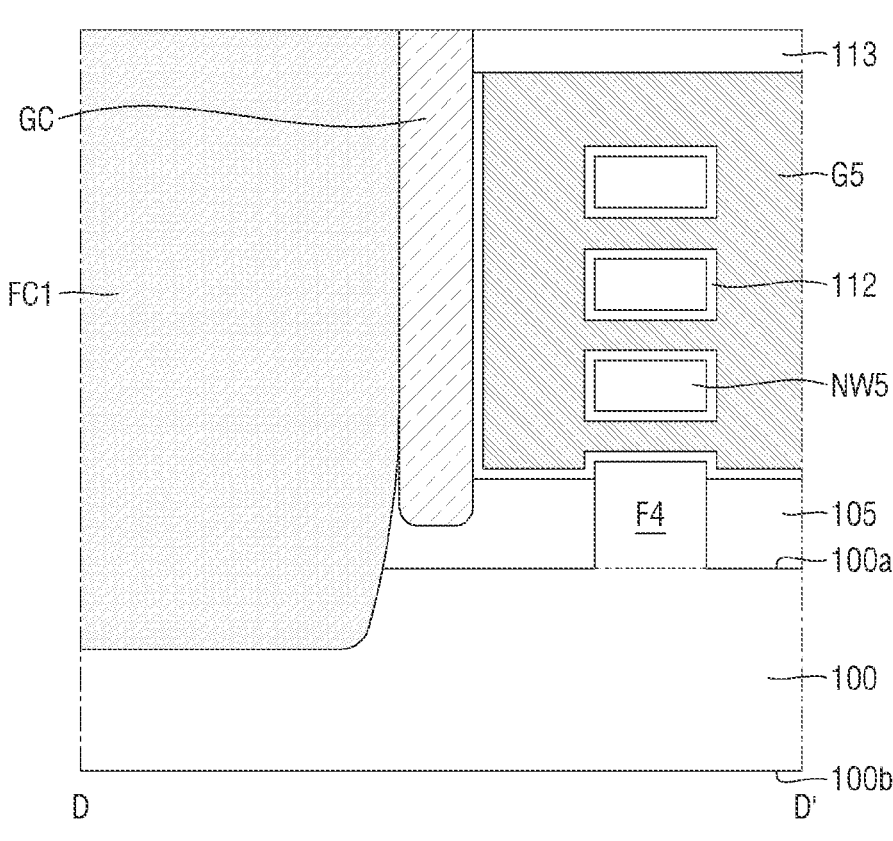
Figure 22:
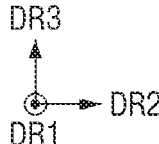

Referring to FIGS. 21 and 22, a first active cut FC1, which penetrates the capping pattern 113, the second gate electrode G2, the second plurality of nanosheets NW2 and the active pattern F in a vertical direction DR3, and extends into the substrate 100, may be formed, and a second active cut FC2, which penetrates the capping pattern 113, the third gate electrode G3, the third plurality of nanosheets NW3 and the active pattern F in the vertical direction DR3, and extends into the substrate 100, may be formed. The active pattern F may be divided into first through third active patterns F1 through F3 by the first and second active cuts FC1 and FC2. For example, the first and second active cuts FC1 and FC2 may be in contact with the sidewalls of the gate cut GC.

Figure 23:
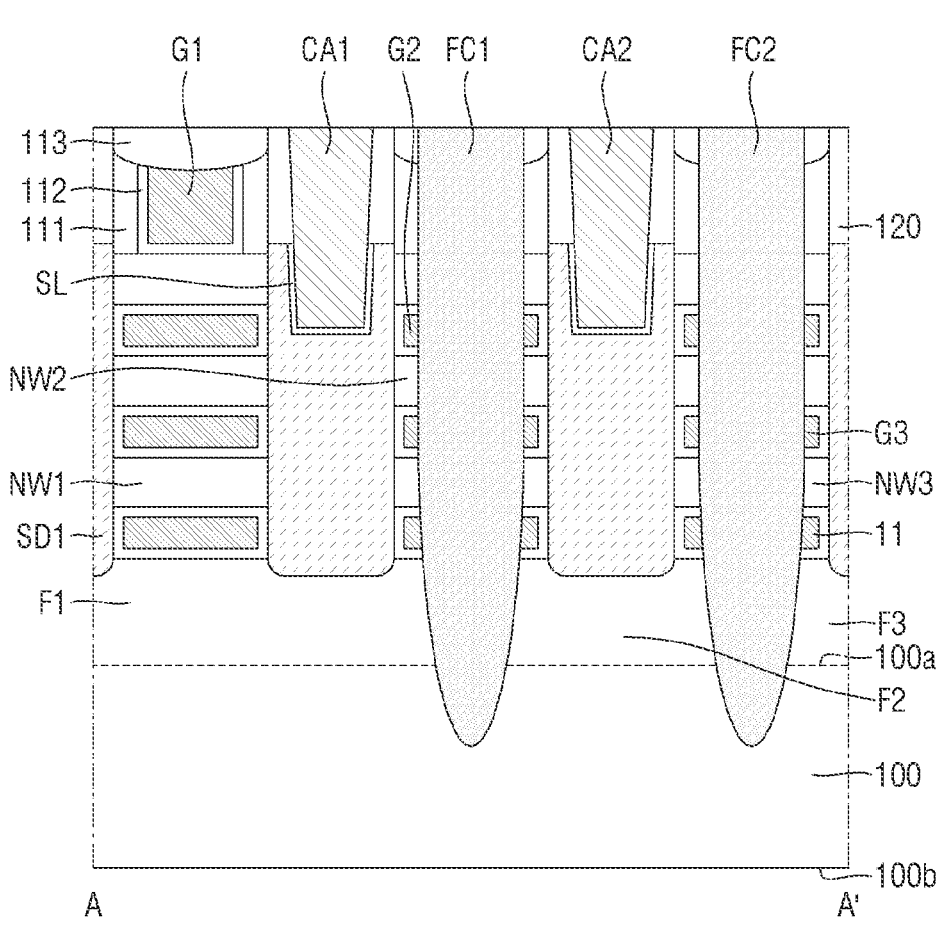
Figure 23:
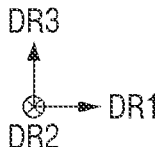
Figure 24:
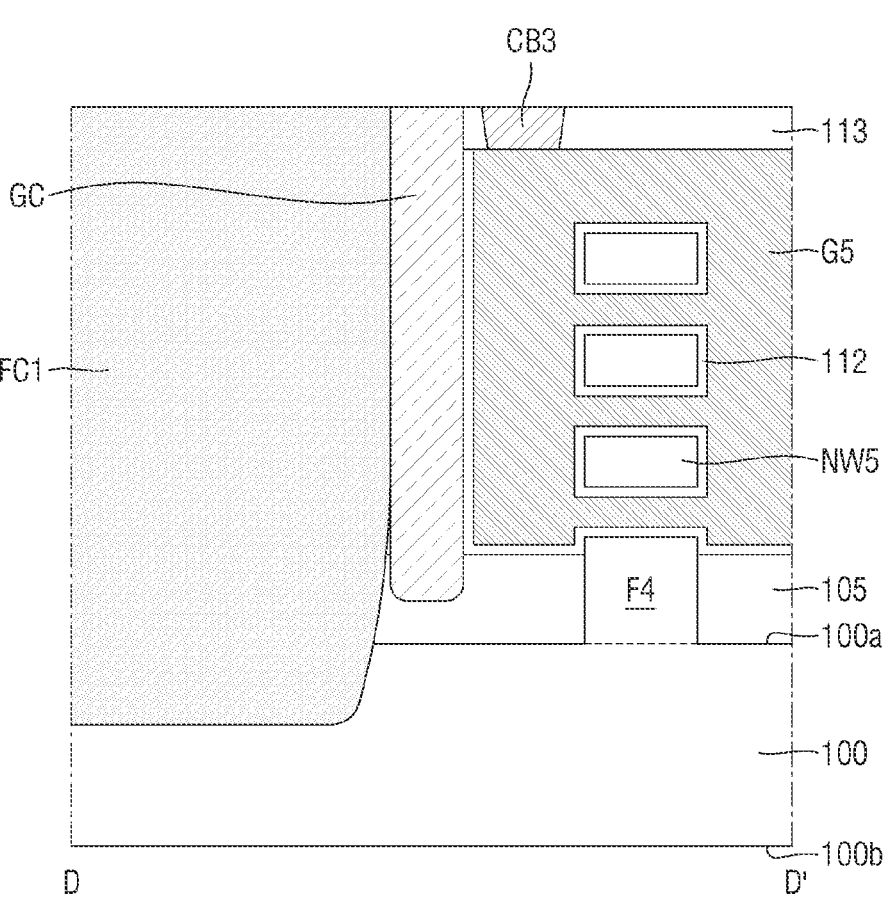
Figure 24:
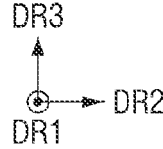
Figure 25:
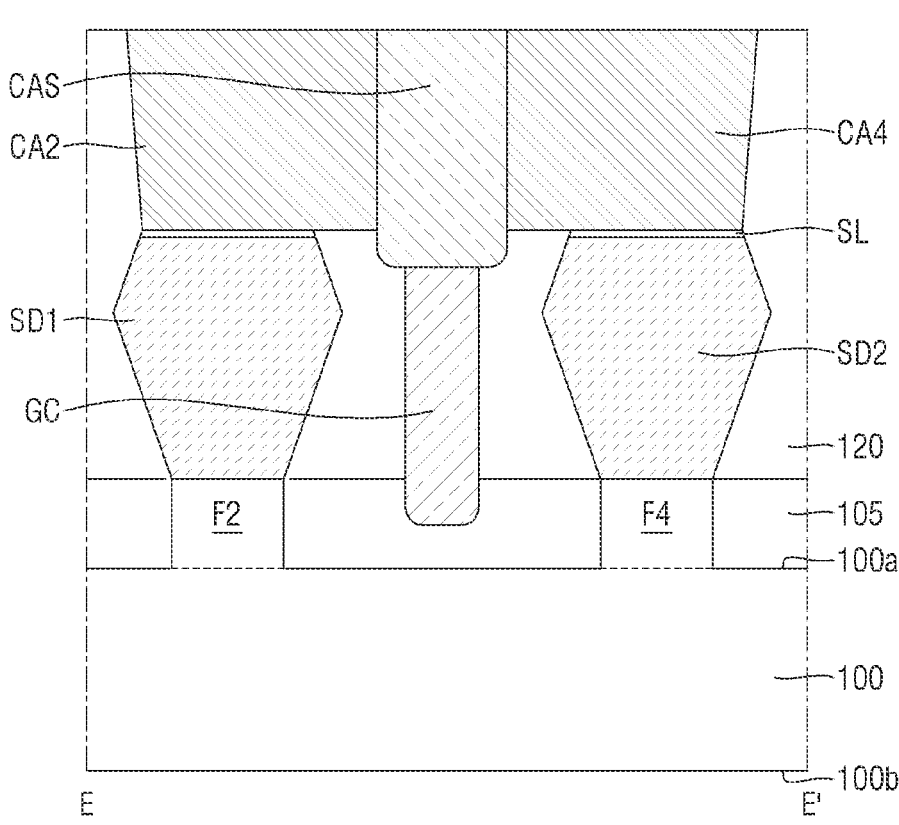
Figure 25:
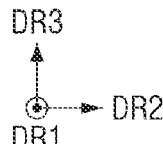

Referring to FIGS. 23 through 25, a source/drain contact (CA1 and CA3), which is connected to the first source/drain region SD1 formed on the first active pattern F1 by penetrating the first upper interlayer insulating layer 120 and the gate cut GC in the vertical direction DR3 and is connected to the second source/drain region SD2 formed on the fourth active pattern F4, may be formed. The source/drain contact (CA1 and CA3) may extend in the second horizontal direction DR2. A source/drain contact (CA2 and CA4), which is connected to the first source/drain region SD1 formed on the second active pattern F2 by penetrating the first upper interlayer insulating layer 120 and the gate cut GC in the vertical direction DR3 and is connected to the second source/drain region SD2 formed on the fourth active pattern F4, may be formed. The source/drain contact (CA2 and CA4) may extend in the second horizontal direction DR2.

A silicide layer SL may be formed between the source/drain contact (CA1 and CA3), the source/drain contact (CA2 and CA4), the first source/drain region SD1, and the second source/drain region SD2. A third gate contact CB3, which is connected to the fifth gate electrode G5 by penetrating the capping pattern 113 in the vertical direction DR3, may be formed.

Thereafter, a source/drain contact separation layer CAS, which separates the source/drain contact (CA1 and CA3) and the source/drain contact (CA2 and CA4) in the second horizontal direction DR2, may be formed. The source/drain contact separation layer CAS may divide the source/drain contact (CA1 and CA3) into first and third source/drain contacts CA1 and CA3. The source/drain contact separation layer CAS may also divide the source/drain contact (CA2 and CA4) into second and fourth source/drain contacts CA2 and CA4.

Figure 26:
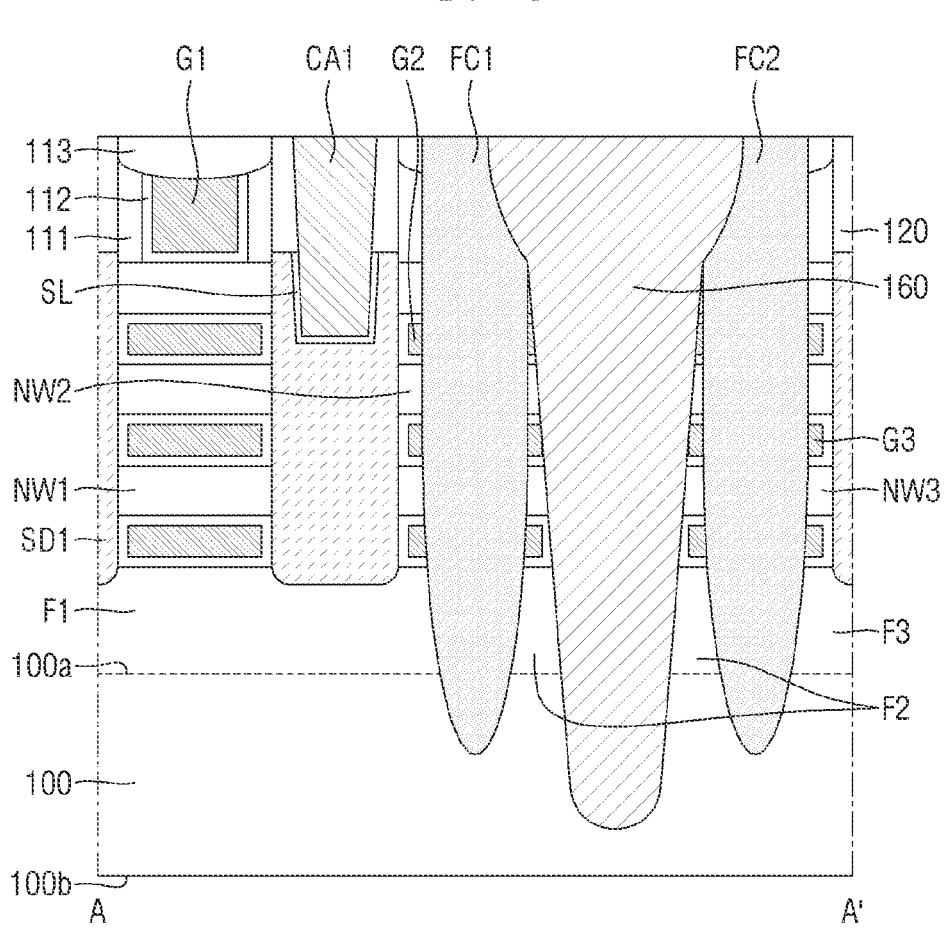
Figure 26:
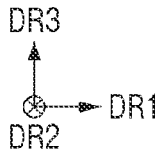
Figure 27:
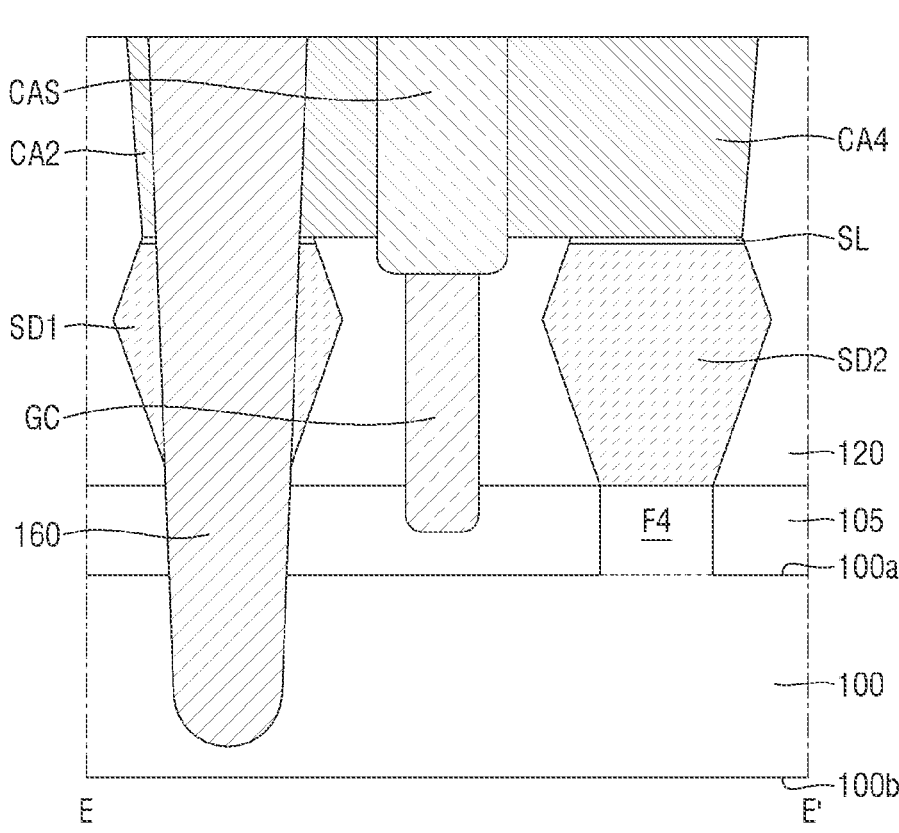
Figure 27:
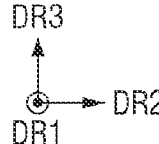

Referring to FIGS. 26 and 27, a first through via 160, which extends into the substrate 100 by penetrating the second source/drain contact CA2, the first source/drain region SD1, and the second active pattern F2 in the vertical direction DR3, between the first and second active cuts FC1 and FC2, may be formed. The first through via 160 may be in contact with the sidewalls of each of the first and second active cuts FC1 and FC2.

Figure 28:
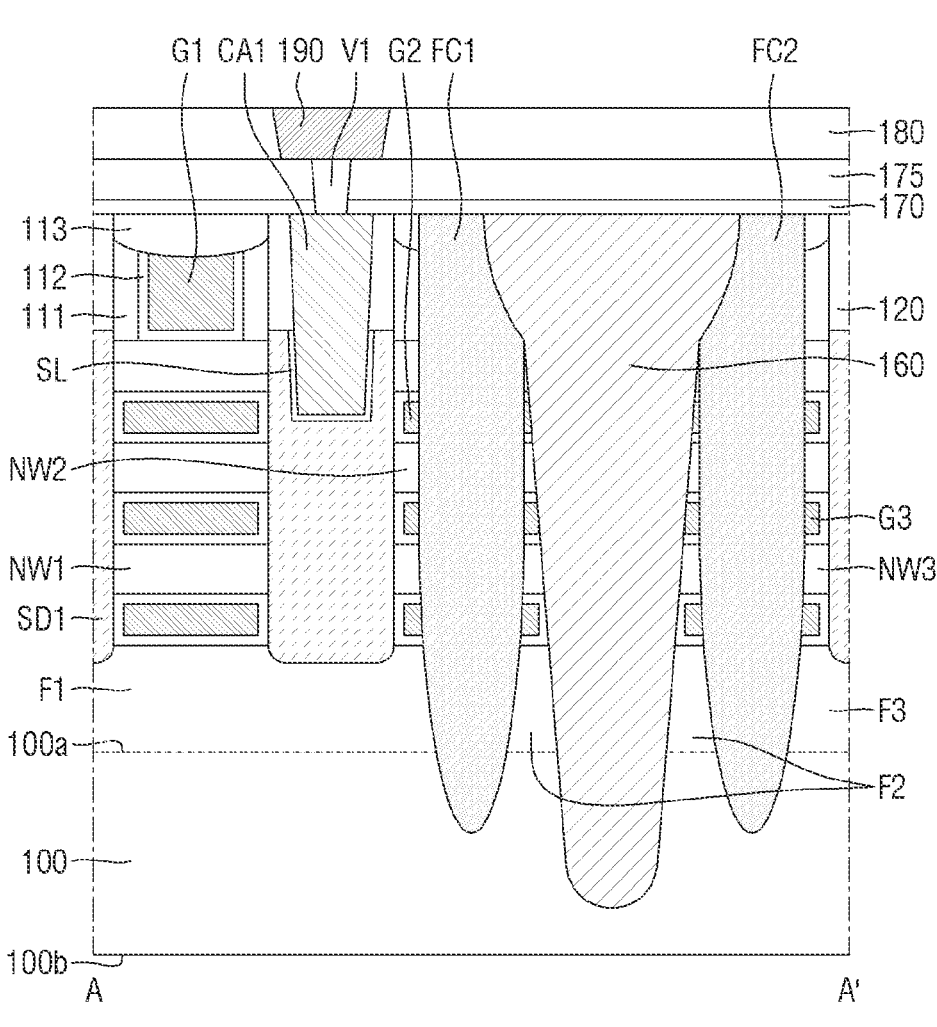
Figure 28:
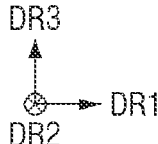
Figure 29:
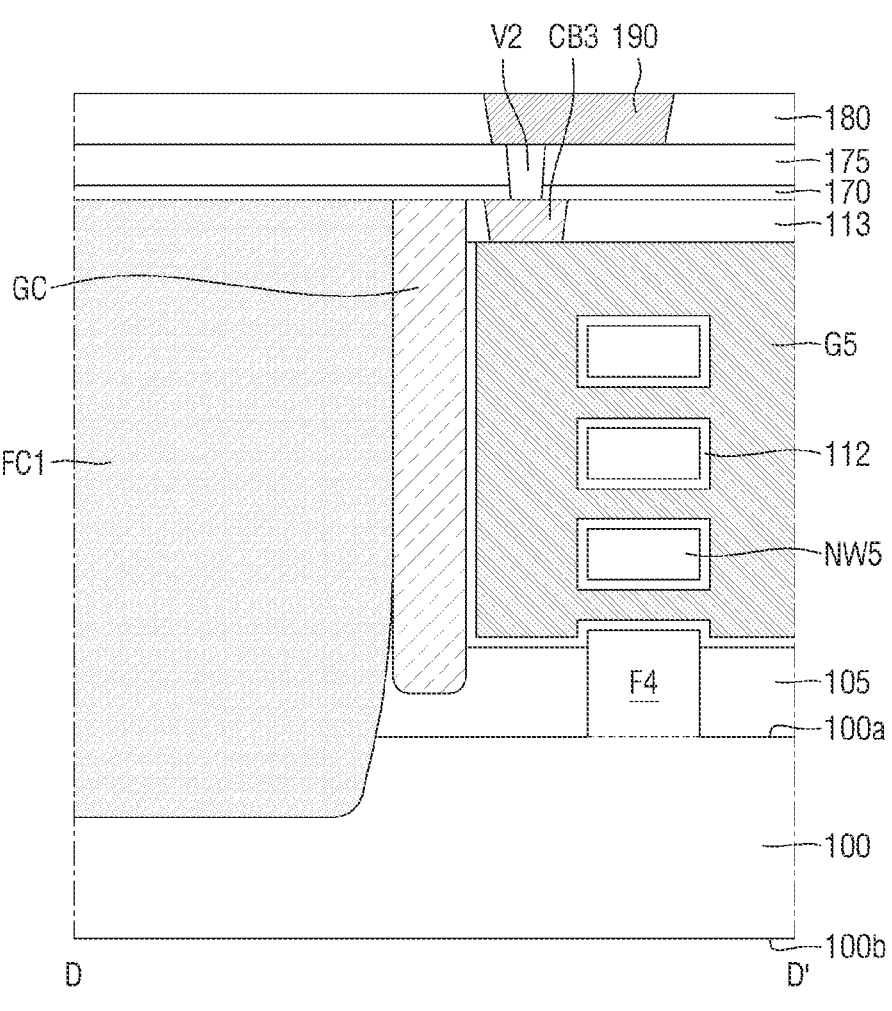
Figure 29:
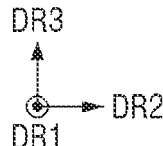
Figure 30:
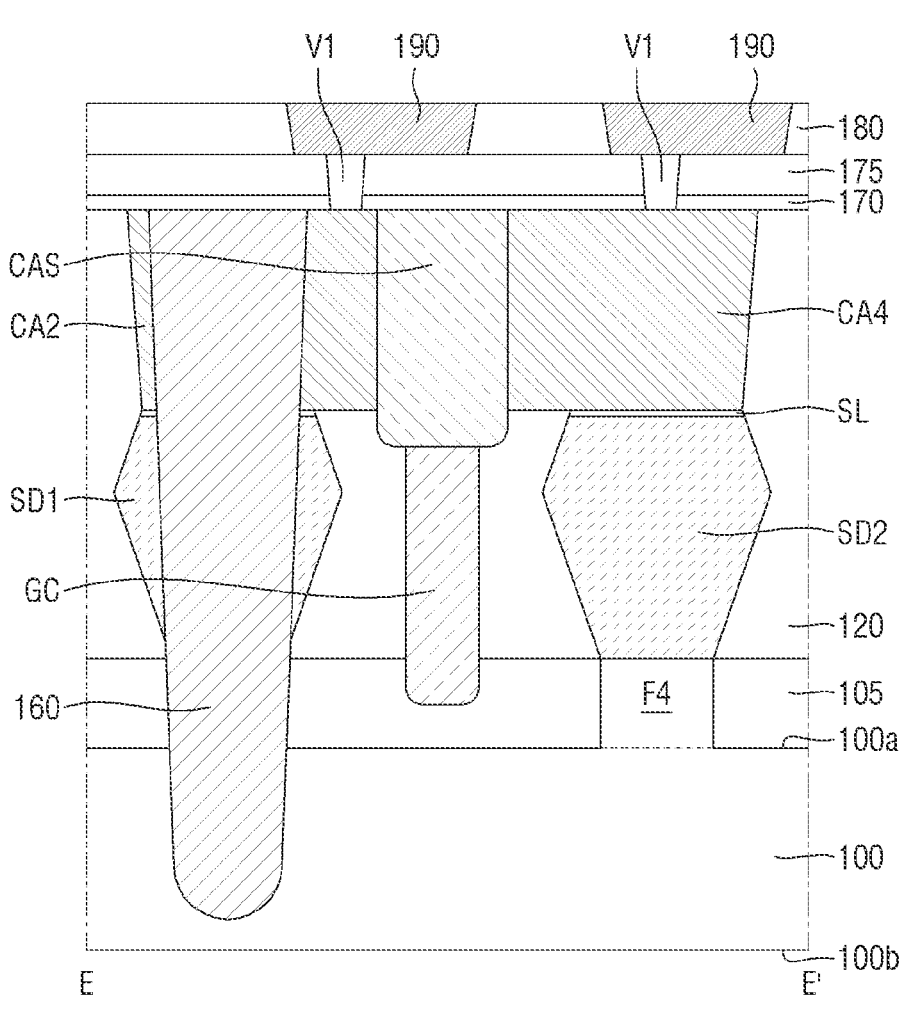
Figure 30:
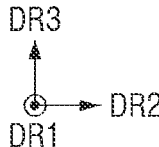

Referring to FIGS. 28 through 30, an etching stop layer 170 and a second upper interlayer insulating layer 175 may be sequentially formed on the top surfaces of the first upper interlayer insulating layer 120, the capping pattern 113, the first through third gate contacts CB1 through CB3, the first through fourth source/drain contacts CA1 through CA4, the gate cut GC, the first and second active cuts FC1 and FC2, and the first through via 160.

Thereafter, a first upper via V1, which is connected to one of the first, second, and fourth source/drain contacts CA1, CA2, and CA4 by penetrating the second upper interlayer insulating layer 175 and the etching stop layer 170 in the vertical direction DR3, may be formed. A second upper via V2, which is connected to the third gate contact CB3 connected to the fifth gate electrode G5 by penetrating the second upper interlayer insulating layer 175 and the etching stop layer 170 in the vertical direction DR3, may be formed. Thereafter, a third upper interlayer insulating layer 180 and an upper wiring layer 190 may be formed on the second upper interlayer insulating layer 175.

Figure 31:
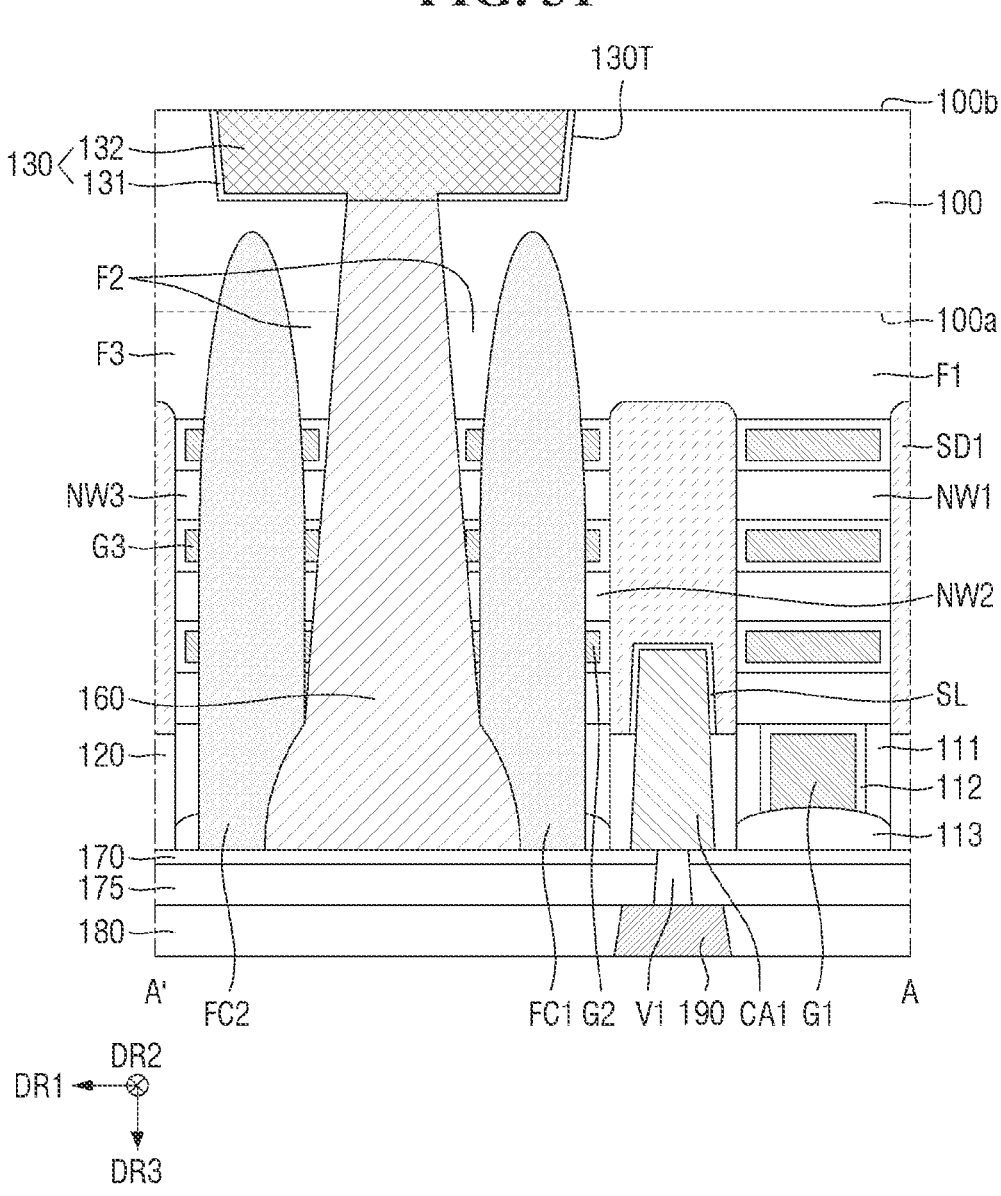
Figure 32:
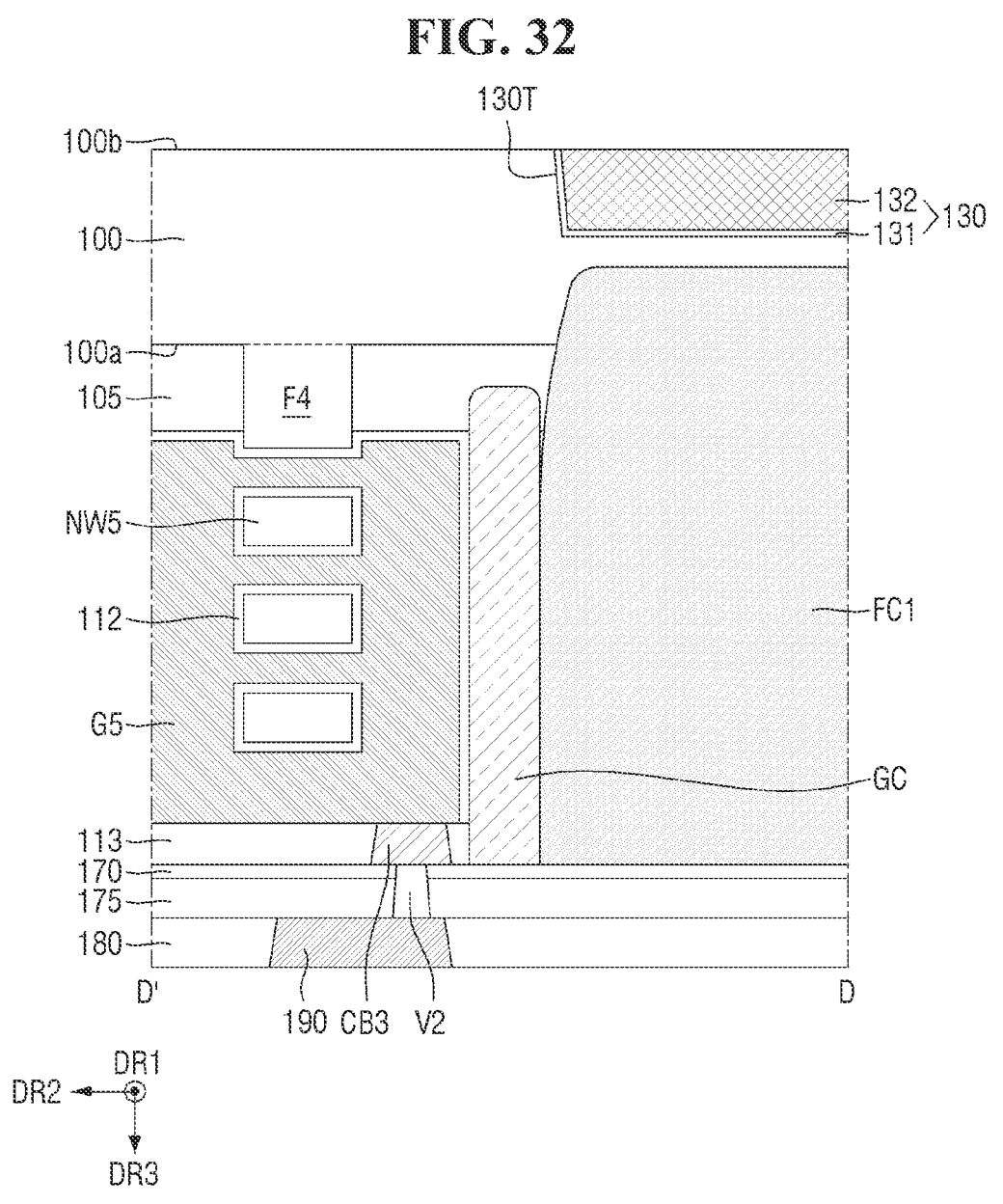
Figure 33:
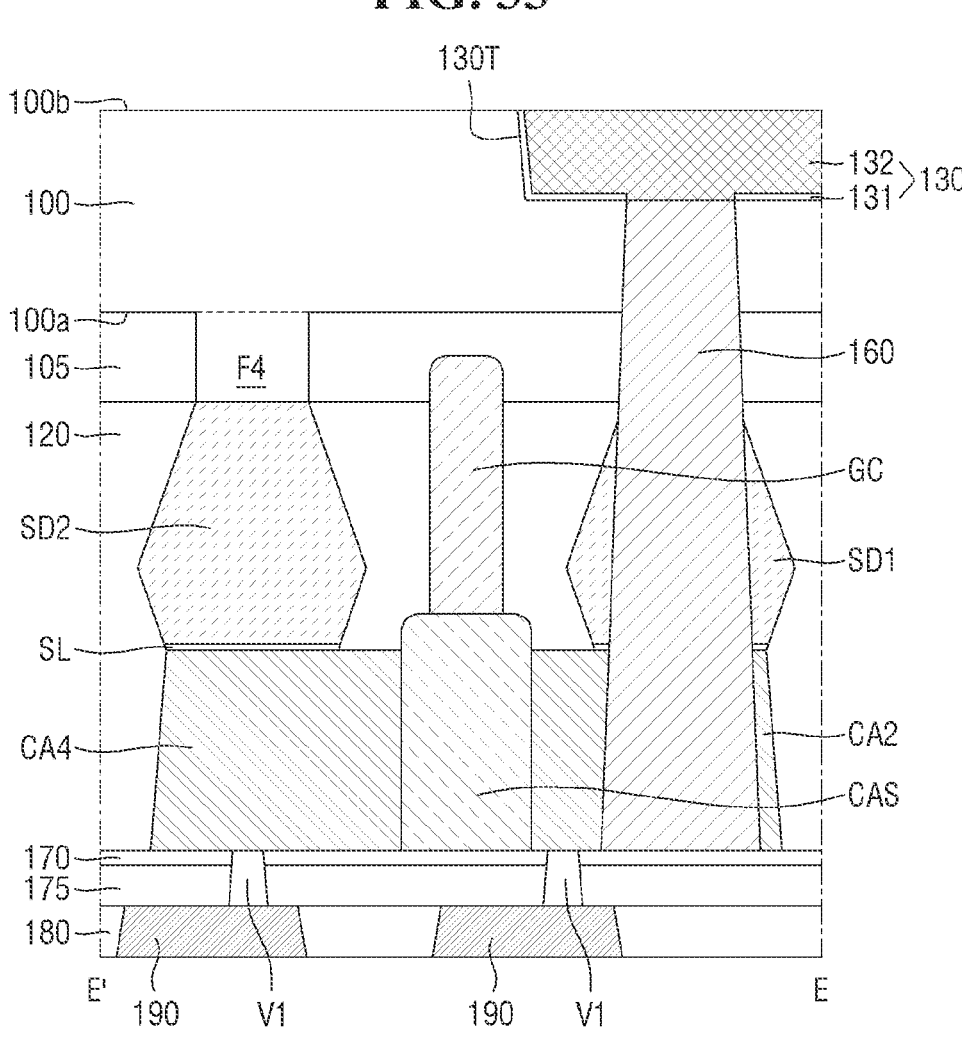
Figure 33:
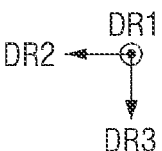

Referring to FIGS. 31 through 33, a structure obtained by the processes illustrated in FIGS. 28 through 30 may be turned upside down, and then, a lower via trench 130T may be formed on a second surface 100*b* of the substrate 100. The lower via trench 130T may extend from the second surface 100*b* of the substrate 100 to the inside of the substrate 100. During the formation of the lower via trench 130T, part of the first through via 160 may be etched. That is, the first through via 160 may be exposed by the lower via trench 130T.

Thereafter, a lower via insulating layer 131 may be formed along the sidewalls and the bottom surface of the lower via trench 130T. In this case, the lower via insulating layer 131 may not be formed on the surface of the first through via 160. Thereafter, a lower via filling layer 132 may be formed on the lower via insulating layer 131 to fill the lower via trench 130T.

Thereafter, as illustrated in FIGS. 2 through 6, a lower interlayer insulating layer 140 and a lower wiring layer 150 may be formed on the second surface 100b of the substrate 100. Thereafter, the resulting structure may be turned upside down, thereby obtaining the semiconductor device of FIGS. 2 through 6.

A semiconductor device according to some embodiments will hereinafter be described with reference to FIGS. 34 and 35, focusing mainly on the differences with the semiconductor device of FIGS. 2 through 6.

Figure 34:
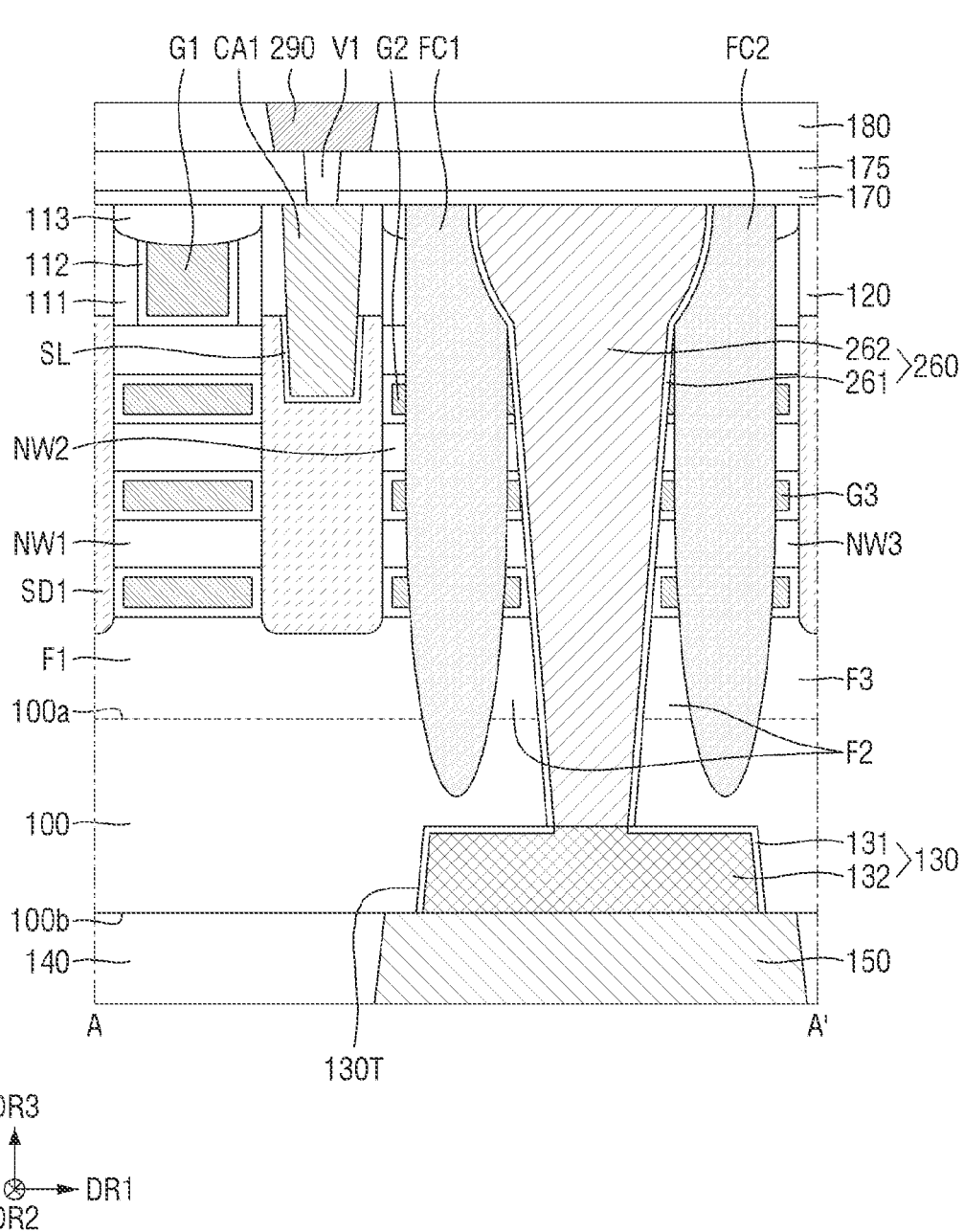
FIGS. 34 and 35 are cross-sectional views of a semiconductor device according to some embodiments.
Figure 35:
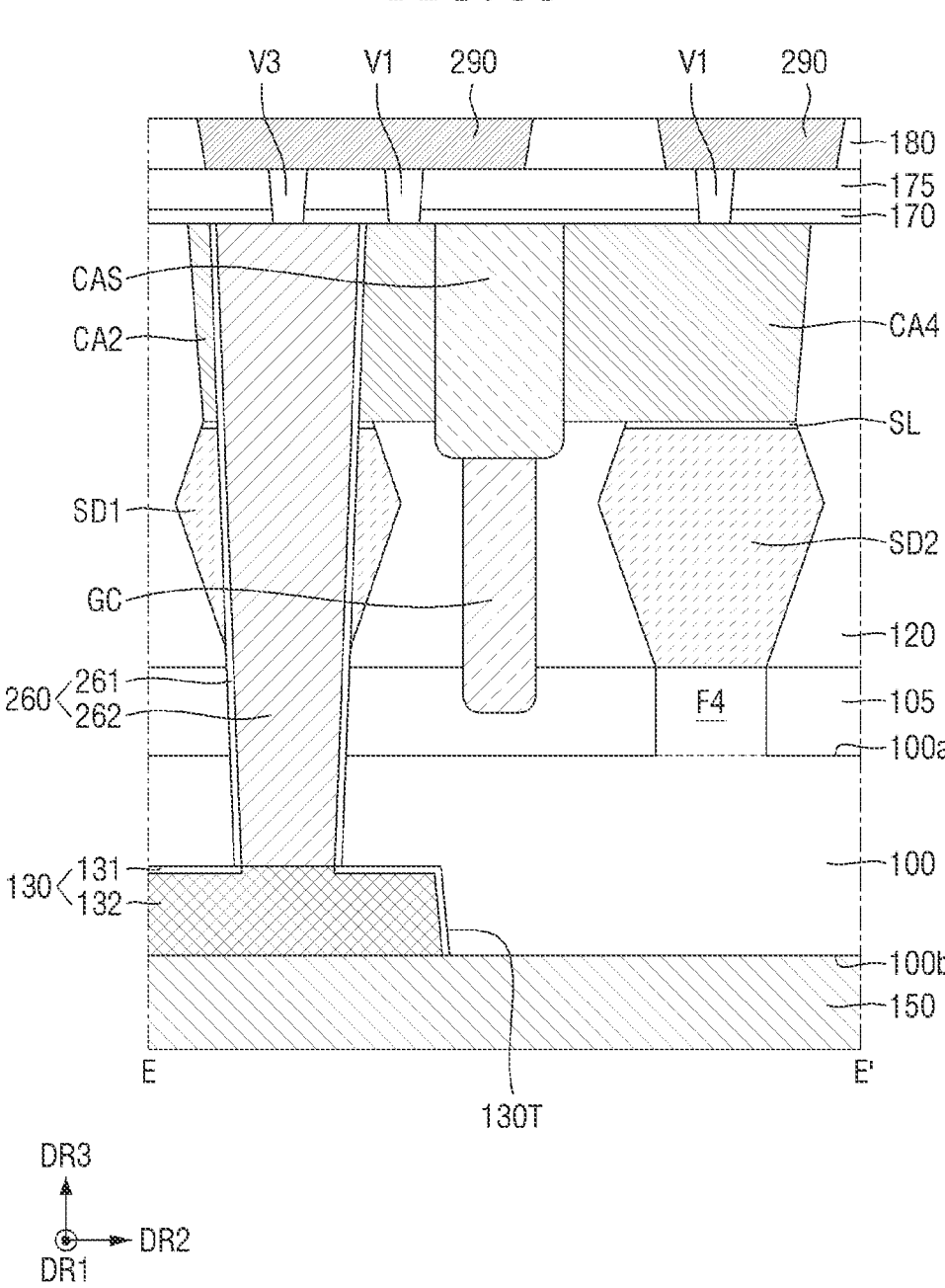

FIGS. 34 and 35 are cross-sectional views of a semiconductor device according to some embodiments.

Referring to FIGS. 34 and 35, a first through via 260 may include a through via insulating layer 261 and a through via filling layer 262.

The through via insulating layer 261 may form the sidewalls of the first through via 260. The through via insulating layer 261 may include, for example, at least one of SiN, SiO$_2$, SiON, SiOC, and SiOCN, but the present disclosure is not limited thereto.

The through via filling layer 262 may be disposed on the through via insulating layer 261. The through via filling layer 262 may fill the inside of the first through via 260, on the through via insulating layer 261. The through via filling layer 262 may include, for example, at least one of Mo, Cu, C, Ag, Co, Ta, In, Sn, Zn, Mn, Ti, Cr, Ge, Sr, Pt, Mg, Al, Zr, W, Ru, Ir, and Rh, but the present disclosure is not limited thereto.

A third upper via V3 may penetrate a second upper interlayer insulating layer 175 and an etching stop layer 170 in a vertical direction DR3, and may be connected to the first through via 260. For example, the third upper via V3 may be connected to the through via filling layer 262. FIG. 35 illustrates that the third upper via V3 is formed as a single film, but the present disclosure is not limited thereto. Alternatively, the third upper via V3 may be formed as a multifilm. The third upper via V3 may include a conductive material. For example, an upper wiring layer 290 may be connected to a first upper via V1 and the third upper via V3, which are disposed on a second source/drain contact CA2.

A semiconductor device according to some embodiments will hereinafter be described with reference to FIG. 36, focusing mainly on the differences with the semiconductor device of FIGS. 2 through 6.

Figure 36:
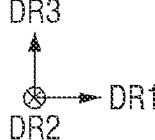
FIG. 36 is a cross-sectional view of a semiconductor device according to some embodiments.

FIG. 36 is a cross-sectional view of a semiconductor device according to some embodiments.

Referring to FIG. 36, a lower via 330 may be in contact with first and second active cuts FC1 and FC2.

For example, the first and second active cuts FC1 and FC2 may be exposed by a lower via trench 330T. The lower via 330 may be disposed in the lower via trench 330T. The lower via 330 may include a lower via insulating layer 331 and a lower via filling layer 332. The lower via insulating layer 331 may be disposed along the sidewalls and the top surface of the lower via trench 330T. However, the lower via insulating layer 331 may not be disposed in a region where the lower via 330 is in contact with a first through via 360. The lower via filling layer 332 may fill the lower via trench 330T, on the lower via insulating layer 331. The lower via filling layer 332 may be in contact with the first through via 360.

A semiconductor device according to some embodiments will hereinafter be described with reference to FIG. 37, focusing mainly on the differences with the semiconductor device of FIGS. 2 through 6.

Figure 37:
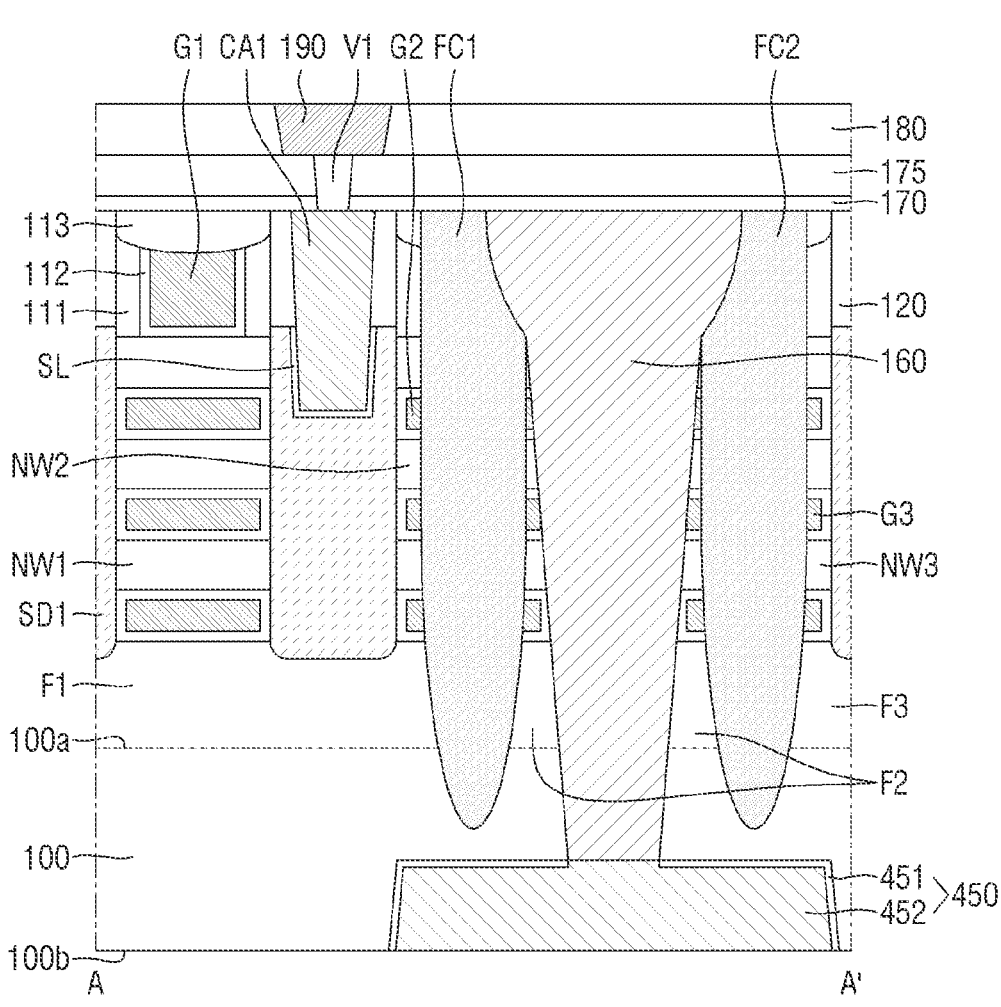
FIG. 37 is a cross-sectional view of a semiconductor device according to some embodiments.
Figure 37:
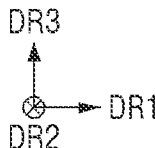

FIG. 37 is a cross-sectional view of a semiconductor device according to some embodiments.

Referring to FIG. 37, a lower wiring layer 450 may be disposed in a substrate 100.

For example, the lower wiring layer 450 may be connected to a first through via 160. That is, the lower wiring layer 450 may be in contact with the first through via 160. For example, the bottom surface of the lower wiring layer 450 may be formed on the same plane as a second surface 100b of the substrate 100. For example, the lower wiring layer 450 may be spaced apart from first and second active cuts FC1 and FC2 in a vertical direction DR3.

The lower wiring layer 450 may include a lower wiring insulating layer 451 and a lower wiring filling layer 452. The lower wiring insulating layer 451 may form the sidewalls and the top surface of the lower wiring layer 450. The lower wiring insulating layer 451 may not be disposed in a region where the lower wiring layer 450 is in contact with the first through via 160. The lower wiring insulating layer 451 may include, for example, at least one of SiN, SiO$_2$, SiON, SiOC, and SiOCN, but the present disclosure is not limited thereto.

The lower wiring filling layer 452 may fill the inside of the lower wiring layer 450, on the lower wiring insulating layer 451. The lower wiring filling layer 452 may be in contact with the first through via 160. The lower wiring filling layer 452 may include, for example, at least one of Mo, Cu, C, Ag, Co, Ta, In, Sn, Zn, Mn, Ti, Cr, Ge, Sr, Pt, Mg, Al, Zr, W, Ru, Ir, and Rh, but the present disclosure is not limited thereto.

A semiconductor device according to some embodiments will hereinafter be described with reference to FIG. 38, focusing mainly on the differences with the semiconductor device of FIGS. 2 through 6.

Figure 38:
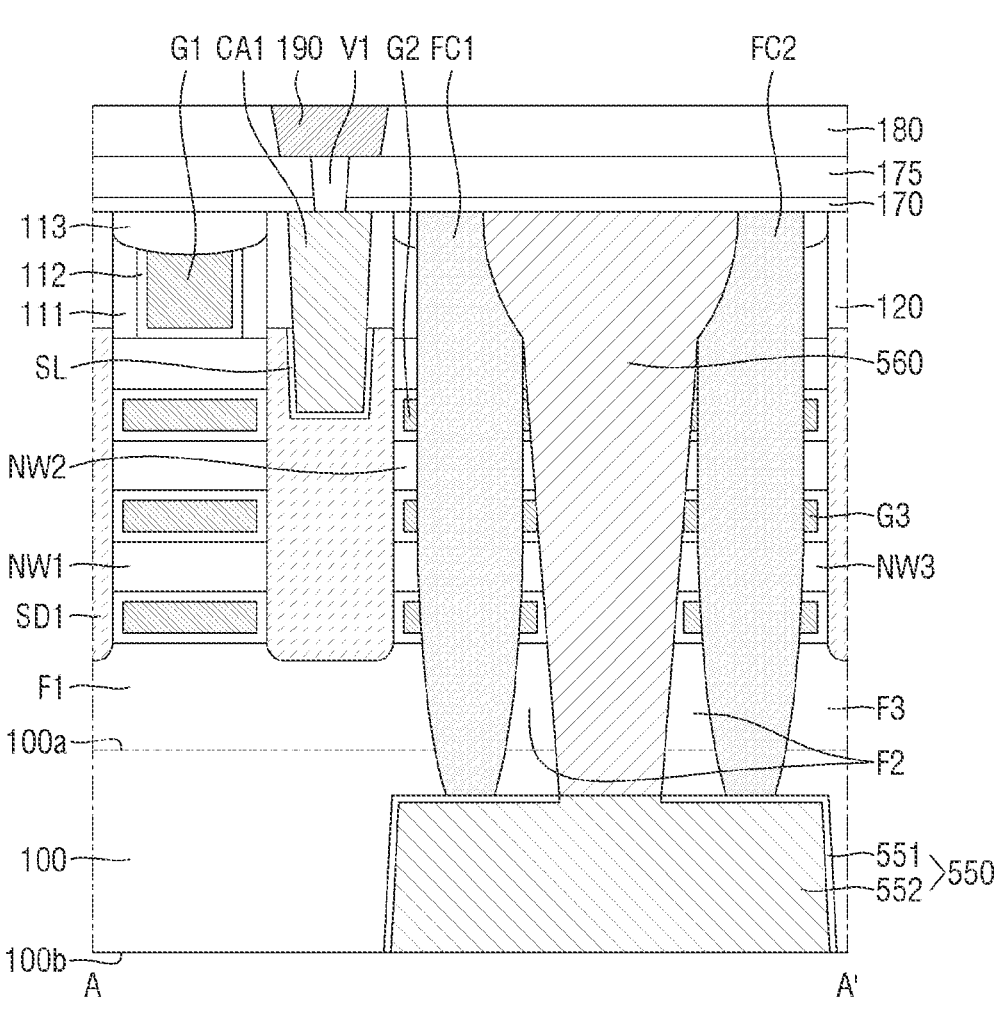
FIG. 38 is a cross-sectional view of a semiconductor device according to some embodiments.
Figure 38:
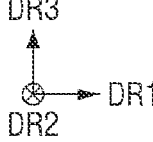

FIG. 38 is a cross-sectional view of a semiconductor device according to some embodiments.

Referring to FIG. 38, a lower wiring layer 550 may be disposed in a substrate 100.

For example, the lower wiring layer 550 may be connected to a first through via 560. That is, the lower wiring layer 550 may be in contact with the first through via 560. For example, the bottom surface of the lower wiring layer 550 may be formed on the same plane as a second surface 100b of the substrate 100. For example, the lower wiring layer 550 may be in contact with first and second active cuts FC1 and FC2.

The lower wiring layer 550 may include a lower wiring insulating layer 551 and a lower wiring filling layer 552. The lower wiring insulating layer 551 may form the sidewalls and the top surface of the lower wiring layer 550. The lower wiring insulating layer 551 may not be disposed in a region where the lower wiring layer 550 is in contact with the first through via 560. The lower wiring filling layer 552 may fill the inside of the lower wiring layer 550, on the lower wiring insulating layer 551. The lower wiring filling layer 552 may be in contact with the first through via 560.

A semiconductor device according to some embodiments will hereinafter be described with reference to FIG. 39, focusing mainly on the differences with the semiconductor device of FIGS. 2 through 6.

Figure 39:
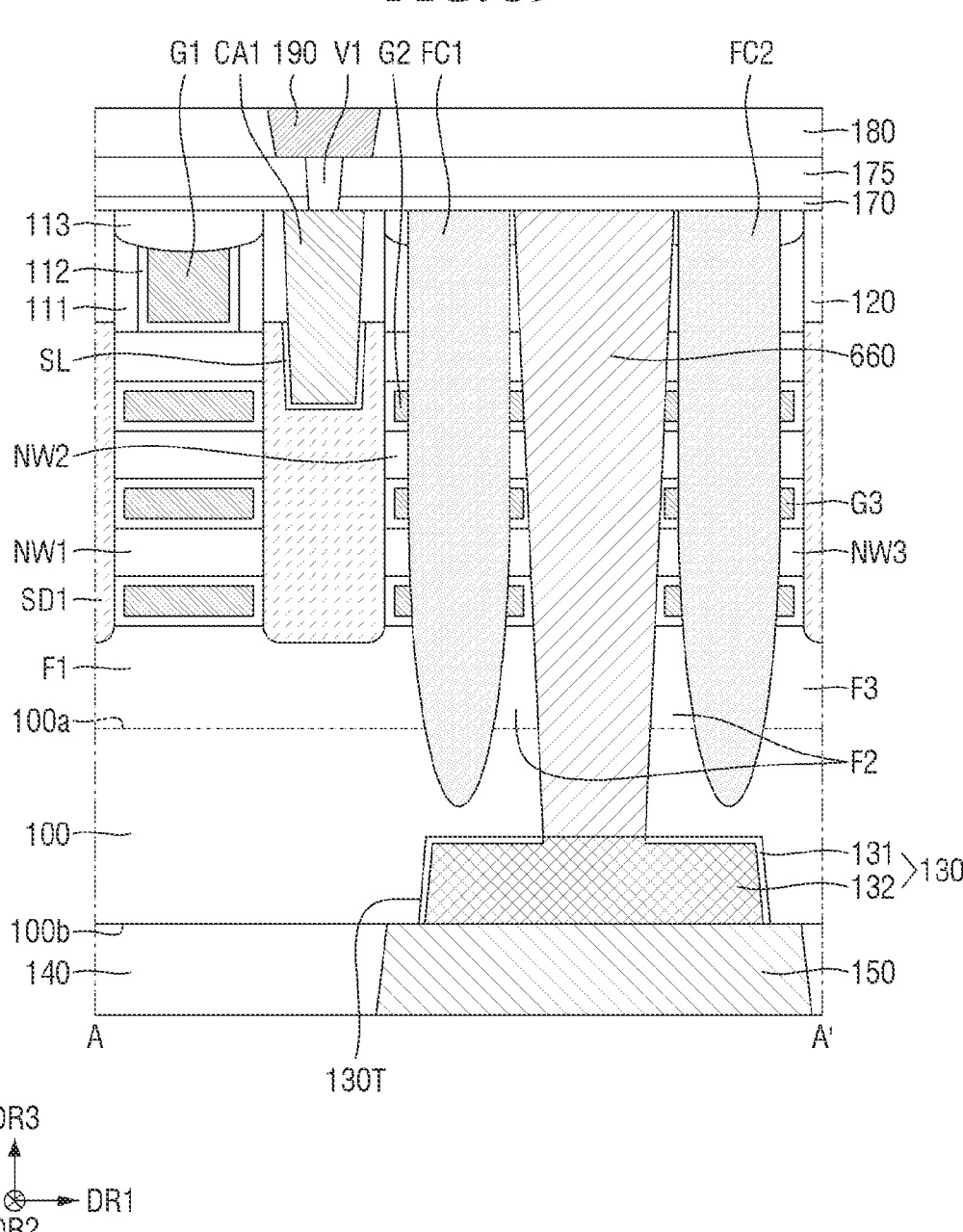
FIG. 39 is a cross-sectional view of a semiconductor device according to some embodiments.

FIG. 39 is a cross-sectional view of a semiconductor device according to some embodiments.

Referring to FIG. 39, a first through via 660 may be spaced apart from first and second active cuts FC1 and FC2 in a first horizontal direction DR1.

A semiconductor device according to some embodiments will hereinafter be described with reference to FIG. 40, focusing mainly on the differences with the semiconductor device of FIGS. 2 through 6.

Figure 40:
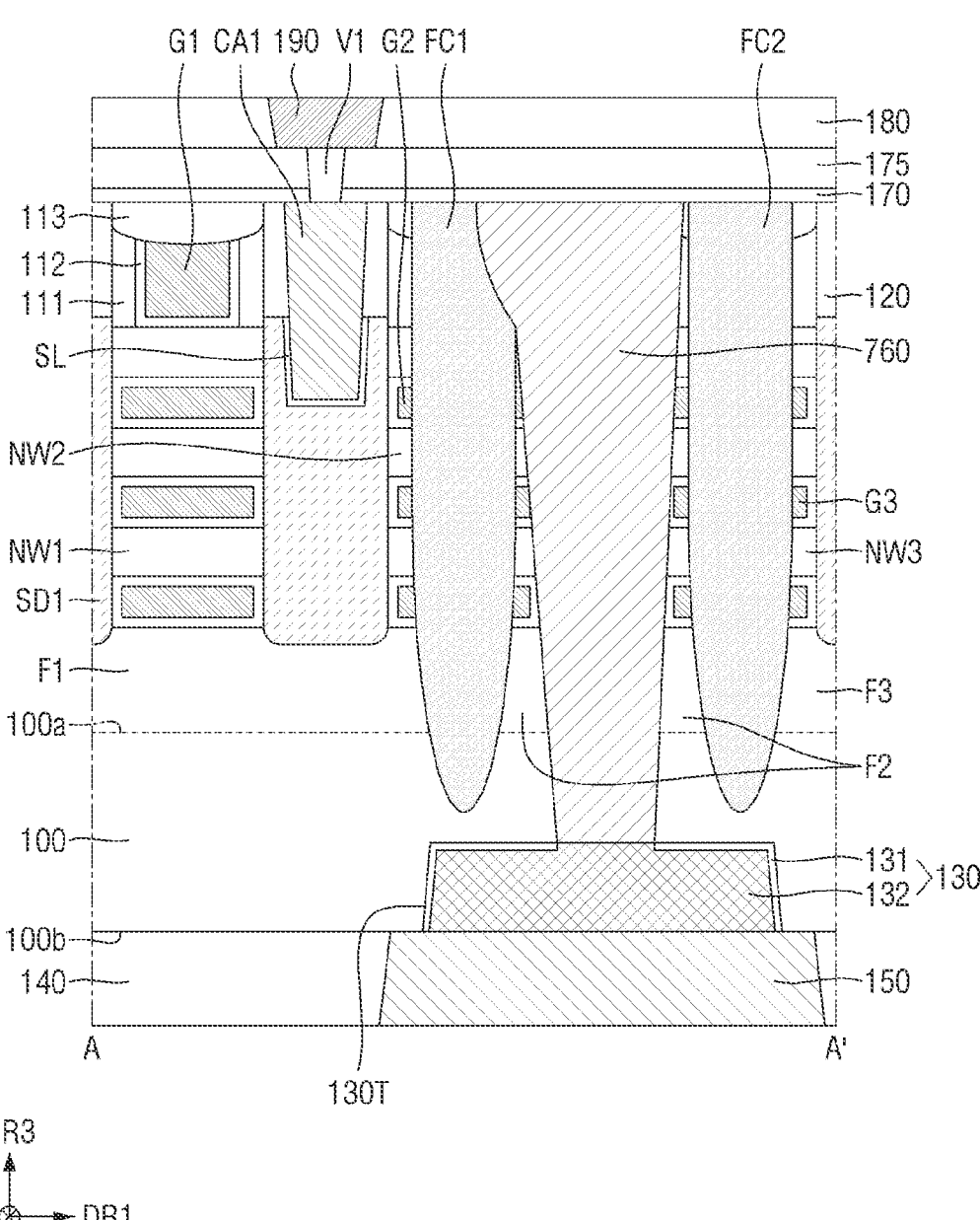
FIG. 40 is a cross-sectional view of a semiconductor device according to some embodiments.

FIG. 40 is a cross-sectional view of a semiconductor device according to some embodiments.

Referring to FIG. 40, an upper part of a first through via 760 may be in contact with a first active cut FC1. A second active cut FC2 may be spaced apart from the first through via 760 in a first horizontal direction DR1.

A semiconductor device according to some embodiments will hereinafter be described with reference to FIGS. 41 and 42, focusing mainly on the differences with the semiconductor device of FIGS. 2 through 6.

Figure 41:
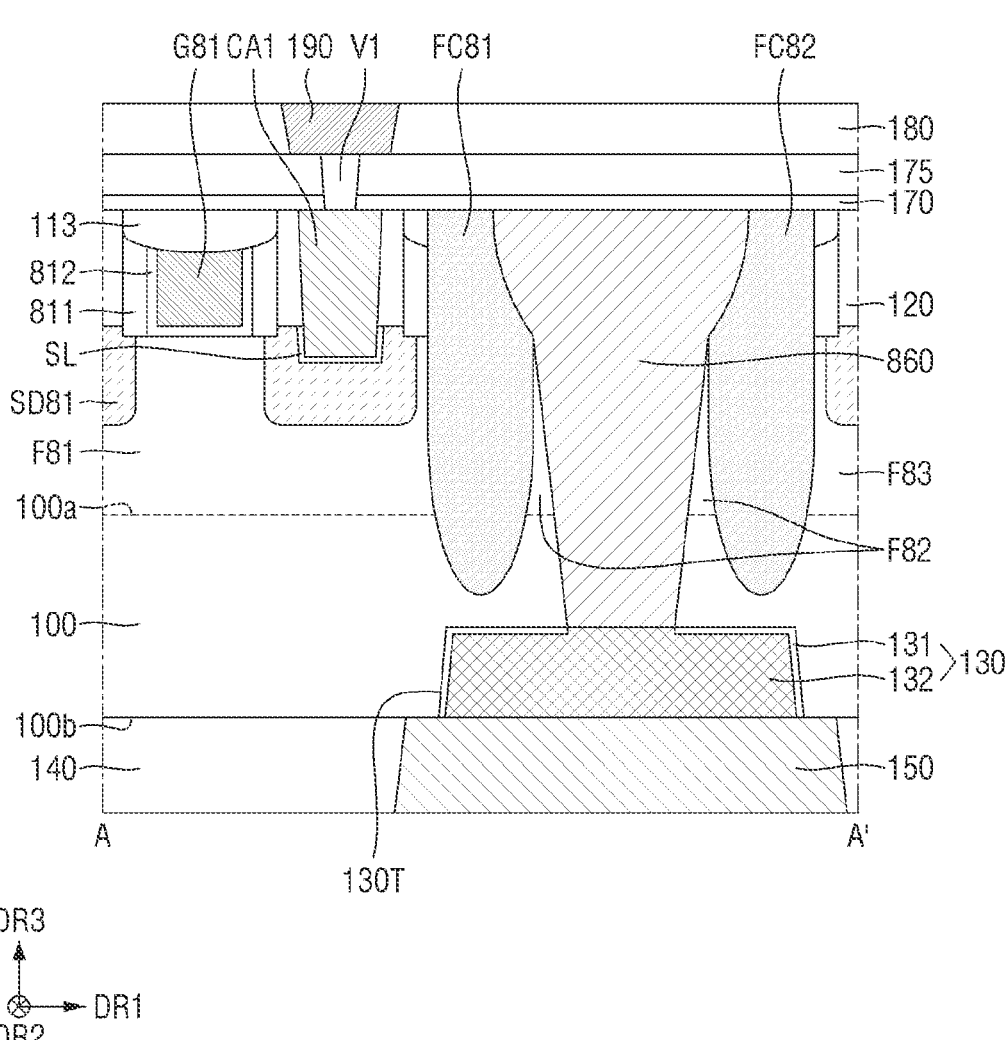
FIGS. 41 and 42 are cross-sectional views of a semiconductor device according to some embodiments.
Figure 42:
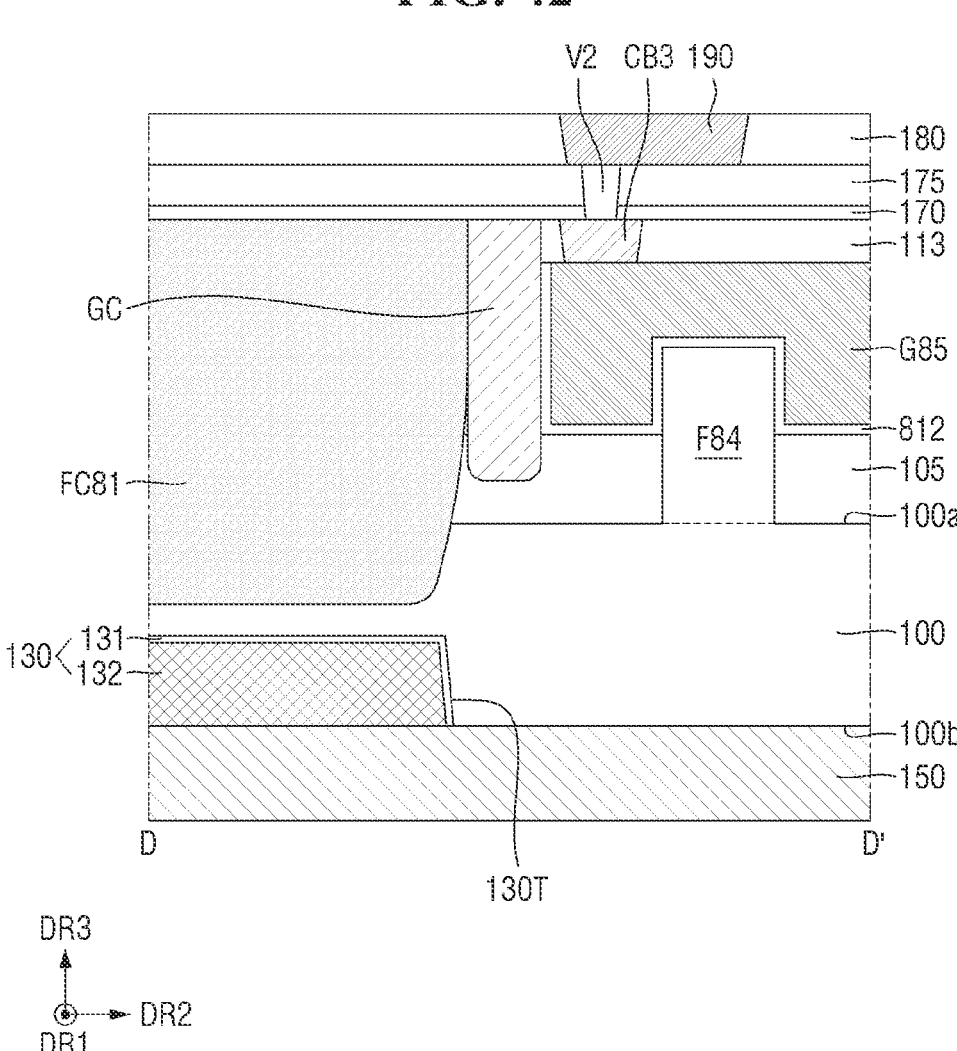

FIGS. 41 and 42 are cross-sectional views of a semiconductor device according to some embodiments.

Referring to FIGS. 41 and 42, the semiconductor device may include a FinFET. For example, the semiconductor device may include a substrate 100, first through fourth active patterns F81 through F84, a field insulating layer 105, first and fifth gate electrodes G81 and G85, gate spacers 811, a gate insulating layer 812, a capping pattern 113, a first source/drain region SD81, a first upper interlayer insulating layer 120, first and second active cuts FC81 and FC82, a gate cut GC, a lower via 130, a lower interlayer insulating layer 140, a lower wiring layer 150, a first through via 860, a first source/drain contact CA1, a silicide layer SL, a third gate contact CB3, an etching stop layer 170, a second upper interlayer insulating layer 175, first and second upper vias V1 and V2, a third upper interlayer insulating layer 180, and an upper wiring layer 190. Descriptions of elements or features that have already been described with reference to FIGS. 1 through 6 will be omitted.

The first through fourth active patterns F81 through F84 may extend in a first horizontal direction DR1 on a first surface 100a of the substrate 100. For example, the second active pattern F82 may be spaced apart from the first active pattern F81 in the first horizontal direction DR1, the third active pattern F83 may be spaced apart from the second active pattern F82 in the first horizontal direction DR1, and the fourth active pattern F84 may be spaced apart from the first through third active patterns F81 through F83 in a second horizontal direction DR2. The first through fourth active patterns F81 through F84 may protrude from the first surface 100a of the substrate 100 in a vertical direction DR3.

The first gate electrode G81 may extend in the second horizontal direction DR2 on the first active pattern F81 and the field insulating layer 105. The first active cut FC81 may extend in the first horizontal direction DR1 together with the first gate electrode G81. The second active cut FC82 may extend in the first horizontal direction DR1 together with the first active cut FC81. The first and second active cuts FC81 and FC82 may extend in the second horizontal direction DR2. The fifth gate electrode G85 may extend in the second horizontal direction DR2 on the fourth active pattern F84 and the field insulating layer 105. The fifth gate electrode G85 may be spaced apart from the first active cut FC81 in the second horizontal direction DR2.

The gate spacers 811 may extend in the second horizontal direction DR2 along both sidewalls, in the first horizontal direction DR1, of each of the first and fifth gate electrodes G81 and G85. The gate insulating layer 812 may be disposed between the field insulating layer 105 and the first and fifth gate electrodes G81 and G85. The gate insulating layer 812 may be disposed between the first gate electrode G81 and the first active pattern F81. The gate insulating layer 812 may be disposed between the fifth gate electrode G85 and the fourth active pattern F84. The gate insulating layer 812 may be disposed between the gate spacers 811 and the first and fifth gate electrodes G81 and G85.

The first source/drain region SD81 may be disposed on both sides of the first gate electrode G81, on the first active pattern F81. The first through via 860 may be disposed between the first and second active cuts FC81 and FC82. An upper part of the first through via 860 may be in contact with the first and second active cuts FC81 and FC82. The first through via 860 may penetrate the second active pattern F82 in the vertical direction DR3 and may extend into the substrate 100. The first through via 860 may be connected to the lower via 130.

A semiconductor device according to some embodiments will hereinafter be described with reference to FIGS. 43 and 44, focusing mainly on the differences with the semiconductor device of FIGS. 1 through 6.

Figure 43:
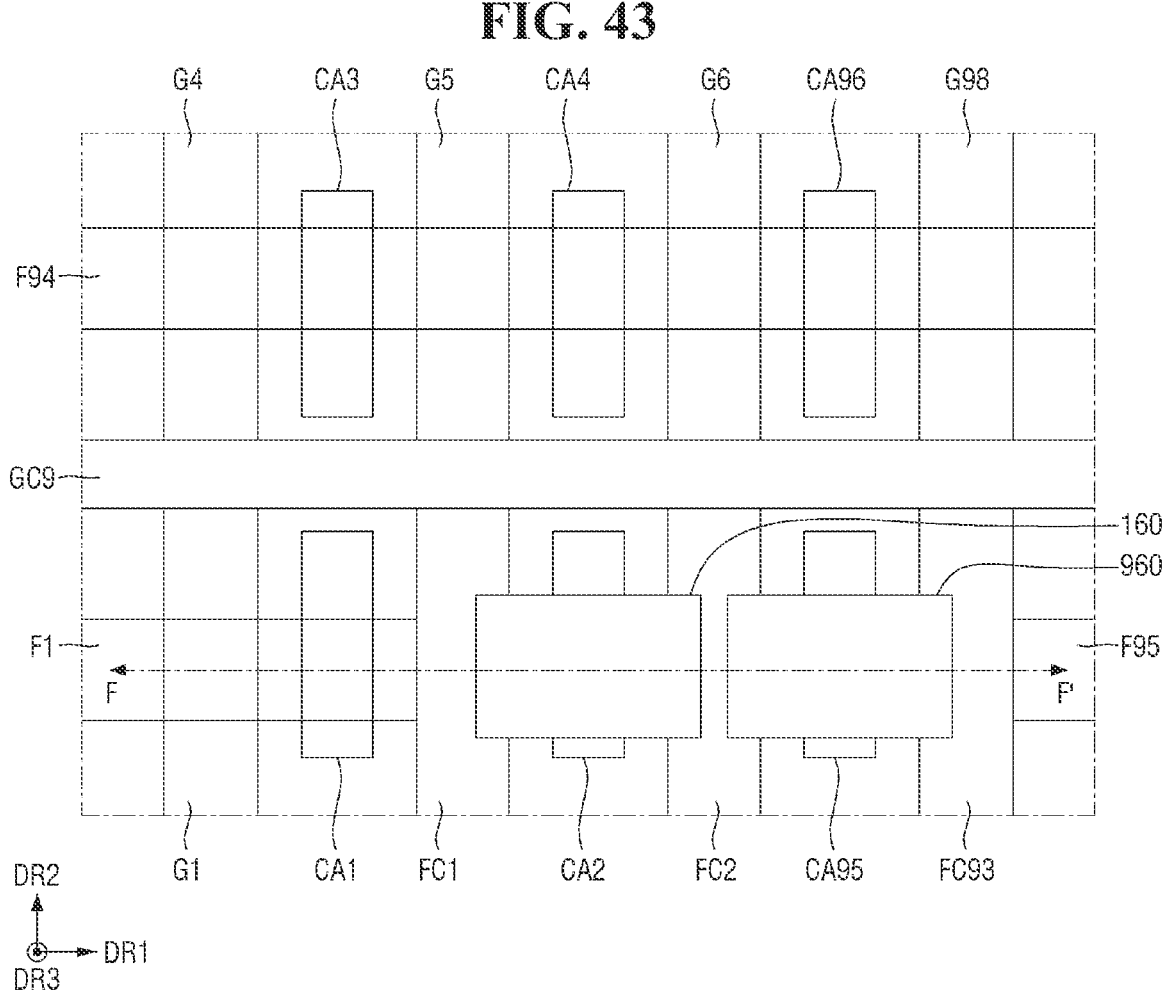
FIG. 43 is a layout view of a semiconductor device according to some embodiments.

FIG. 43 is a layout view of a semiconductor device according to some embodiments. FIG. 44 is a cross-sectional view taken along line F-F' of FIG. 43.

Figure 44:
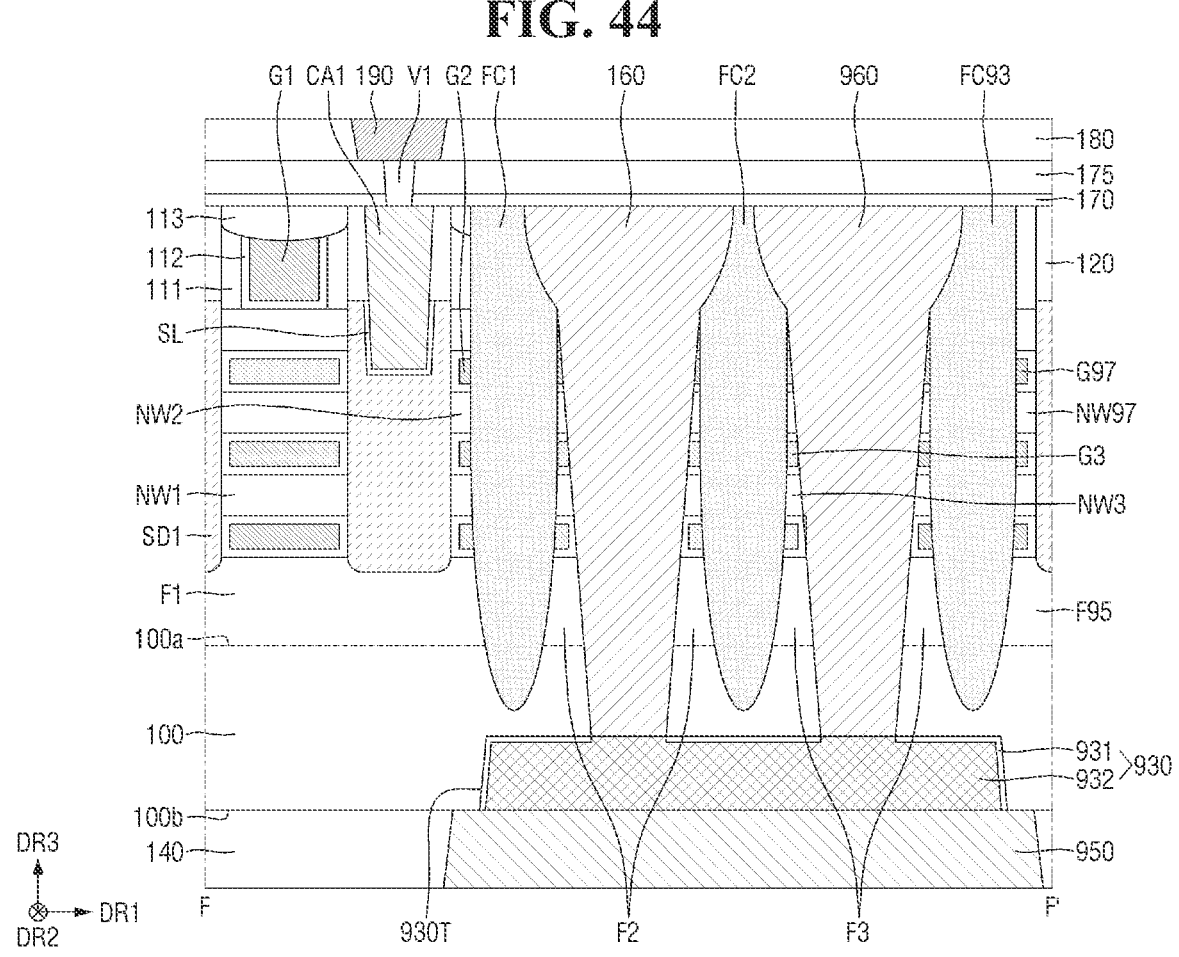
FIG. 44 is a cross-sectional view taken along line F-F' of FIG. 43.

Referring to FIGS. 43 and 44, the semiconductor device may include a fifth active pattern F95, a seventh plurality of nanosheets NW97, a seventh gate electrode G97, an eighth gate electrode G98, a third active cut FC93, a fifth source/drain contact CA95, and a sixth source/drain contact CA96.

The fifth active pattern F95 may extend in a first horizontal direction DR1 on a first surface 100a of a substrate 100. The fifth active pattern F95 may be spaced apart from a third active pattern F3 in the first horizontal direction DR1. The seventh plurality of nanosheets NW97 may be disposed on the fifth active pattern F95. The seventh plurality of nanosheets NW97 may be disposed at the intersection between the seventh gate electrode G97 and each of the third and fifth active patterns F3 and F95. The seventh plurality of nanosheets NW97 may be stacked to be spaced apart from one another in a vertical direction DR3. The seventh gate electrode G97 may extend in a second horizontal direction DR2 on the third and fifth active patterns F3 and F95. The eighth gate electrode G98 may extend in the second horizontal direction DR2 on a fourth active pattern F94. The eighth gate electrode G98 may be spaced apart from the seventh gate electrode G97 in the second horizontal direction DR2. A gate cut GC may separate the seventh and eighth gate electrodes G97 and G98.

The third active cut FC93 may extend in the second horizontal direction DR2. The third active cut FC93 may be spaced apart from a second active cut FC2 in the first horizontal direction DR1. The eighth gate electrode G98 may be spaced apart from the third active cut FC93 in the second horizontal direction DR2. The third active cut FC93 may penetrate a capping pattern 113, the seventh gate electrode G97, and the seventh plurality of nanosheets NW97 in the vertical direction DR3. The third active cut FC93 may extend into the substrate 100. The third active cut FC93 may separate the third and fifth active patterns F3 and F95. The fifth source/drain contact CA95 may extend in the second horizontal direction DR2 between the second and third active cuts FC2 and FC93. The sixth source/drain contact CA96 may extend in the second horizontal direction DR2 between a sixth gate electrode G6 and the eighth gate electrode G98.

A second through via 960 may be disposed between the second and third active cuts FC2 and FC93. The second through via 960 may penetrate the fifth source/drain contact CA95, a first source/drain region SD1, and the third active pattern F3 in the vertical direction DR3. The second through via 960 may extend into the substrate 100. An upper part of the second through via 960 may be in contact with the second and third active cuts FC2 and FC93. For example, the second through via 960 may be in contact with a third plurality of nanosheets NW3 and the seventh plurality of nanosheets NW97. For example, the upper part of the second through via 960 may overlap with the second and third active cuts FC2 and FC93 in the vertical direction DR3. The top surface of the second through via 960 may be formed on the same plane as the top surfaces of the second and third active cuts FC2 and FC3. The top surface of the second through via 960 may be formed on the same plane as the top surface of a first upper interlayer insulating layer 120.

A lower via trench 930T may be disposed in the substrate 100. The lower via trench 930T may be recessed from a second surface 100b of the substrate 100 toward the inside of the substrate 100. A lower via 930 may be disposed in the lower via trench 930T. The lower via 930 may be connected to a first through via 160 and the second through via 960. For example, the lower via 930 may overlap with the second and third active cuts FC2 and FC93 in the vertical direction DR3. For example, the lower via 930 may be spaced apart from the second and third active cuts FC2 and FC93 in the vertical direction DR3.

The lower via 930 may include a lower via insulating layer 931 and a lower via filling layer 932. The lower via insulating layer 931 may be disposed along the sidewalls and the top surface of the lower via trench 930T. The lower via insulating layer 931 may not be disposed in regions where the lower via 930 is in contact with the first and second through vias 160 and 960. The lower via filling layer 932 may fill the lower via trench 930T, on the lower via insulating layer 931. The lower via filling layer 932 may be in contact with the first and second through vias 160 and 960. A lower wiring layer 950 may be disposed on the second surface 100b of the substrate 100. The lower wiring layer 950 may be disposed in a lower interlayer insulating layer 140. The lower wiring layer 950 may extend in the second horizontal direction DR2. The lower wiring layer 950 may be connected to the lower via 930.

A semiconductor device according to some embodiments will hereinafter be described with reference to FIGS. 45 and 46, focusing mainly on the differences with the semiconductor device of FIGS. 1 through 6.

Figure 45:
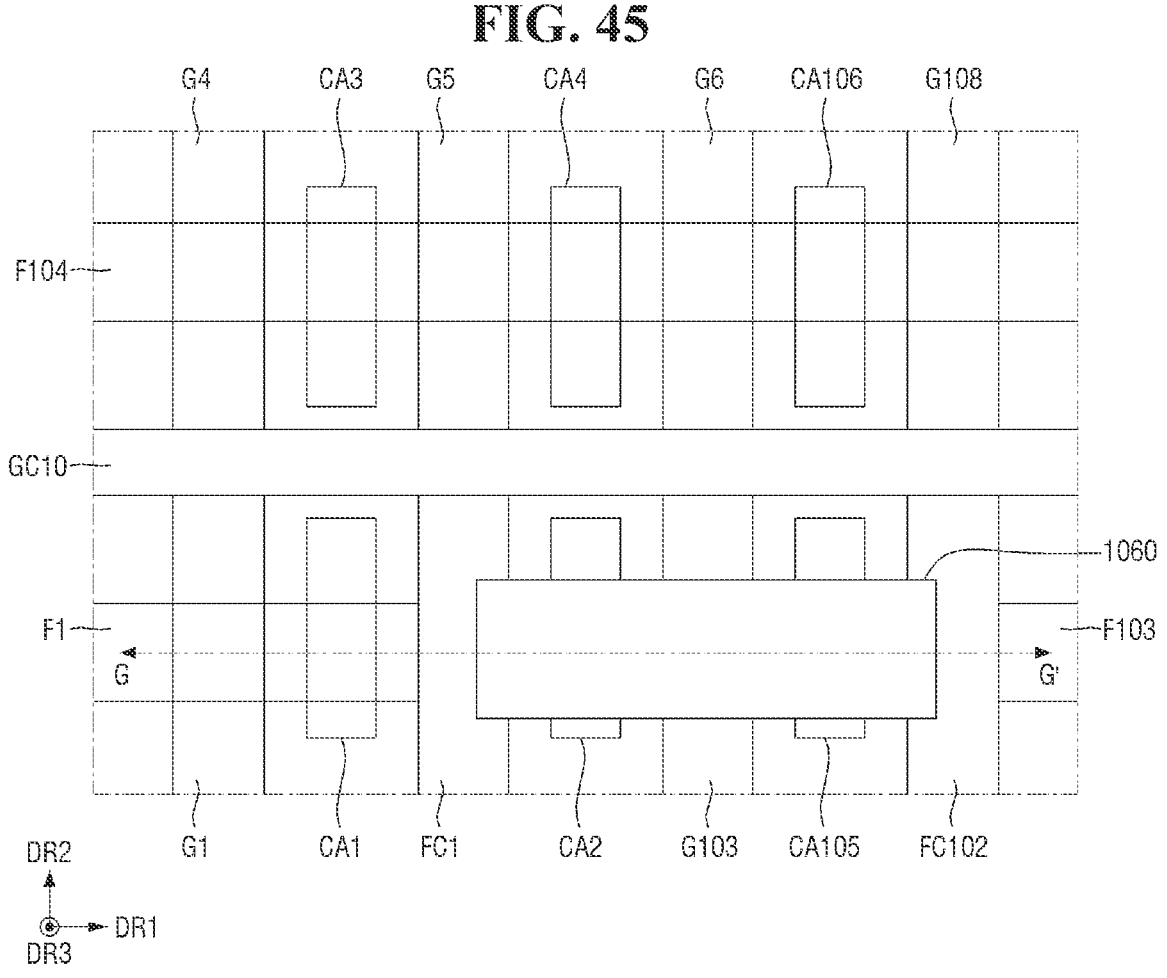
FIG. 45 is a layout view of a semiconductor device according to some embodiments.

FIG. 45 is a layout view of a semiconductor device according to some embodiments. FIG. 46 is a cross-sectional view taken along line G-G' of FIG. 45.

Figure 46:
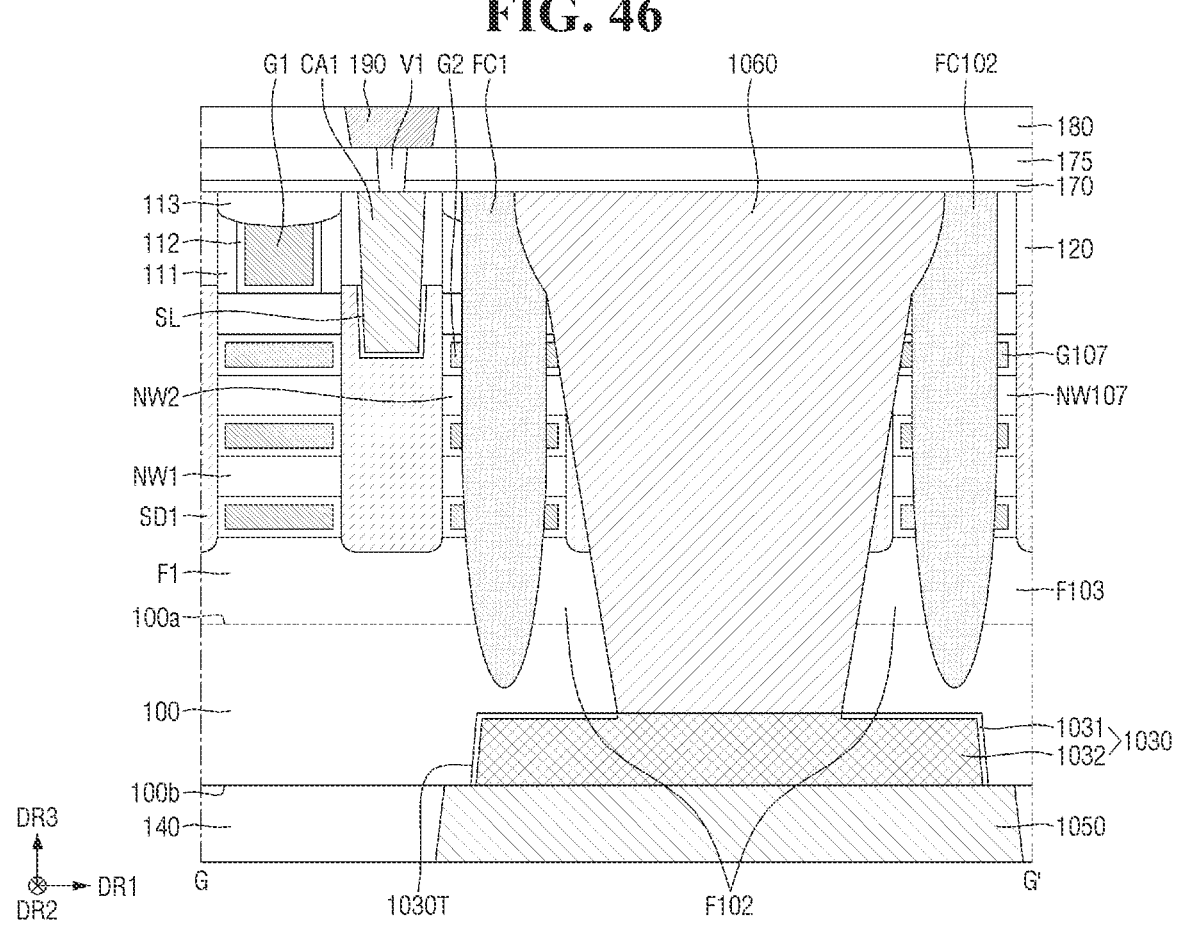
FIG. 46 is a cross-sectional view taken along line G-G' of FIG. 45.

Referring to FIGS. 45 and 46, the semiconductor device may include a seventh plurality of nanosheets NW107, a seventh gate electrode G107, an eighth gate electrode G108, a fifth source/drain contact CA105, and a sixth source/drain contact CA106.

The seventh plurality of nanosheets NW107 may be disposed on each of second and third active patterns F102 and F103. The seventh plurality of nanosheets NW107 may be disposed at the intersection between the seventh gate electrode G107 and each of the second and third active patterns F102 and F103. The seventh plurality of nanosheets NW107 may be stacked to be spaced apart from one another in a vertical direction DR3. A third gate electrode G103 may extend in a second horizontal direction DR2 on the second active pattern F102. The seventh gate electrode G107 may extend in the second horizontal direction DR2 on each of the second and third active patterns F102 and F103. The eighth gate electrode G108 may extend in a second horizontal direction DR2 on the fourth active pattern F104. The eighth gate electrode G108 may be spaced apart from the seventh gate electrode G107 in the second horizontal direction DR2. A gate cut GC10 may separate the seventh and eighth gate electrodes G107 and G108.

A second active cut FC102 may extend in the second horizontal direction DR2. The second active cut FC102 may be spaced apart from the third gate electrode G103 in the first horizontal direction DR1. The eighth gate electrode G108 may be spaced apart from the second active cut FC102 in the second horizontal direction DR2. The second active cut FC102 may penetrate a capping pattern 113, the seventh gate electrode G107, and the seventh plurality of nanosheets NW107 in the vertical direction DR3. The second active cut FC102 may extend into a substrate 100. The fifth source/drain contact CA105 may extend in the second horizontal direction DR2 between the third gate electrode G103 and the second active cut FC102. A sixth source/drain contact CA106 may extend in the second horizontal direction DR2 between a sixth gate electrode G6 and the eighth gate electrode G108.

A first through via 1060 may be disposed between the first and second active cuts FC1 and FC102. The first through via 1060 may penetrate a second source/drain contact CA2, the fifth source/drain contact CA105, the capping pattern 113, the third gate electrode G103, a first source/drain region SD1, and the second active pattern F102 in the vertical direction DR3. The first through via 1060 may extend into the substrate 100. An upper part of the first through via 1060 may be in contact with the first and second active cuts FC1 and FC102. For example, the first through via 1060 may be in contact with a second plurality of nanosheets NW2 and the seventh plurality of nanosheets NW107. For example, the upper part of the first through via 1060 may overlap with the first and second active cuts FC1 and FC102 in the vertical direction DR3.

A lower via trench 1030T may be disposed in the substrate 100. The lower via trench 1030T may be recessed from a second surface 100b of the substrate 100 toward the inside of the substrate 100. A lower via 1030 may be disposed in the lower via trench 1030T. The lower via 1030 may be connected to the first through via 1060. For example, the lower via 1030 may overlap with the first and second active cuts FC1 and FC102 in the vertical direction DR3. For example, the lower via 1030 may be spaced apart from the first and second active cuts FC1 and FC102 in the vertical direction DR3.

The lower via 1030 may include a lower via insulating layer 1031 and a lower via filling layer 1032. The lower via insulating layer 1031 may be disposed along the sidewalls and the top surface of the lower via trench 1030T. The lower via insulating layer 1031 may not be disposed in a region where the lower via 1030 is in contact with the first through via 1060. The lower via filling layer 1032 may fill the lower via trench 1030T, on the lower via insulating layer 1031. The lower via filling layer 1032 may be in contact with the first through via 1060. A lower wiring layer 1050 may be disposed on the second surface 100b of the substrate 100. The lower wiring layer 1050 may be disposed in a lower interlayer insulating layer 140. The lower wiring layer 1050 may extend in the second horizontal direction DR2. The lower wiring layer 1050 may be connected to the lower via 1030.

A semiconductor device according to some embodiments will hereinafter be described with reference to FIGS. 47 and 48, focusing mainly on the differences with the semiconductor device of FIGS. 1 through 6.

Figure 47:
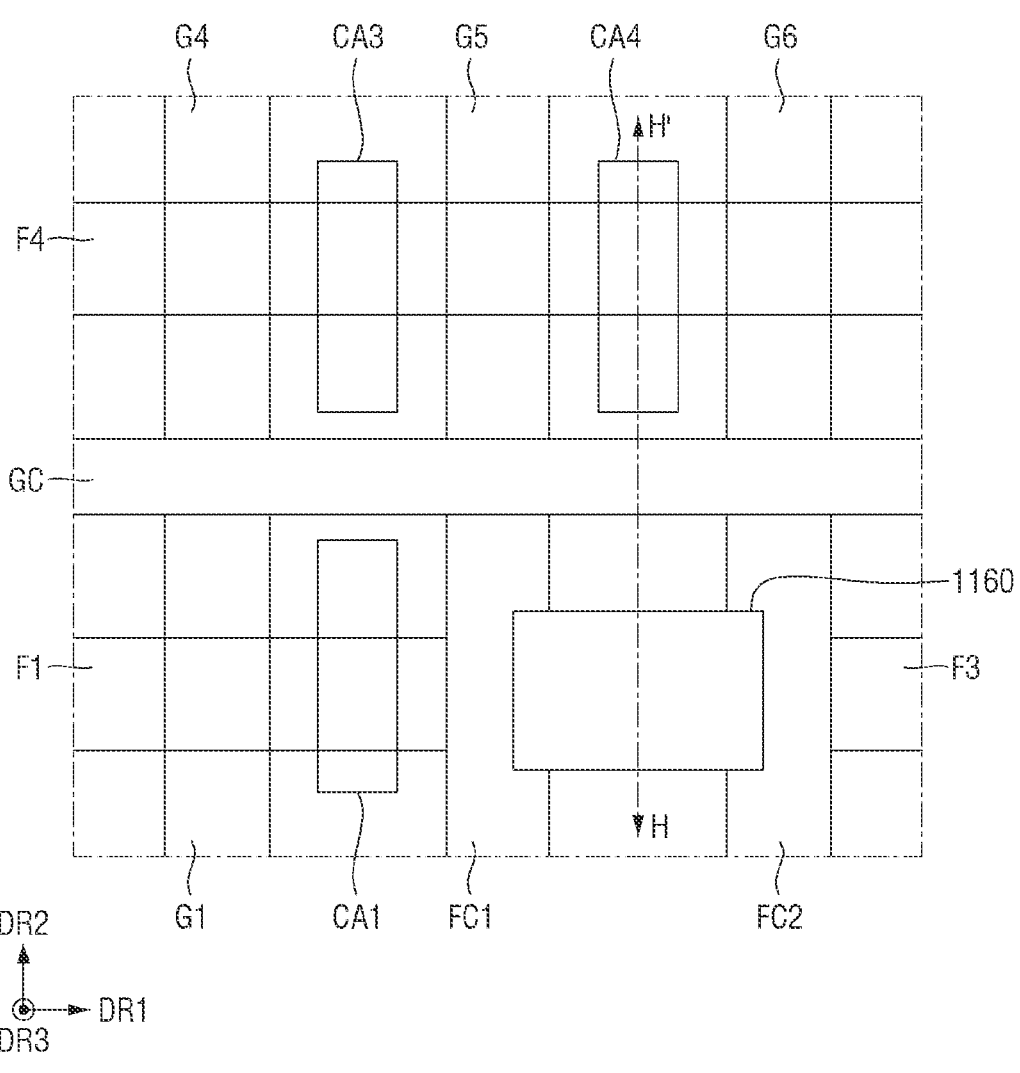
FIG. 47 is a layout view of a semiconductor device according to some embodiments.

FIG. 47 is a layout view of a semiconductor device according to some embodiments. FIG. 48 is a cross-sectional view taken along line H-H' of FIG. 4.

Figure 48:
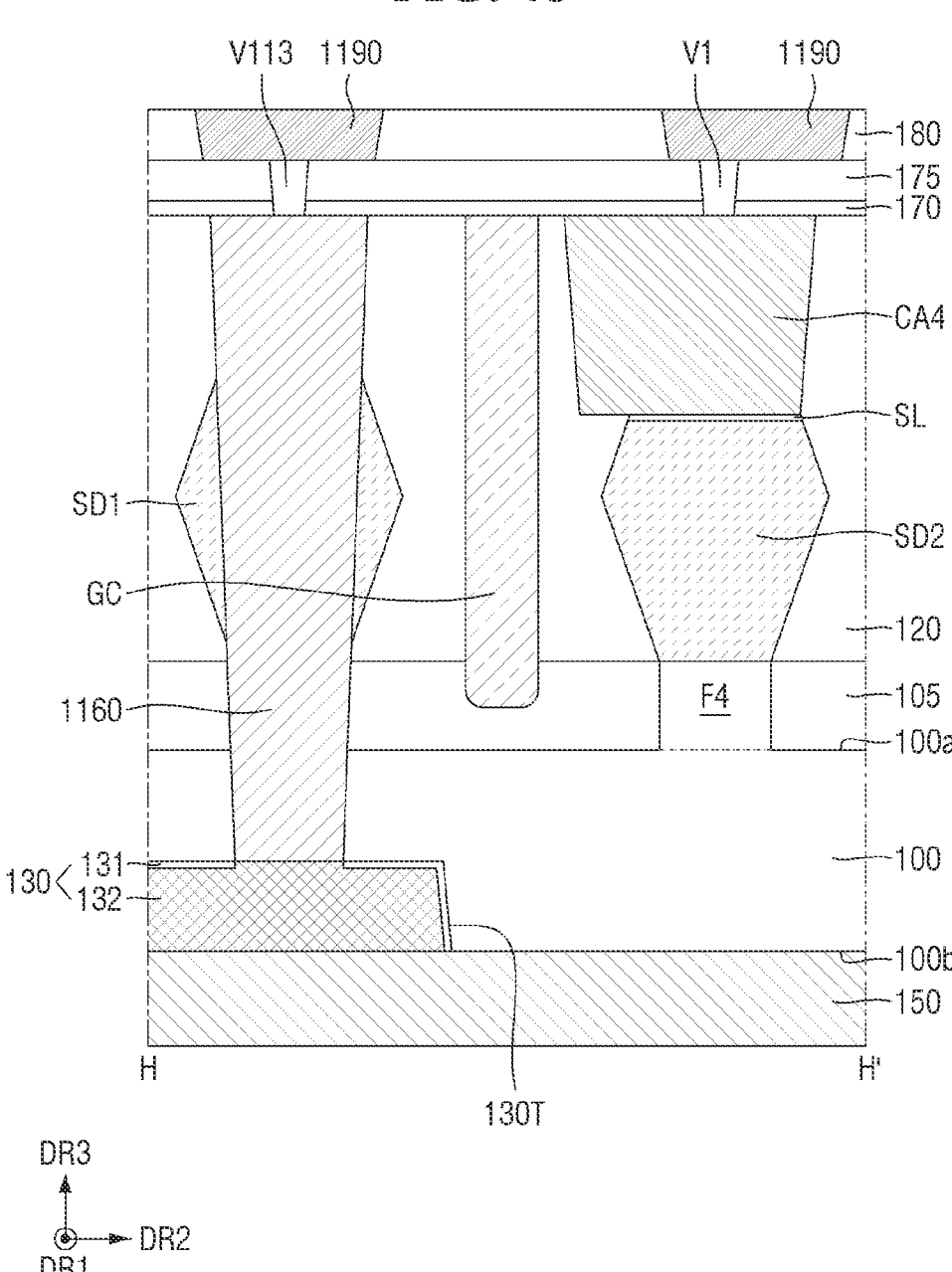
FIG. 48 is a cross-sectional view taken along line H-H' of FIG. 47.

Referring to FIGS. 47 and 48, a first through via 1160 does not penetrate a source/drain contact in a vertical direction DR3.

No source/drain contact may be disposed between first and second active cuts FC1 and FC2. The first through via 1160 may penetrate a first upper interlayer insulating layer 120, a first source/drain region SD1, and a second active pattern F2 in the vertical direction DR3. The first through via 1160 may extend into a substrate 100. The sidewalls of the first through via 1160 may be in contact with the first upper interlayer insulating layer 120, on the first source/drain region SD1.

No source/drain contact separation layer may be disposed on the top surface of a gate cut GC. For example, a fourth source/drain contact CA4 may be spaced apart from the gate cut GC in a second horizontal direction DR2. For example, the first upper interlayer insulating layer 120 may be disposed between the fourth source/drain contact CA4 and the gate cut GC.

A third upper via V113 may penetrate a second upper interlayer insulating layer 175 and an etching stop layer 170 in the vertical direction DR3, and may be connected to the first through via 1160. FIG. 48 illustrates that the third upper via V113 is formed as a single film, but the present disclosure is not limited thereto. Alternatively, the third upper via V113 may be formed as a multifilm. The third upper via V113 may include a conductive material. For example, an upper wiring layer 1190 may be connected to a first upper via V1 and the third via V113, which are disposed on the fourth source/drain contact CA4.

A semiconductor device according to some embodiments will hereinafter be described with reference to FIG. 49, focusing mainly on the differences with the semiconductor device of FIGS. 47 and 48.

Figure 49:
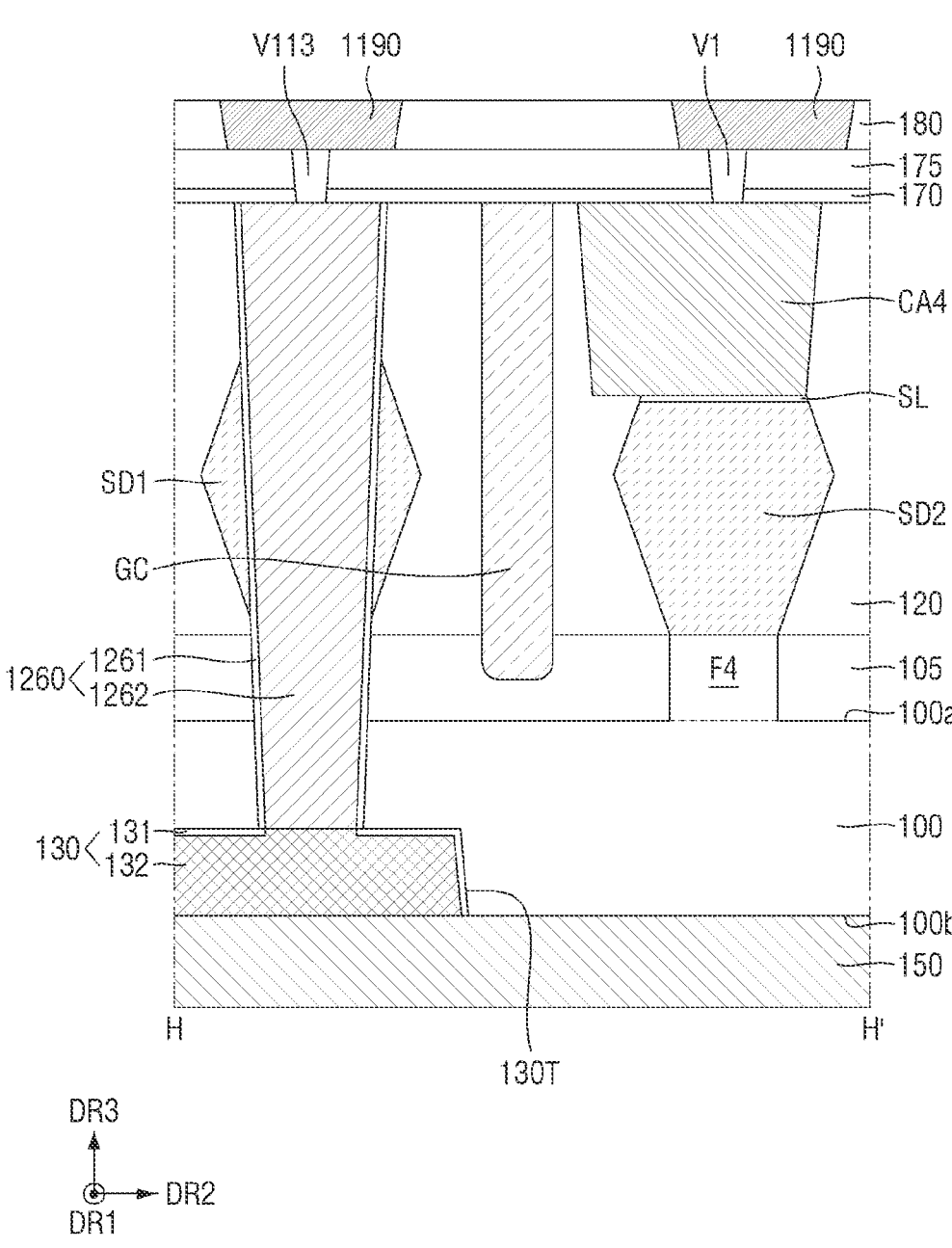
FIG. 49 is a cross-sectional view of a semiconductor device according to some embodiments.

FIG. 49 is a cross-sectional view of a semiconductor device according to some embodiments.

Referring to FIG. 49, a first through via 1260 may include a through via insulating layer 1261 and a through via filling layer 1262.

The through via insulating layer 1261 may form the sidewalls of the first through via 1260. The through via insulating layer 1261 may include, for example, at least one of SiN, $SiO_2$, SiON, SiOC, and SiOCN. The through via filling layer 1262 may be disposed on the through via insulating layer 1261. The through via filling layer 1262 may fill the inside of the first through via 1260, on the through via insulating layer 1261. The through via filling layer 1262 may include, for example, at least one of Mo, Cu, C, Ag, Co, Ta, In, Sn, Zn, Mn, Ti, Cr, Ge, Sr, Pt, Mg, Al, Zr, W, Ru, Ir, and Rh. A third upper via V113 may penetrate a second upper interlayer insulating layer 175 and an etching stop layer 170 in a vertical direction DR3, and may be connected to the first through via 1260. For example, the third upper via V113 may be connected to the through via filling layer 1262.

While aspects of embodiments have been particularly shown and described, it will be understood that various changes in form and details may be made therein without departing from the spirit and scope of the following claims.

What is claimed is:

1. A semiconductor device comprising:
a substrate comprising a first surface and a second surface opposite to the first surface;
first through third active patterns extending in a first horizontal direction on the first surface of the substrate, wherein the first through third active patterns are spaced apart from one another in the first horizontal direction;
a first gate electrode extending in a second horizontal direction different from the first horizontal direction on the first active pattern;
a first active cut between the first active pattern and the second active pattern, wherein the first active cut extends in the second horizontal direction, and the first active cut is spaced apart from the first gate electrode in the first horizontal direction;
a second active cut between the second active pattern and the third active pattern, wherein the second active cut extends in the second horizontal direction, and the second active cut is spaced apart from the first active cut in the first horizontal direction;
a first through via extending through the second active pattern in a vertical direction between the first active cut and the second active cut, and into the substrate; and
a lower wiring layer on the second surface of the substrate and connected to the first through via,
wherein a top surface of the first active cut, a top surface of the second active cut, and a top surface of the first through via are provided on a common plane.

2. The semiconductor device of claim 1, further comprising:
a source/drain region on at least one side of the first gate electrode on the first active pattern; and
an upper interlayer insulating layer covering the source/drain region,
wherein a top surface of the first through via and a top surface of the upper interlayer insulating layer are provided on a common plane.

3. The semiconductor device of claim 1, further comprising:
a lower via in the substrate and connected to the first through via,
wherein the lower wiring layer on the second surface of the substrate is connected to the first through via by the lower via.

4. The semiconductor device of claim 3, wherein the lower via comprises:
a lower via insulating layer provided along a boundary surface between the substrate and the lower via, and
a lower via filling layer on the lower via insulating layer and in contact with the first through via.

5. The semiconductor device of claim 3, wherein each of the first active cut and the second active cut is spaced apart from the lower via in the vertical direction.

6. The semiconductor device of claim 3, wherein each of the first active cut and the second active cut is in contact with the lower via.

7. The semiconductor device of claim 1, wherein the first through via overlaps with at least one of the first active cut and the second active cut in the vertical direction.

8. The semiconductor device of claim 1, further comprising:

a lower via in the substrate and connected to the first through via.

9. The semiconductor device of claim 8, wherein each of the first active cut and the second active cut is spaced apart from the lower wiring layer in the vertical direction.

10. The semiconductor device of claim 1, further comprising:

a fourth active pattern spaced apart from the third active pattern in the first horizontal direction on the first surface of the substrate;

a third active cut between the third active pattern and the fourth active pattern, wherein the third active cut extends in the second horizontal direction, and the third active cut is spaced apart from the second active cut in the first horizontal direction; and a second through via extending through the third active pattern in the vertical direction between the second active cut and the third active cut, and into the substrate.

11. The semiconductor device of claim 1, further comprising:

a first plurality of nanosheets spaced apart from one another in the vertical direction on the first active pattern, wherein the first plurality of nanosheets is surrounded by the first gate electrode;

a second plurality of nanosheets spaced apart from one another in the vertical direction on the first and second active patterns; and a second gate electrode extending in the second horizontal direction on the first and second active patterns, wherein the second gate electrode is spaced apart from the first gate electrode in the first horizontal direction, and the second gate electrode surrounds the second plurality of nanosheets, wherein the first active cut extends through the second plurality of nanosheets and the second gate electrode in the vertical direction.

12. The semiconductor device of claim 1, further comprising a second gate electrode extending in the second horizontal direction between the first active cut and the second active cut, wherein the first through via extends through the second gate electrode in the vertical direction, and into the substrate.

13. A semiconductor device comprising:

a substrate comprising a first surface and a second surface opposite to the first surface;

first through third active patterns extending in a first horizontal direction on the first surface of the substrate, wherein the first through third active patterns are spaced apart from one another in the first horizontal direction;

a fourth active pattern spaced apart from the first through third active patterns in a second horizontal direction different from the first horizontal direction on the first surface of the substrate;

a first gate electrode extending in the second horizontal direction on the first active pattern;

a first active cut between the first active pattern and the second active pattern, wherein the first active cut extends in the second horizontal direction, and the first active cut is spaced apart from the first gate electrode in the first horizontal direction;

a second gate electrode extending in the second horizontal direction on the fourth active pattern, wherein the second gate electrode is spaced apart from the first active cut in the second horizontal direction;

a gate cut between the first active cut and the second gate electrode;

a second active cut between the second active pattern and the third active pattern, wherein the second active cut extends in the second horizontal direction, and the second active cut is spaced apart from the first active cut in the first horizontal direction; and a first through via extending through the second active pattern in a vertical direction between the first active cut and the second active cut, and into the substrate, wherein a top surface of the first active cut, a top surface of the second active cut, and a top surface of the first through via are provided on a common plane.

14. The semiconductor device of claim 13, further comprising:

a source/drain region between the first active cut and the second active cut; and a source/drain contact extending in the second horizontal direction between the first active cut and the second active cut, wherein the source/drain contact is electrically connected to the source/drain region, wherein the first through via extends through the source/drain region and the source/drain contact in the vertical direction.

15. The semiconductor device of claim 14, wherein a top surface of the first through via and a top surface of the source/drain contact are provided on a common plane.

16. The semiconductor device of claim 13, wherein the first through via overlaps with at least one of the first active cut and the second active cut in the vertical direction.

17. The semiconductor device of claim 13, wherein the first through via is spaced apart from at least one of the first active cut and the second active cut in the first horizontal direction.

18. The semiconductor device of claim 13, wherein the first through via comprises:

a through via insulating layer forming sidewalls of the first through via, and a through via filling layer on the through via insulating layer.

19. A semiconductor device comprising:

a substrate comprising a first surface and a second surface opposite to the first surface;

first through third active patterns extending in a first horizontal direction on the first surface of the substrate, wherein the first through third active patterns are spaced apart from one another in the first horizontal direction;

a fourth active pattern spaced apart from the first through third active patterns in a second horizontal direction different from the first horizontal direction on the first surface of the substrate;

a first plurality of nanosheets spaced apart from one another in a vertical direction on the first active pattern;

a second plurality of nanosheets spaced apart from one another in the vertical direction on the first and second active patterns;

a first gate electrode extending in the second horizontal direction on the first active pattern, wherein the first gate electrode surrounds the first plurality of nanosheets;

a second gate electrode extending in the second horizontal direction on the first and second active patterns, wherein the second gate electrode surrounds the second plurality of nanosheets;

a first active cut between the first active pattern and the second active pattern, wherein the first active cut extends in the second horizontal direction, the first active cut is spaced apart from the first gate electrode in the first horizontal direction, and the first active cut extends through the second plurality of nanosheets and the second gate electrode in the vertical direction;

a third gate electrode extending in the second horizontal direction on the fourth active pattern, wherein the third gate electrode is spaced apart from the first active cut in the second horizontal direction;

a gate cut between the first active cut and the third gate electrode, wherein the gate cut extends in the first horizontal direction;

a second active cut between the second and third active patterns and extending in the second horizontal direction, wherein the second active cut is spaced apart from the first active cut in the first horizontal direction;

a first through via extending through the second active pattern in the vertical direction between the first active cut and the second active cut, and into the substrate;

a lower via in the substrate and connected to the first through via; and a lower wiring layer on the second surface of the substrate and connected to the lower via, wherein a top surface of the first active cut, a top surface of the second active cut, and a top surface of the first through via are provided on a common plane, and wherein each of the first active cut and the second active cut is spaced apart from the lower via in the vertical direction.

\* \* \* \* \*